United States Patent
Chen et al.

(10) Patent No.: US 11,901,283 B2
(45) Date of Patent: Feb. 13, 2024

(54) CAPACITOR AND METHOD FOR FORMING THE SAME

(71) Applicant: TAIWAN SEMICONDUCTOR MANUFACTURING COMPANY, LTD., Hsinchu (TW)

(72) Inventors: Wan-Te Chen, New Taipei (TW); Chung-Hui Chen, Hsinchu (TW); Wei Chih Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 158 days.

(21) Appl. No.: 17/371,641

(22) Filed: Jul. 9, 2021

(65) Prior Publication Data

US 2022/0302019 A1 Sep. 22, 2022

Related U.S. Application Data

(60) Provisional application No. 63/162,738, filed on Mar. 18, 2021.

(51) Int. Cl.
*H01L 23/522* (2006.01)
*H01L 21/768* (2006.01)
*H01L 49/02* (2006.01)

(52) U.S. Cl.
CPC .... *H01L 23/5223* (2013.01); *H01L 21/76805* (2013.01); *H01L 23/5226* (2013.01); *H01L 28/91* (2013.01)

(58) Field of Classification Search
CPC ............. H01L 23/5223; H01L 23/5226; H01L 21/76805; H01L 28/91
See application file for complete search history.

(56) References Cited

U.S. PATENT DOCUMENTS

| 6,713,840 | B1 * | 3/2004 | Lee | H01L 21/76829 |
| | | | | 257/532 |
| 9,305,997 | B1 * | 4/2016 | Zhang | H01L 23/5223 |
| 2004/0061177 | A1 * | 4/2004 | Merchant | H01L 28/60 |
| | | | | 257/349 |
| 2015/0048483 | A1 * | 2/2015 | Kuo | H01L 28/65 |
| | | | | 257/532 |

FOREIGN PATENT DOCUMENTS

WO WO-2013048522 A1 * 4/2013 ......... H01L 23/5223

* cited by examiner

*Primary Examiner* — Shahed Ahmed
*Assistant Examiner* — Vicki B. Booker
(74) *Attorney, Agent, or Firm* — Birch, Stewart, Kolasch & Birch, LLP

(57) ABSTRACT

An integrated circuit (IC) structure includes a semiconductor substrate, a bottom electrode routing, a capacitor structure, a top electrode routing. The bottom electrode routing is over the semiconductor substrate. The capacitor structure is over the bottom electrode routing. The capacitor structure includes a bottom metal layer, a middle metal layer above the bottom metal layer, and a top metal layer above the middle metal layer. When viewed in a plan view, the top metal layer has opposite straight edges extending along a first direction and opposite square wave-shaped edges connecting the opposite straight edges, the square wave-shaped edges each comprise alternating first and second segments extending along a second direction perpendicular to the first direction, and third segments each connecting adjacent two of the first and second segments, wherein the third segments extend along the first direction.

20 Claims, 52 Drawing Sheets

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

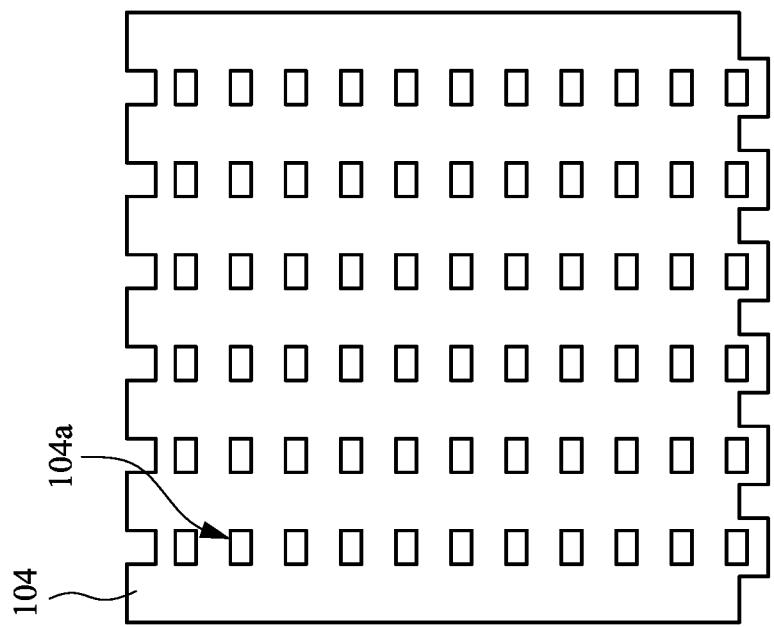
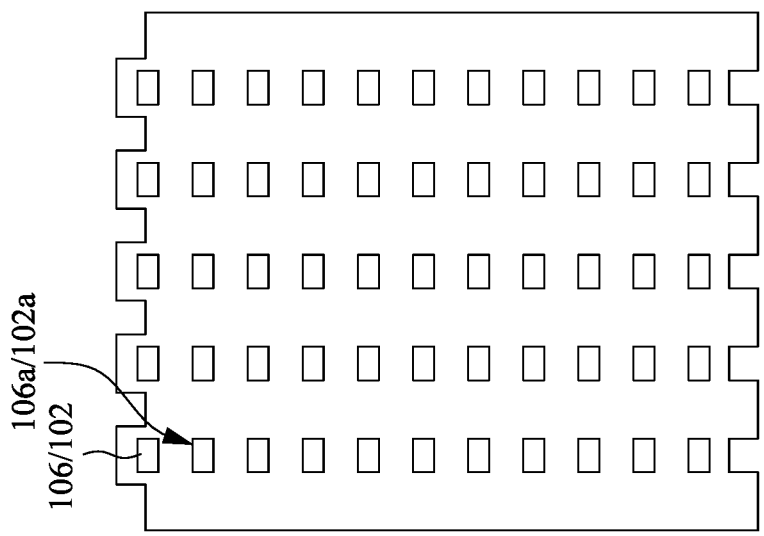
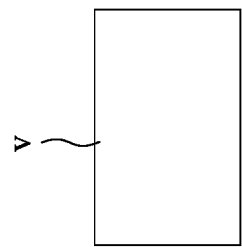
Fig. 19C
Fig. 19B
Fig. 19A

A-A'

B-B'

M2

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

US 11,901,283 B2

1
CAPACITOR AND METHOD FOR FORMING THE SAME

PRIORITY CLAIM AND CROSS-REFERENCE

This application claims priority to U.S. Provisional Application Ser. No. 63/162,738, filed Mar. 18, 2021, which is herein incorporated by reference in its entirety.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 19A to 19C illustrate top views of a via having a rectangular pattern and corresponding top/bottom metal layer and middle metal layer of a MIM capacitor in accordance with some embodiments of the present disclosure.

DETAILED DESCRIPTION

Figure 1A:
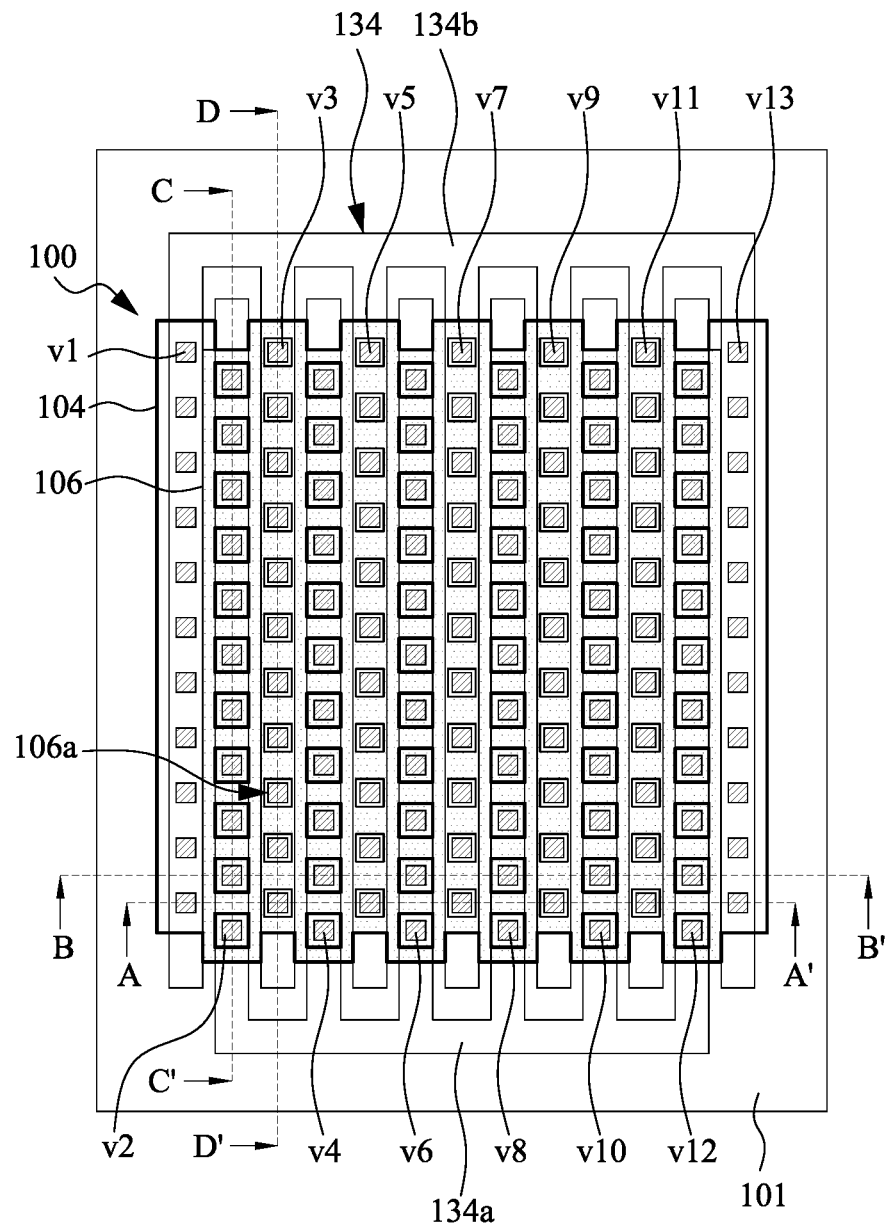
FIGS. 1A to 3D illustrate schematic views of an integrated circuit including a MIM capacitor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Various semiconductor structures of integrated circuits (ICs) are provided in accordance with various exemplary embodiments. Some variations of some embodiments are discussed. Throughout the various views and illustrative embodiments, like reference numbers are used to designate like elements.

The IC fabrication process can divided into three modules, in which each module may include all or some of the following operations: patterning (e.g., photolithography and etch); implantation; metal and dielectric material deposition; wet or dry clean; and planarization (e.g., etch-back process or chemical mechanical planarization). The three modules can be categorized as front end of the line (FEOL), middle of the line (MOL)/middle end of the line (MEOL), and back end of the line (BEOL).

In FEOL, various transistors are formed. For example, FEOL includes the formation of source/drain regions, a gate structure, and spacers on sides of the gate structure. The source/drain regions can be doped substrate regions formed with an implantation process after the gate structure formation. The gate structure includes a metal gate electrode, which can include two or more metal layers. The gate dielectric can include a high dielectric constant (high-k) material (e.g., greater than 3.9, which is the dielectric constant of silicon oxide). The metals in the gate electrode set the work function of the gate, in which the work functions can be different between P-type transistors and N-type transistors. The gate dielectric provides electrical isolation between the metal gate electrode and a channel formed between the source and the drain regions when the transistor is in operation.

In MEOL, low level interconnects (contacts) are formed and may include two layers of contacts on top of each other. The MEOL interconnects can have smaller critical dimensions (CDs; e.g., line width) and are spaced closer together compared to their BEOL counterparts. The MEOL contact layers serve to electrically connect the various regions of the transistors, i.e., the source/drain and metal gate electrode, to higher level interconnects in BEOL. A first layer of contacts in MEOL, known as "trench silicide (TS)" or "trench contacts (TC)," are formed over the source and drain regions on either side of the gate structure. In the TS, or TC, configuration, the silicide is formed in the trench and after the trench formation. The silicide lowers the resistance between the source and drain regions and the metal contacts. The gate structure and the first layer of contacts are considered to be on the same "level." The second layer of contacts are formed over the gate electrode and TS. MEOL contacts are embedded in a dielectric material, or a dielectric stack of materials, that ensures their electrical isolation.

In BEOL, an interlayer dielectric (ILD) layer is deposited over the MEOL contacts. The formation of high level interconnects in BEOL involves patterning a hard mask (HM) layer and subsequently etching through the HM layer to form holes and trenches in the ILD layer. The ILD layer can be a low-k material. Low-k materials can have a dielectric constant below 3.9, which is the dielectric constant of silicon oxide ($SiO_2$). Low-k materials in BEOL can reduce unwanted parasitic capacitance and minimize resistance-capacitance (RC) delays. BEOL interconnects include two types of conductive lines: the vertical interconnect access lines (vias) and the lateral lines (lines). The vias run through the ILD layer in the vertical direction and create electrical connections to layers above or below the ILD layer. Lines are laid in the lateral direction within the ILD layer to connect a variety of components within the same ILD layer. An interconnect layer can have one or more vias and one or more lines. BEOL may include multiple interconnect layers (e.g., up to 9 or more) with vias and lines of increasing CD size (e.g., line width) and line pitch. Each interconnect layer is aligned to the previous interconnect layer to ensure proper via and line connectivity.

The dielectric layer used in the MEOL processes usually possesses a higher dielectric constant than that of the inter-metal dielectric (IMD) layers which is used in the BEOL processes. Furthermore, the characteristics of the MEOL and FEOL processes provide a smaller spacing interval between elements, as compared to the BEOL processes.

In order to improving the capacitance of an MIM capacitor in the integrated circuit (IC) structure, metal electrode layer in the MIM capacitor may be in the form of a rectangular plate to increase the overlap area therebetween. However, the rectangular metal electrode plate may provide the MIM capacitor a poor −3 db frequency response, because there is a large area between the edge of the rectangular metal electrode plate and a metal via passing through the rectangular metal electrode plate.

Therefore, the present disclosure in various embodiments provides improved MIM capacitor layout patterns to optimize the edge layout thereof to improve frequency response of MIM capacitor. The MIM capacitor includes metal electrode plates each having a plurality of notches on opposite edges thereof to form square wave-shaped edges. In addition, each of the metal electrode plates further has opposite straight edges extending between the square wave-shaped edges thereof, and the straight edge of the top/bottom metal electrode plate is laterally set back from the straight edge of the middle metal electrode plate. An advantage is that a distance between the outermost metal via and the edge of the metal electrode plate is decreased to scale down a portion of the metal electrode plate that extends beyond the outermost metal via, such that the resistance of the metal electrode plate can be reduced, which in turn allows for improving −3 db frequency response of the MIM capacitor.

FIGS. 1A to 3D illustrate schematic views of an integrated circuit including a MIM capacitor in accordance with some embodiments of the present disclosure. In greater detail, FIG. 1A illustrates a top view (or plan view) of a MIM capacitor with a top electrode routing in accordance with some embodiments of the present disclosure. FIG. 1B illustrates a bottom-up view (or plan view) of a MIM capacitor with a bottom electrode routing in accordance with some embodiments of the present disclosure. FIG. 2A illustrates a top view of a top electrode routing with a plurality of metal vias in FIGS. 1A and 1B. FIG. 2B illustrates a top view of a top metal layer with a plurality of metal vias in FIGS. 1A and 1B. FIG. 2C illustrates a top view of a middle metal layer with a plurality of metal vias in FIGS. 1A and 1B. FIG. 2D illustrates a top view of a bottom metal layer with a plurality of metal vias in FIGS. 1A and 1B. FIG. 2E illustrates a top view of a bottom electrode routing with a plurality of metal vias in FIGS. 1A and 1B. FIGS. 3A to 3D illustrate cross-sectional views of an integrated circuit including a MIM capacitor in accordance with some embodiments obtained from the vertical plane containing line A-A', line B-B', line C-C', and line D-D' in FIG. 1A. It is noted that some elements in FIGS. 1A to 3D are not illustrated for brevity. The MIM capacitor is a non-limiting example for facilitating the illustration of the present disclosure.

Figure 1B:
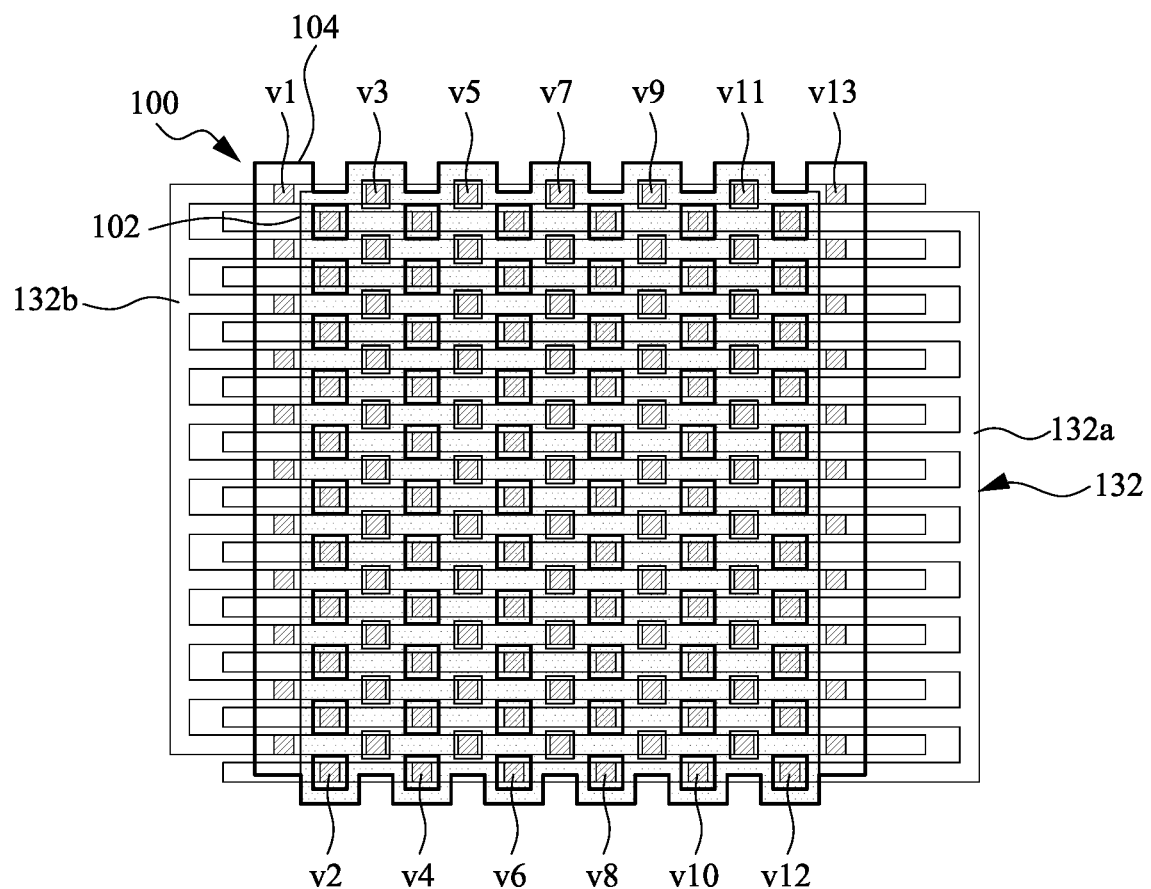
Figure 1B:
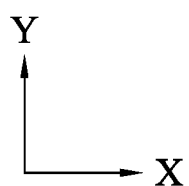

A vertically stacked MIM capacitor 100 is shown in FIGS. 1A and 1B. The MIM capacitor 100 is formed over a substrate 101 (See FIGS. 1A and 3A-3D). In many embodiments, the substrate 101 may include one or more active devices (not shown) formed on the substrate. Examples of such active devices include P-channel field effect transistors (PFETs), N-channel FETs (NFETs), metal-oxide semiconductor field effect transistors (MOSFETs), complementary metal-oxide semiconductor (CMOS) transistors, FinFETs, high voltage transistors, high frequency transistors, bipolar junction transistors, other suitable devices, and/or combinations thereof. In some embodiments, the substrate 101 may include an elementary semiconductor (e.g., silicon or germanium) and/or a compound semiconductor (e.g., silicon germanium, silicon carbide, gallium arsenic, indium arsenide, gallium nitride, and indium phosphide). Other exemplary substrate materials include alloy semiconductors, such as silicon germanium carbide, gallium arsenic phosphide, and gallium indium phosphide. In some embodiments, the substrate 101 has one or more layers defined within it, such as an epitaxial layer. For example, in one such embodiment, the substrate 101 may include an epitaxial layer overlying a bulk semiconductor. Other layered substrates include semiconductor-on-insulator (SOI) substrates. In one such SOI substrate, the substrate 101 may include a buried oxide (BOX) layer formed by a process such as separation by implanted oxygen (SIMOX). In various embodiments, the substrate 101 may take the form of a planar substrate, a fin, a nanowire, and/or other forms known to one of skill in the art.

In some embodiments, the substrate 101 may include one or more doped regions. For example, a region of the substrate 101 may be doped with a p-type dopant. Suitable p-type dopants include boron, gallium, indium, other suitable p-type dopants, and/or combinations thereof. The substrate 101 may also include one or more regions doped with an n-type dopant such as phosphorus, arsenic, other suitable n-type dopants, and/or combinations thereof. Doping may be implemented using a process such as ion implantation or diffusion in various steps and techniques. The substrate 101 may also include an active device such as a PFET, an NFET, a MOSFET, a CMOS transistor, a FinFET, a high voltage transistor, a high frequency transistor, a bipolar junction transistor, and/or other suitable device is formed in the active device region. In some embodiments, the active device may include source/drain regions and a gate stack. The source/drain regions may be formed by implanting the substrate 101 with p-type dopants ($P^+$), such as boron or $BF_2$, and/or n-type dopants ($N^+$), such as phosphorus or arsenic. In some embodiments, the source/drain regions are formed by processes including halo implantation, etching, ion-implantation, epitaxy, and/or annealing steps.

The MIM capacitor 100 includes a top metal layer 106 (see FIGS. 1A and 2B), a middle metal layer 104 (see FIGS. 1A, 1B, and 2C), and a bottom metal layer 102 (see FIGS. 1B and 2D) and interposing dielectric or insulating layers 108 and 110 (see FIGS. 3A to 3D) therebetween. In some embodiments, the metal layers 102, 104, and 106 can be interchangeably referred to as metal electrodes or metal plates. The metal layer 106 is a top electrode of the MIM capacitor 100. The metal layer 104 is a middle electrode of the MIM capacitor 100. The metal layer 102 is a bottom electrode of the MIM capacitor 100. As shown in FIGS. 3A to 3D, the capacitor dielectric layer 110 interposes the top and middle metal layers 106 and 104, and the capacitor dielectric layer 108 interposes the middle and bottom metal layers 104 and 102. It is noted that the MIM capacitor 100 has three metal layers as illustrated and described above. However, this configuration is exemplary only and not intended to be limiting beyond what is specifically recited in the claims that follow. A capacitor of additional plates or fewer plates may also be fabricated.

In FIGS. 1A and 1B, the top metal layer 106 and the bottom metal layer 102 are connected to a first voltage potential (in operation) and the middle metal layer 104 is connected to a second voltage potential (in operation), and the second voltage potential is different than the first voltage potential. Thus, a first capacitance is formed between the top metal layer 106 and the middle metal layer 104 (e.g., at the region of their overlap as shown in FIG. 1A), and a second capacitance is formed between the bottom metal layer 102 and the middle metal layer 104 (e.g., at the region of their overlap as shown in FIG. 1B). It is noted that the overlap among the top, middle, and bottom metal layers 106, 104, and 102 determine the capacitor performance. Thus, the capacitance of the MIM capacitor 100 can be tuned by adjusting the size of the overlap area among the top, middle, and bottom metal layers 106, 104, and 102. Because each top, middle, and bottom metal layers 102, 104, or 106 is in the form of the plate rather than a combination of metal lines, the size of the overlap area among the top, middle, and bottom metal layers 106, 104, and 102 may be increased, which in turn allows for improving the capacitance of the MIM capacitor 100.

In FIGS. 1A, 1B, 3B, and 3C, the top metal layer 106 (see FIG. 1A) and the bottom metal layer 102 (see FIG. 1B) of the MIM capacitor 100 are connected to a first electrode 134a of a top electrode routing 134 (see FIG. 1A) and a second electrode 132a of a bottom electrode routing 132 (see FIG. 1B) through metal vias v2, v4, v6, v8, v10, and v12 and spaced apart from the middle metal layer 104. The first electrode 134a of the top electrode routing 134 and the second electrode 132a of the bottom electrode routing 132 may be used to provide the first voltage potential to the top metal layer 106 and the bottom metal layer 102 of the MIM capacitor 100. As shown in FIG. 1A, the metal vias v2 are arranged in the second column along Y-direction, the metal vias v4 are arranged in the fourth column along Y-direction, the metal vias v6 are arranged in the sixth column along Y-direction, the metal vias v8 are arranged in the eighth column along Y-direction, the metal vias v10 are arranged in the tenth column along Y-direction, and the metal vias v12 are arranged in the twelfth column along Y-direction.

Figure 3A:
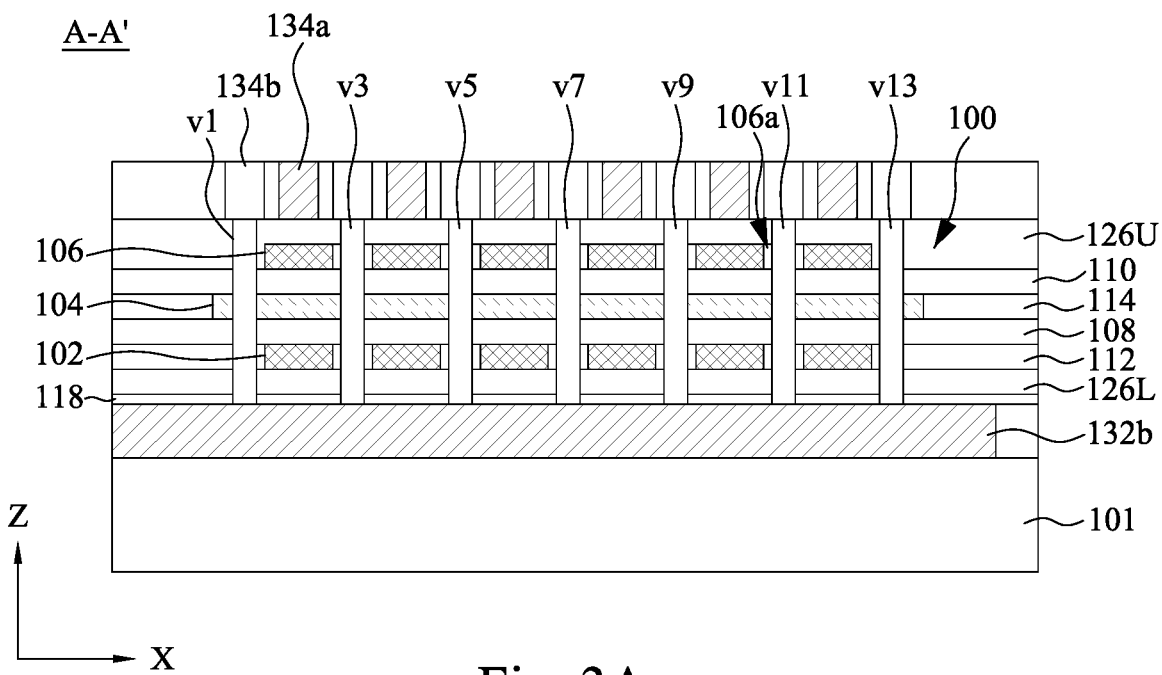
Figure 3B:
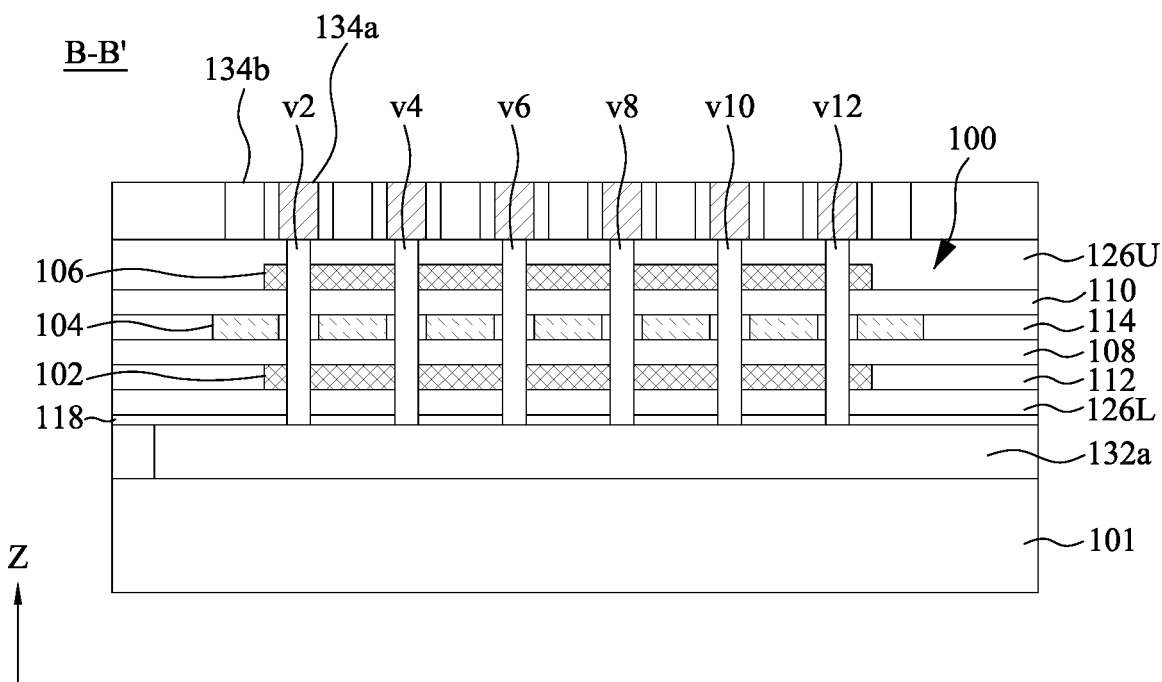
Figure 3C:
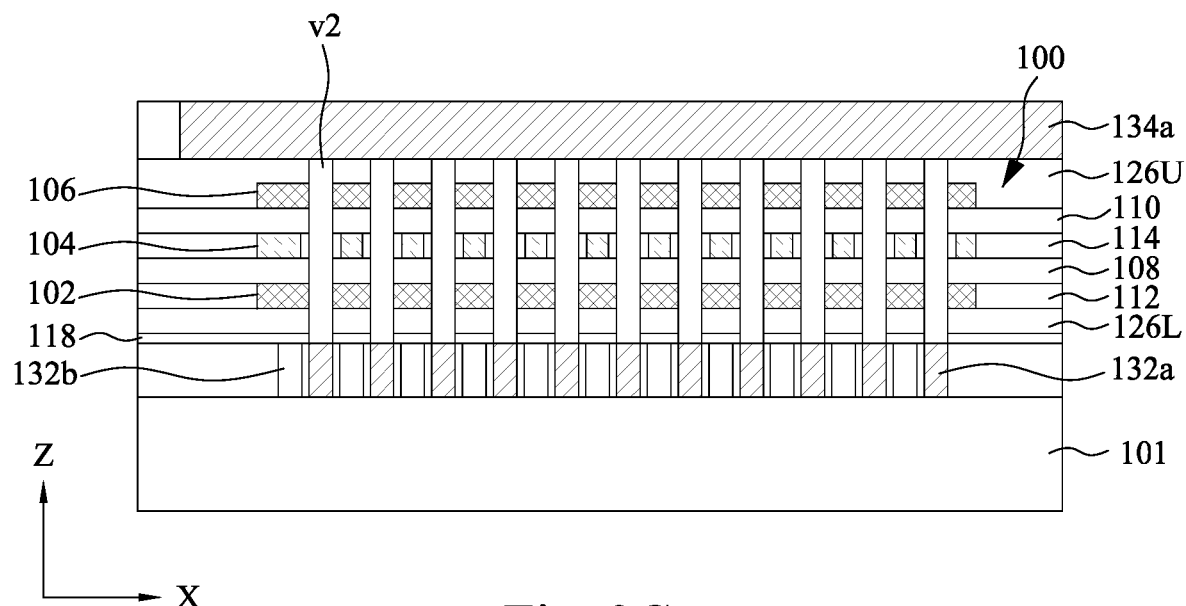

This is described in greater detail with reference to FIGS. 3B and 3C, the metal vias v2, v4, v6, v8, v10, and v12 extend from the first electrode 134a of the top electrode routing 134 downwardly to the second electrode 132a of the bottom electrode routing 132 to connect the top metal layer 106 and the bottom metal layer 102 of the MIM capacitor 100, but pass through a plurality of through holes 104a on the middle metal layer 104, such that the metal vias v2, v4, v6, v8, v10, and v12 are spaced apart from the middle metal layer 104 and in contact with the top and bottom metal layers 106 and 102, which in turn allows for maintaining a first voltage potential (in operation) on the top and bottom metal layers 106 and 102 and a second voltage potential (in operation) on the middle metal layer 104. In other words, the through holes 104a on the middle metal layer 104 allow the metal vias v2, v4, v6, v8, v10, and v12 to pass through to keep the middle metal layer 104 in the form of the plate rather than a combination of metal lines, such the size of the overlap area among the top, middle, and bottom metal layers 106, 104, and 102 may be increased, which in turn allows for improving the capacitance of the MIM capacitor 100.

In FIGS. 1A, 1B, 3A, and 3D, the middle metal layer 104 of the MIM capacitor 100 is connected to a third electrode 134b of a top electrode routing 134 (see FIG. 1A) and a fourth electrode 132b of a bottom electrode routing 132 (see FIG. 1B) through metal vias v1, v3, v5, v7, v9, v11, and v13 and spaced apart from the top and bottom metal layers 106 and 102. The third electrode 134b of the top electrode routing 134 spaced apart from the first electrode 134a and the fourth electrode 132b of the bottom electrode routing 132 spaced apart from the second electrode 132a may be use to provide the second voltage potential to the middle metal layer 104 of the MIM capacitor 100. As shown in FIG. 1A, the metal vias v1 are arranged in the first column along Y-direction, the metal vias v3 are arranged in the third column along Y-direction, the metal vias v5 are arranged in the fifth column along the Y-direction, the metal vias v7 are arranged in the seventh column along Y-direction, the metal vias v9 are arranged in the ninth column along Y-direction, the metal vias v11 are arranged in the eleventh column along Y-direction, and the metal vias v13 are arranged in the thirteenth column along Y-direction.

Figure 3D:
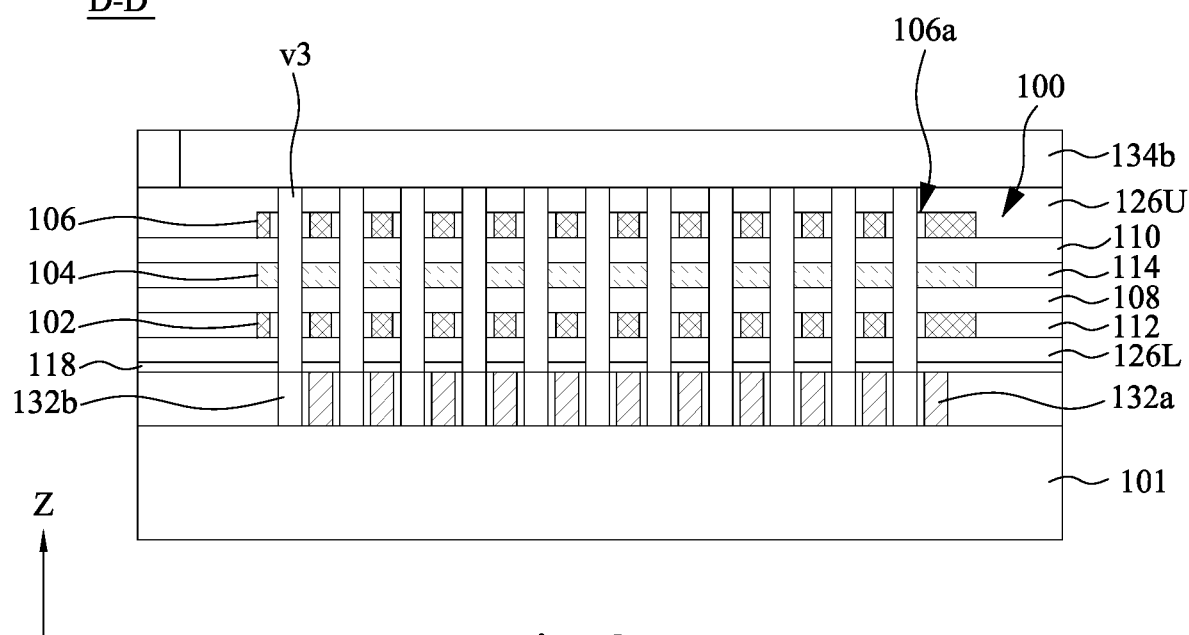

This is described in greater detail with reference to FIGS. 3A and 3D, metal vias v1, v3, v5, v7, v9, v11, and v13 extend from the third electrode 134b of the top electrode routing 134 downwardly to the fourth electrode 132b of the bottom electrode routing 132 to connect with the middle metal layer 104 of the MIM capacitor 100, but pass through a plurality of through holes 106a on the top metal layer 106 and a plurality of through holes 102a on the bottom metal layer 102, such that the metal vias v1, v3, v5, v7, v9, v11, and v13 are spaced apart from the top and bottom metal layers 106 and 102 and in contact with the middle metal layer 104, which in turn allows for maintaining a first voltage potential (in operation) on the top and bottom metal layers 106 and 102 and a second voltage potential (in operation) on the middle metal layer 104.

In other words, the through holes 106a on the top metal layer 106 and the through holes 102a on the bottom metal layer 102 allow the metal vias v1, v3, v5, v7, v9, v11, and v13 to pass through to keep the top and bottom metal layers 106 and 102 in the form of the plate rather than a combination of metal lines, such the size of the overlap area between the top, middle, and bottom metal layers 106, 104, and 102 may be increased, which in turn allows for improving the capacitance of the MIM capacitor 100. In FIG. 1A, the metal vias v1-v13 are a square-shaped. By way of example but not limiting the present disclosure, the metal vias v1-v13 may have rectangular-shaped, line-shaped, polygon-shaped, circular-shaped, elliptical-shaped, and/or other suitable shapes in a plan or top view.

Figure 20C:
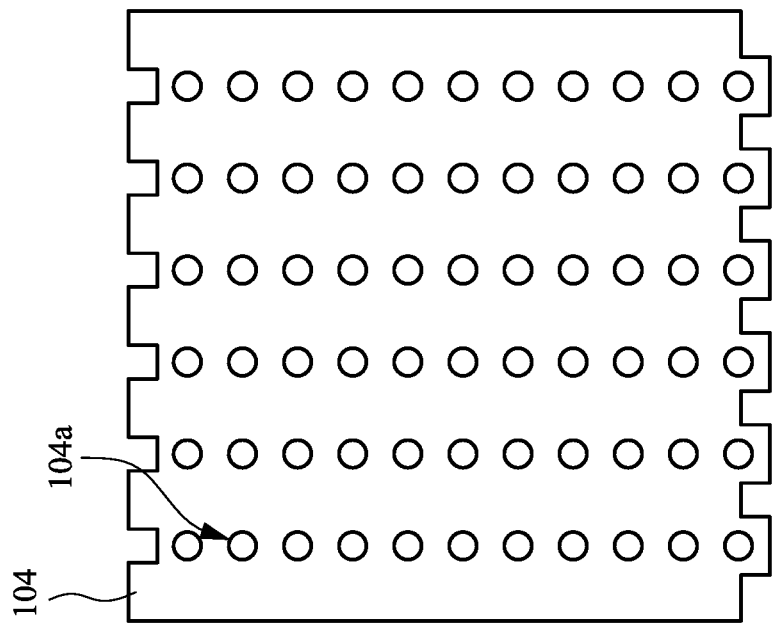
FIGS. 20A to 20C illustrate top views of a via having a circular pattern and corresponding top/bottom metal layer and middle metal layer of a MIM capacitor in accordance with some embodiments of the present disclosure.
Figure 20B:
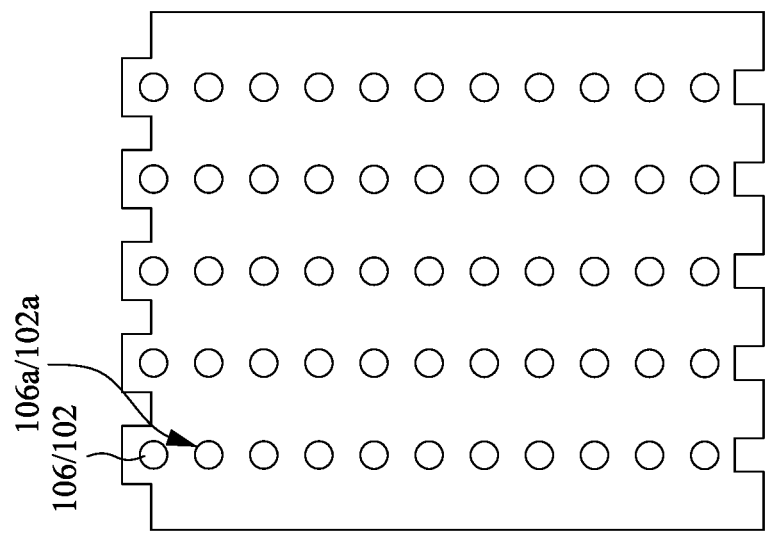
Figure 20A:
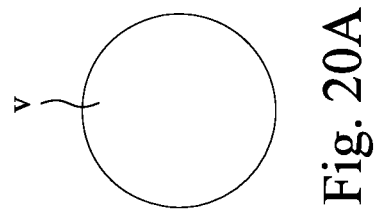
Figure 21C:
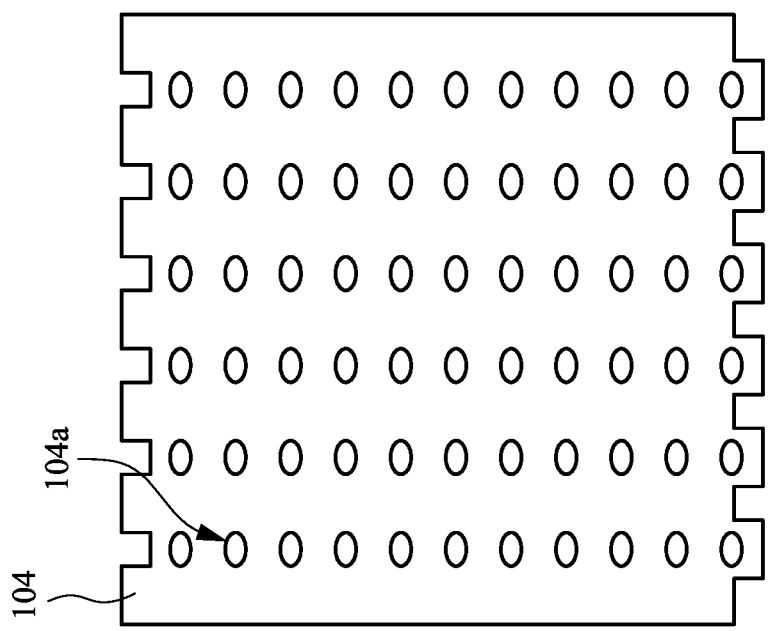
FIGS. 21A to 21C illustrate top views of a via having an elliptical pattern and corresponding top/bottom metal layer and middle metal layer of a MIM capacitor in accordance with some embodiments of the present disclosure.
Figure 21B:
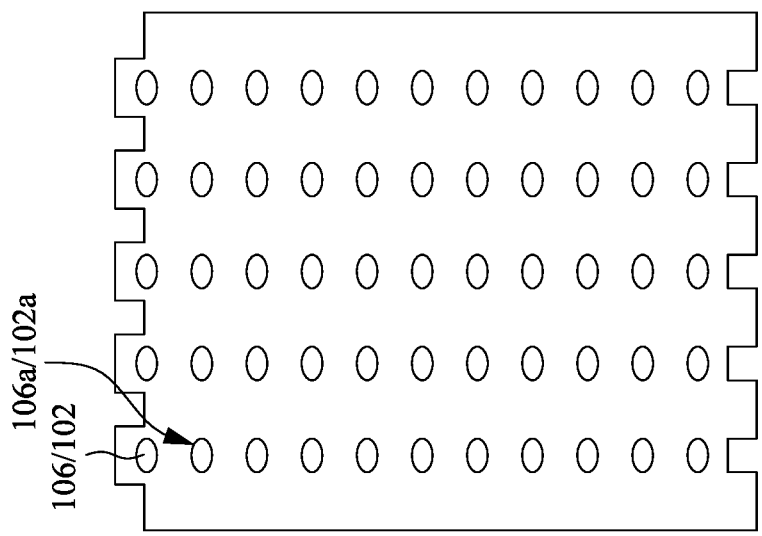
Figure 21A:
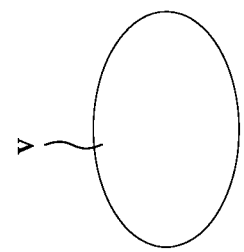

As shown in FIGS. 19A to 19C, the metal via v may have a rectangular pattern (see FIG. 19A) and the corresponding top/bottom metal layer 106/102 may have a rectangular pattern through hole 106a/102a (see FIG. 19A) and the corresponding middle metal layer 104 may have a rectangular pattern through hole 104a (see FIG. 19C) in a plan or top view. As shown in FIGS. 20A to 20C, the metal via v may have a circular pattern (see FIG. 20A) and the corresponding top/bottom metal layer 106/102 may have a circular pattern through hole 106a/102a (see FIG. 20A) and the corresponding middle metal layer 104 may have a circular pattern through hole 104a (see FIG. 20C) in a plan or top view. As shown in FIGS. 21A to 21C, the metal via v may have a elliptical pattern (see FIG. 21A) and the corresponding top/bottom metal layer 106/102 may have an elliptical pattern through hole 106a/102a (see FIG. 21A) and the corresponding middle metal layer 104 may have a elliptical pattern through hole 104a (see FIG. 21C) in a plan or top view.

Figure 2A:
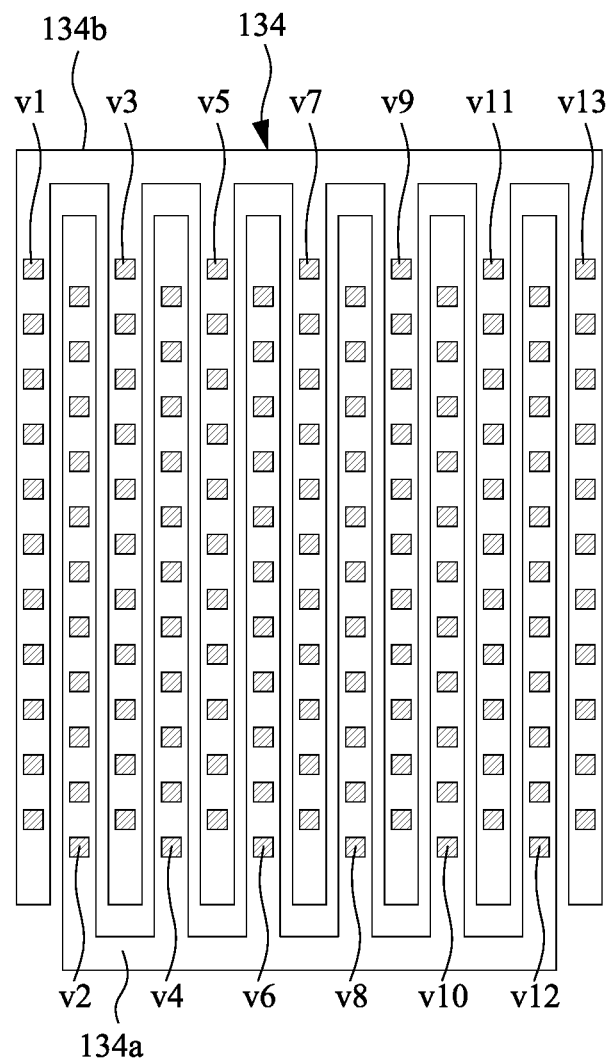
Figure 2A:
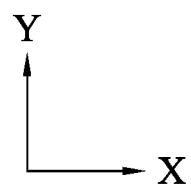
Figure 2B:
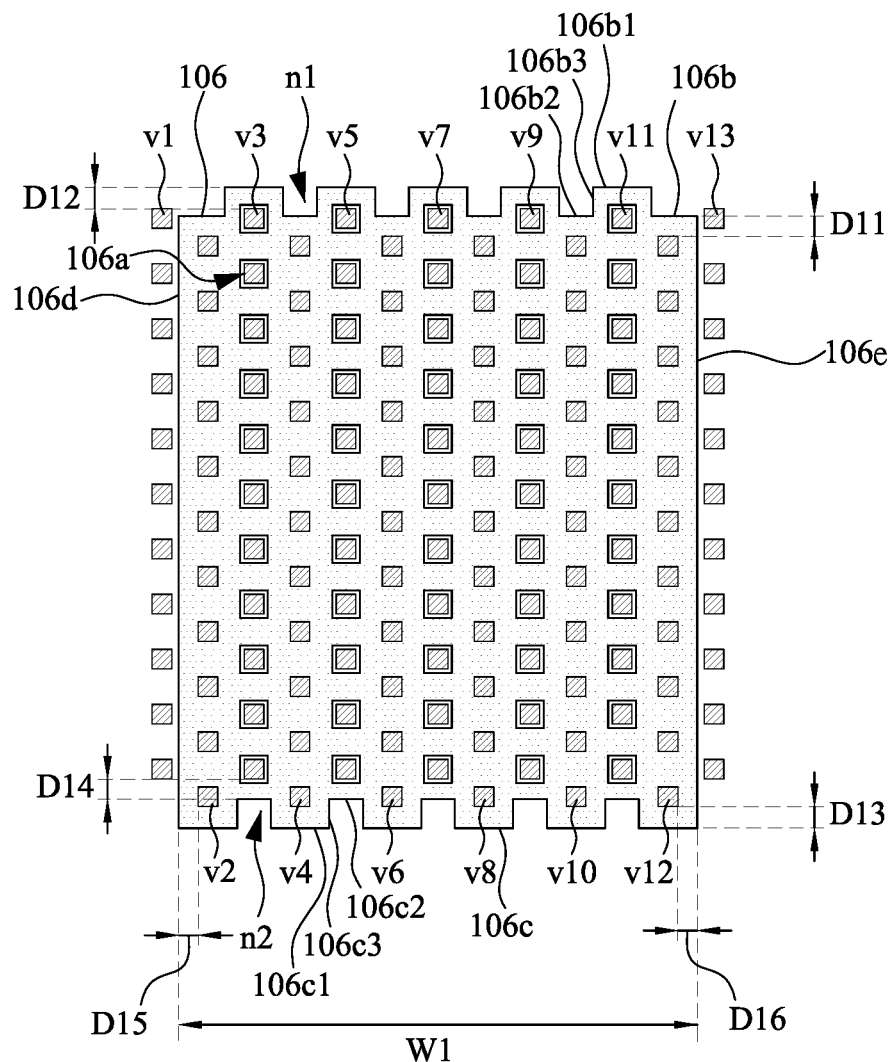

As shown in FIG. 2B, the top metal layer 106 of the MIM capacitor 100 has a plurality of notches n1 and n2 on opposite edges 106b and 106c thereof to form square wave-shaped edges. An example square wave-shaped edge 106b includes alternating first and second segments 106b1, 106b2 extending along X-direction, and third segments 106b3 connecting adjacent two of the first and second segments 106b1, 106b2. The third segments 106b3 extend along Y-direction. An example square wave-shaped edge 106c includes alternating first and second segments 106c1, 106c2 extending along X-direction, and third segments 106c3 connecting adjacent two of the first and second segments 106c1, 106c2. In some embodiments, the notches n1 and n2 may have a Y-direction dimension in a range from about 0.5 to 5 times the maximum dimension of the nearest metal via in a plan or top view (e.g., about 0.5, 1, 1.5, 2, 2.5, 3, 3.5, 4, 4.5, or 5 times the maximum dimension of the nearest metal via). In some embodiments, the notches n1 and n2 may have a X-direction dimension in a range from about 0.5 to 5 times the maximum dimension of the nearest metal via in a plan or top view (e.g., about 0.5, 1, 1.5, 2, 2.5, 3, 3.5, 4, 4.5, or 5 times the maximum dimension of the nearest metal via). The top metal layer 106 further has opposite straight edges 106d and 106e extending between the square wave-shaped edges thereof. Therefore, the edges 106b-106e of the top metal layer 106 can have a shortened distance to the peripheral metal vias v2-v12.

In some embodiments, a distance D11 between the peripheral metal vias v2, v4, v6, v8, v10, and v12 and the edges 106b of the top metal layer 106 may be in a range from about 0.1 to 1 times the maximum dimension of the metal vias v2, v4, v6, v8, v10, and v12 in a plan or top view (e.g., about 0.1, 0.2, 0.3, 0.4, 0.5, 0.6, 0.7, 0.8, 0.9, or 1 times the maximum dimension of the metal vias). In some embodiments, a distance D12 between the peripheral metal vias v3, v5, v7, v9, and v11 and the edges 106b of the top metal layer 106 may be in a range from about 0.1 to 1 times the maximum dimension of the metal vias v3, v5, v7, v9, and v11 in a plan or top view (e.g., about 0.1, 0.2, 0.3, 0.4, 0.5, 0.6, 0.7, 0.8, 0.9, or 1 times the maximum dimension of the metal vias). In some embodiments, the distance D11 may be the same as the distance D12. In some embodiments, the distance D11 may be different from the distance D12.

In some embodiments, a distance D13 between the peripheral metal vias v2, v4, v6, v8, v10, and v12 and the edges 106c of the top metal layer 106 may be in a range from about 0.1 to 1 times the maximum dimension of the metal vias v2, v4, v6, v8, v10, and v12 in a plan or top view (e.g., about 0.1, 0.2, 0.3, 0.4, 0.5, 0.6, 0.7, 0.8, 0.9, or 1 times the maximum dimension of the metal vias). In some embodiments, a distance D14 between the peripheral metal vias v3, v5, v7, v9, and v11 and the edges 106c of the top metal layer 106 may be in a range from about 0.1 to 1 times the maximum dimension of the metal vias v3, v5, v7, v9, and v11 in a plan or top view (e.g., about 0.1, 0.2, 0.3, 0.4, 0.5, 0.6, 0.7, 0.8, 0.9, or 1 times the maximum dimension of the metal vias). In some embodiments, the distance D13 may be the same as the distance D14. In some embodiments, the distance D13 may be different from the distance D14.

In some embodiments, a distance D15 between the metal vias v2 and the edge 106d of the top metal layer 106 may be in a range from about 0.1 to 1 times the maximum dimension of the metal vias v2 in a plan or top view (e.g., about 0.1, 0.2, 0.3, 0.4, 0.5, 0.6, 0.7, 0.8, 0.9, or 1 times the maximum dimension of the metal vias). In some embodiments, a distance D16 between the metal vias v12 and the edges 106e of the top metal layer 106 may be in a range from about 0.1 to 1 times the maximum dimension of the metal vias v12 in a plan or top view (e.g., about 0.1, 0.2, 0.3, 0.4, 0.5, 0.6, 0.7, 0.8, 0.9, or 1 times the maximum dimension of the metal vias).

In addition, the straight edges 106d and 106e of the top metal layer 106 are laterally set back from the straight edges 104d and 104e of the middle metal layer 104 along the X-direction (see FIG. 1A). In other words, the middle metal layer 104 has a lateral dimension W2 (see FIG. 2C) greater than a lateral dimension W1 (see FIG. 2B) of the top metal layer 106 along the X-direction. Due to the aforementioned structural configuration, areas of the top metal layer 106 between the peripheral metal vias v2-v12 and the edges 106b-106e of the top metal layer 106 are reduced, such that the resistance of the top metal layer 106 may be reduced, which in turn allows for improving −3 db frequency response of the MIM capacitor 100.

Figure 2C:
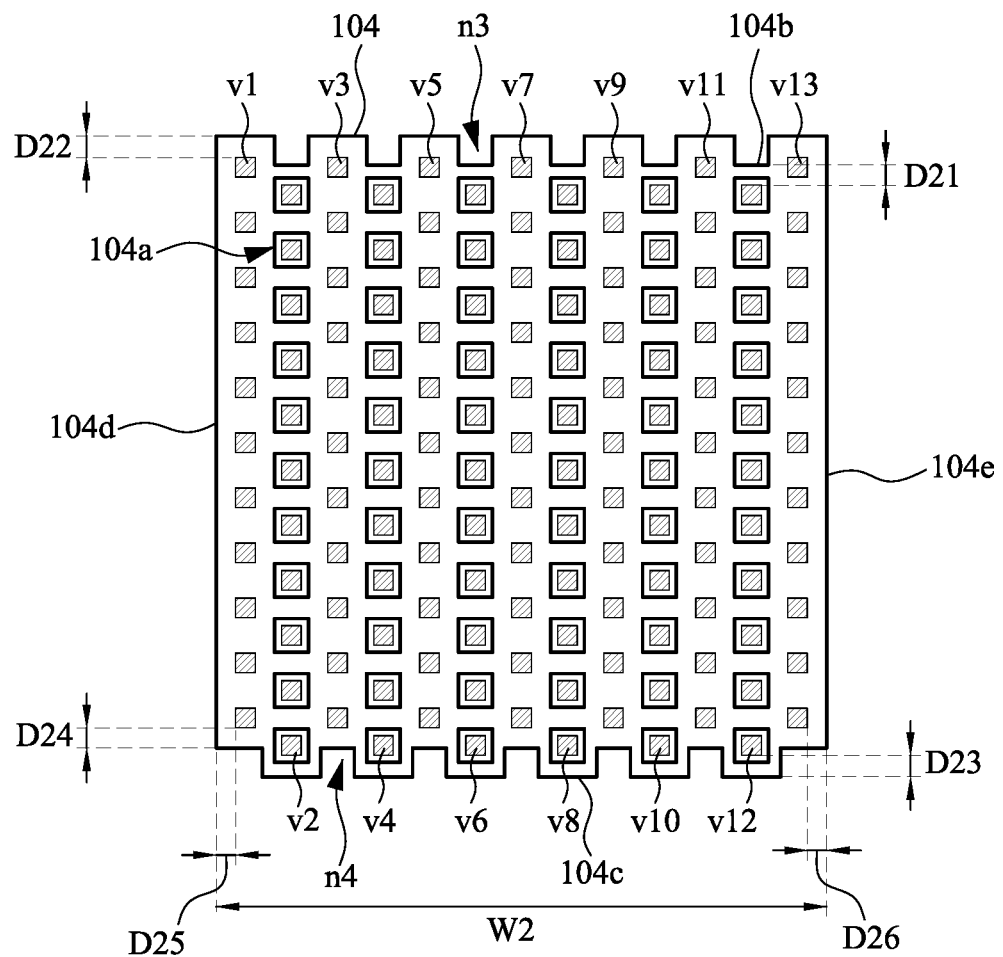

As shown in FIG. 2C, the middle metal layer 104 of the MIM capacitor 100 has a plurality of notches n3 and n4 on opposite edges 104b and 104c thereof to form square wave-shaped edges. In some embodiments, the notches n3 and n4 may have a Y-direction dimension in a range from about 0.5 to 5 times the maximum dimension of the nearest metal via in a plan or top view (e.g., about 0.5, 1, 1.5, 2, 2.5, 3, 3.5, 4, 4.5, or 5 times the maximum dimension of the nearest metal via). In some embodiments, the notches n3 and n4 may have a X-direction dimension in a range from about 0.5 to 5 times the maximum dimension of the nearest metal via in a plan or top view (e.g., about 0.5, 1, 1.5, 2, 2.5, 3, 3.5, 4, 4.5, or 5 times the maximum dimension of the nearest metal via). The middle metal layer 104 further has opposite straight edges 104d and 104e extending between the square wave-shaped edges thereof. Therefore, the edges 104b-104e of the middle metal layer 104 can have a shortened distance to the peripheral metal vias v1-v13.

In some embodiments, a distance D21 between the peripheral metal vias v1, v3, v5, v7, v9, v11, and v13 and the edges 104b of the middle metal layer 104 may be in a range from about 0.1 to 1 times the maximum dimension of the metal vias v1, v3, v5, v7, v9, v11, and v13 in a plan or top view (e.g., about 0.1, 0.2, 0.3, 0.4, 0.5, 0.6, 0.7, 0.8, 0.9, or 1 times the maximum dimension of the metal vias). In some embodiments, a distance D22 between the peripheral metal vias v2, v4, v6, v8, v10, and v12 and the edges 104b of the middle metal layer 104 may be in a range from about 0.1 to 1 times the maximum dimension of the metal vias v2, v4, v6, v8, v10, and v12 in a plan or top view (e.g., about 0.1, 0.2, 0.3, 0.4, 0.5, 0.6, 0.7, 0.8, 0.9, or 1 times the maximum dimension of the metal vias). In some embodiments, the distance D21 may be the same as the distance D22. In some embodiments, the distance D21 may be different from the distance D22.

In some embodiments, a distance D23 between the peripheral metal vias v1, v3, v5, v7, v9, v11, and v13 and the edges 104c of the middle metal layer 104 may be in a range from about 0.1 to 1 times the maximum dimension of the metal vias v1, v3, v5, v7, v9, v11, and v13 in a plan or top view (e.g., about 0.1, 0.2, 0.3, 0.4, 0.5, 0.6, 0.7, 0.8, 0.9, or 1 times the maximum dimension of the metal vias). In some embodiments, a distance D24 between the peripheral metal vias v2, v4, v6, v8, v10, and v12 and the edges 104c of the middle metal layer 104 may be in a range from about 0.1 to 1 times the maximum dimension of the metal vias v2, v4, v6, v8, v10, and v12 in a plan or top view (e.g., about 0.1, 0.2, 0.3, 0.4, 0.5, 0.6, 0.7, 0.8, 0.9, or 1 times the maximum dimension of the metal vias). In some embodiments, the distance D23 may be the same as the distance D24. In some embodiments, the distance D23 may be different from the distance D24.

In some embodiments, a distance D25 between the metal vias v1 and the edge 104d of the middle metal layer 104 may be in a range from about 0.1 to 1 times the maximum dimension of the metal vias v1 in a plan or top view (e.g., about 0.1, 0.2, 0.3, 0.4, 0.5, 0.6, 0.7, 0.8, 0.9, or 1 times the maximum dimension of the metal vias). In some embodiments, a distance D26 between the metal vias v13 and the edges 104e of the middle metal layer 104 may be in a range from about 0.1 to 1 times the maximum dimension of the metal vias v13 in a plan or top view (e.g., about 0.1, 0.2, 0.3, 0.4, 0.5, 0.6, 0.7, 0.8, 0.9, or 1 times the maximum dimension of the metal vias). Due to the aforementioned structural configuration, areas of the middle metal layer 104 between the peripheral metal vias v1-v13 and the edges 104b-104e of the middle metal layer 104 are reduced, such that the resistance of the middle metal layer 104 may be reduced, which in turn allows for improving −3 db frequency response of the MIM capacitor 100.

Figure 2D:
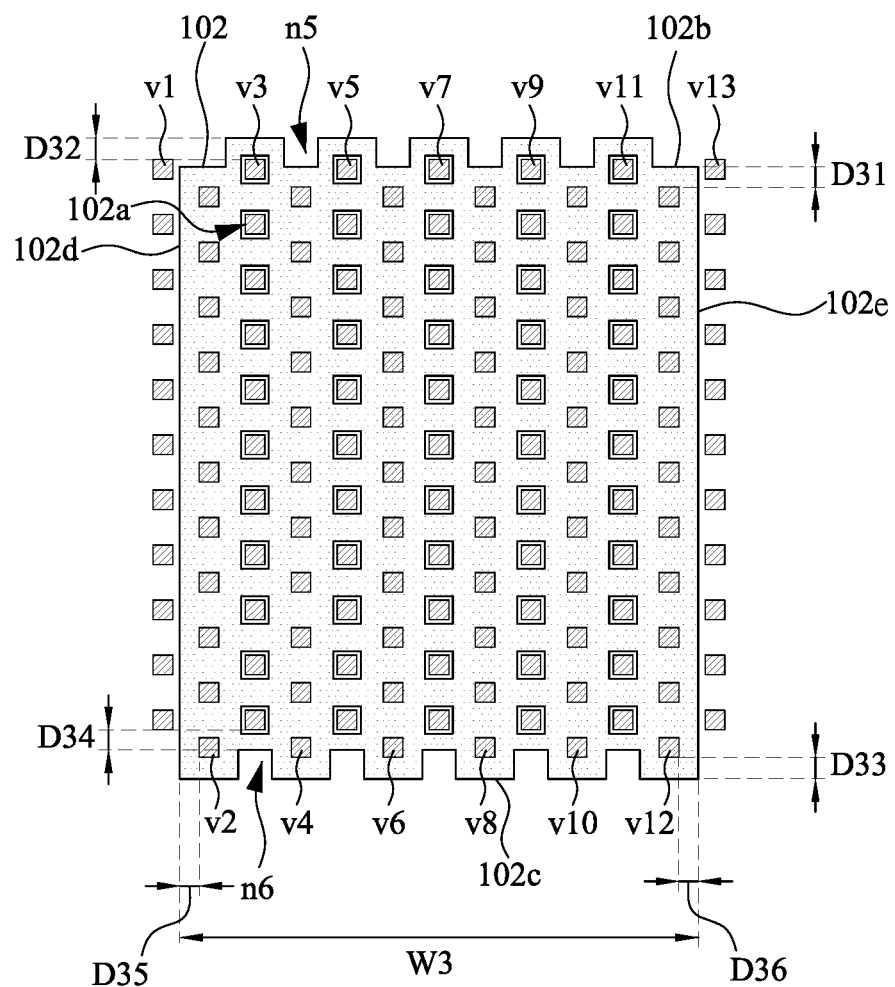

As shown in FIG. 2D, the bottom metal layer 102 of the MIM capacitor 100 has a plurality of notches n5 and n6 on opposite edges 102b and 102c thereof to form square wave-shaped edges. In some embodiments, the notches n5 and n6 may have a Y-direction dimension in a range from about 0.5 to 5 times the maximum dimension of the nearest metal via in a plan or top view (e.g., about 0.5, 1, 1.5, 2, 2.5, 3, 3.5, 4, 4.5, or 5 times the maximum dimension of the nearest metal via). In some embodiments, the notches n5 and n6 may have a X-direction dimension in a range from about 0.5 to 5 times the maximum dimension of the nearest metal via in a plan or top view (e.g., about 0.5, 1, 1.5, 2, 2.5, 3, 3.5, 4, 4.5, or 5 times the maximum dimension of the nearest metal via). The bottom metal layer 102 further has opposite straight edges 102d and 102e extending between the square wave-shaped edges thereof. Therefore, the edges 102b-102e of the bottom metal layer 102 can have a shortened distance to the peripheral metal vias v2-v12.

In some embodiments, a distance D31 between the peripheral metal vias v2, v4, v6, v8, v10, and v12 and the edges 102b of the bottom metal layer 102 may be in a range from about 0.1 to 1 times the maximum dimension of the metal vias v2, v4, v6, v8, v10, and v12 in a plan or top view (e.g., about 0.1, 0.2, 0.3, 0.4, 0.5, 0.6, 0.7, 0.8, 0.9, or 1 times the maximum dimension of the metal vias). In some embodiments, a distance D32 between the peripheral metal vias v3, v5, v7, v9, and v11 and the edges 102b of the bottom metal layer 102 may be in a range from about 0.1 to 1 times the maximum dimension of the metal vias v3, v5, v7, v9, and v11 in a plan or top view (e.g., about 0.1, 0.2, 0.3, 0.4, 0.5, 0.6, 0.7, 0.8, 0.9, or 1 times the maximum dimension of the metal vias). In some embodiments, the distance D31 may be the same as the distance D32. In some embodiments, the distance D31 may be different from the distance D32.

In some embodiments, a distance D33 between the peripheral metal vias v2, v4, v6, v8, v10, and v12 and the edges 102c of the bottom metal layer 102 may be in a range from about 0.1 to 1 times the maximum dimension of the metal vias v2, v4, v6, v8, v10, and v12 in a plan or top view (e.g., about 0.1, 0.2, 0.3, 0.4, 0.5, 0.6, 0.7, 0.8, 0.9, or 1 times the maximum dimension of the metal vias). In some embodiments, a distance D34 between the peripheral metal vias v3, v5, v7, v9, and v11 and the edges 102c of the bottom metal layer 102 may be in a range from about 0.1 to 1 times the maximum dimension of the metal vias v3, v5, v7, v9, and v11 in a plan or top view (e.g., about 0.1, 0.2, 0.3, 0.4, 0.5, 0.6, 0.7, 0.8, 0.9, or 1 times the maximum dimension of the metal vias). In some embodiments, the distance D33 may be the same as the distance D34. In some embodiments, the distance D33 may be different from the distance D34.

In some embodiments, a distance D35 between the metal vias v2 and the edge 102d of the bottom metal layer 102 may be in a range from about 0.1 to 1 times the maximum dimension of the metal vias v2 in a plan or top view (e.g., about 0.1, 0.2, 0.3, 0.4, 0.5, 0.6, 0.7, 0.8, 0.9, or 1 times the maximum dimension of the metal vias). In some embodiments, a distance D36 between the metal vias v12 and the edges 102e of the bottom metal layer 102 may be in a range from about 0.1 to 1 times the maximum dimension of the metal vias v12 in a plan or top view (e.g., about 0.1, 0.2, 0.3, 0.4, 0.5, 0.6, 0.7, 0.8, 0.9, or 1 times the maximum dimension of the metal vias).

In addition, the straight edges 102d and 102e of the bottom metal layer 102 are laterally set back from the straight edges 104d and 104e of the middle metal layer 104 along the X-direction (see FIG. 1B). In other words, the middle metal layer 104 has the lateral dimension W2 (see FIG. 2C) greater than a lateral dimension W3 (see FIG. 2D) of the bottom metal layer 102 along the X-direction. Due to the aforementioned structural configuration, areas of the bottom metal layer 102 between the peripheral metal vias v2-v12 and the edges 106b-106e of the bottom metal layer 102 are reduced, such that the resistance of the bottom metal layer 102 may be reduced, which in turn allows for improving −3 db frequency response of the MIM capacitor 100.

Figure 43:
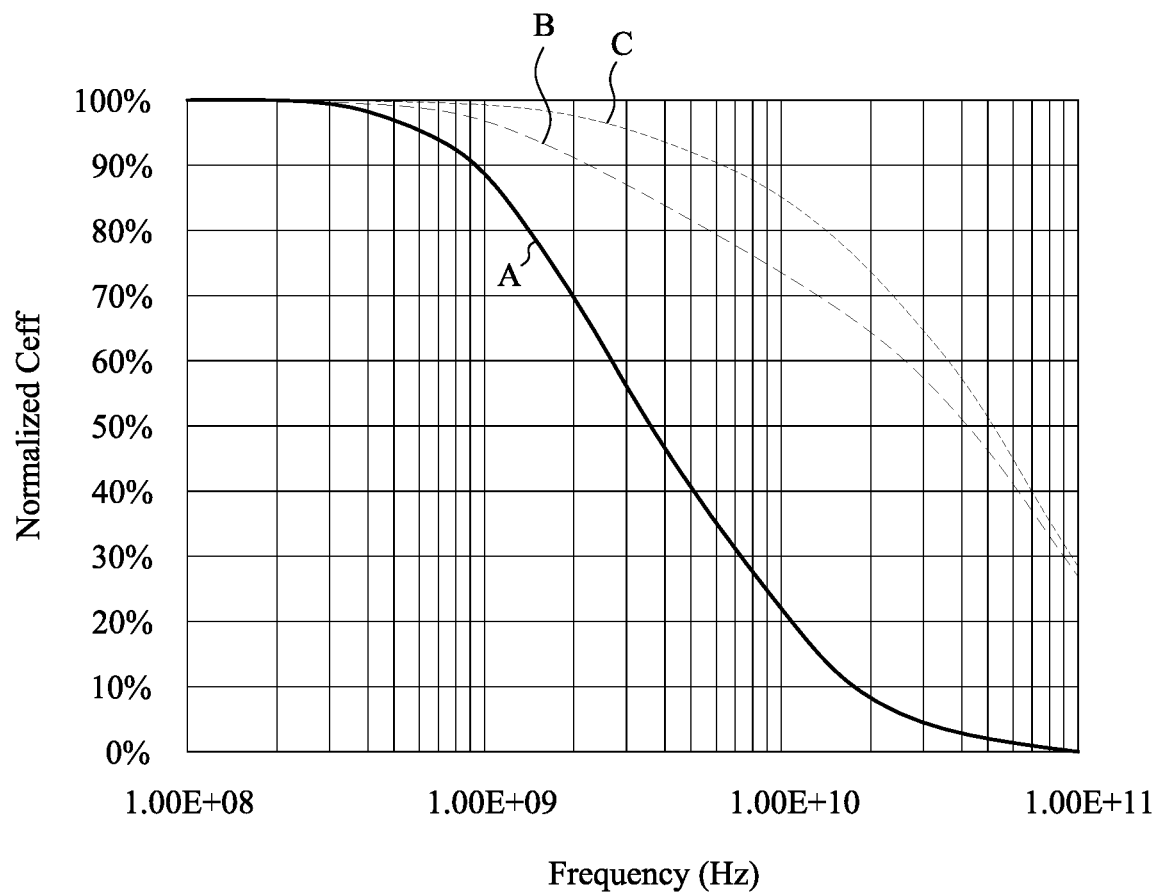
FIG. 43 is a graph showing frequency response performances of exemplary capacitors in accordance with some embodiments of the present disclosure.

FIG. 43 is a graph showing frequency response performances of exemplary capacitors in accordance with some embodiments of the present disclosure, in which Case C in the diagram is an experimental data of a capacitor including metal layers having optimized edge layouts as shown in FIGS. 1A, 1B, and 3B-3D, and Cases A and B in the diagram are experimental data of capacitors including metal layers without having optimized edge layouts shown in FIGS. 1A, 1B, and 3B-3D. In FIG. 43, the frequency response of the capacitor of Case C is better than the frequency response of the capacitor of Cases A and B. In the capacitor of Case C, the capacitor includes metal layer each having a plurality of notches on opposite edges thereof to form square wave-shaped edges as shown in FIGS. 2B-2D. In addition, each of the metal layers further has opposite straight edges extending between the square wave-shaped edges thereof, and the straight edge of the top/bottom metal layer is laterally set back from the straight edge of the middle metal layer as shown in FIGS. 2B-2D. Therefore, in the capacitor of Case C, a distance between the outermost metal via and the edge of the metal layer is decreased to scale down a portion of the metal electrode plate that extends beyond the outermost metal via, such that the resistance of the metal layer can be reduced, which in turn allows for improving −3 db frequency response of the MIM capacitor to have a better frequency response than the capacitors of Cases A and B without optimizing the edge layout patterns of the metal layers as shown in FIGS. 2B-2D.

In some embodiments, the square wave-shaped edges of the top, middle, and bottom metal layers 106, 104, and 102 overlap with each other. In some embodiments, the top and bottom metal layers 106 and 102 may be formed to have the same pattern as each other, such that the top and bottom metal layers 106 and 102 can be formed with the same mask and without additional mask and hence additional cost.

In some embodiments, the through hole 106a, 104a, and/or 102a on the top, middle, and/or bottom metal layer 106, 104, and/or 102 is square-shaped as shown in FIGS. 2B to 2D. In some embodiments, the through hole 106a, 104a, and/or 102a on the top, middle, and/or bottom metal layer 106, 104, and/or 102 may be of various shapes in a plan or top view. By way of example but not limiting the present disclosure, the through hole 106a, 104a, and/or 102a may have rectangular-shaped, line-shaped, polygon-shaped, circular-shaped, elliptical-shaped, and/or other suitable shapes.

In some embodiments, the thickness of the bottom, middle, and/or top metal layers 102, 104, and/or 106 may be determined to ensure adequate conductive properties of the plate(s). By way of example but not limiting the present disclosure, the bottom, middle, and/or top metal layers 102, 104, and/or 106 may have a thickness in a range from about 10 nm to about 100 nm.

In some embodiments, the bottom, middle, and top metal layers 102, 104, and 106 may be made of a same conductive material. In some embodiments, the bottom, middle, and top metal layers 102, 104, and 106 may be made of different conductive materials. In some embodiments, the metal layers 102, 104, and/or 106 may include TiN, TaN, Ti, Ta, Cu, Al, Ag, W, Ir, Ru, Pt, combinations thereof, or other suitable conductive materials.

In some embodiments, the bottom, middle, and top metal layers 102, 104, and 106 may be formed over the substrate 101 by a suitable process (e.g., sputtering, e-beam evaporation). Conductive material may be suitably deposited and may be patterned such as include conducting a photolithography process, a maskless lithography process, or a variety of processes suitable for transferring a pattern to the respective metal layer 102, 104, or 106. This may be done by any number of combinations of material removal processes or it may be accomplished by a single material removal process.

In FIGS. 1A and 3A-3D, the top electrode routing 134 is formed over the MIM capacitor 100. The top electrode routing 134 may be a metal line providing horizontal routing interconnecting the MIM capacitor 100. As shown in FIG. 2A, the top electrode routing 134 has the first and second electrode 134a and 134b spaced apart from each other. The first electrode 134a of the top electrode routing 134 is connected to the middle metal layer 104 to maintain the middle metal layer 104 at the first voltage potential through the metal vias v1, v3, v5, v7, v9, v11, and v13, and second electrode 134b of the top electrode routing 134 is connected to the top and bottom metal layers 106 and 102 to maintain the top and bottom metal layers 106 and 102 at the second voltage potential through the metal vias v2, v4, v6, v8, v10, and v12. In some embodiments, the top electrode routing 134 may include copper, aluminum, polysilicon, combinations thereof, or other suitable materials.

In FIGS. 1B and 3A-3D, the bottom electrode routing 132 is formed below the MIM capacitor 100. The bottom electrode routing 132 may be a metal line providing horizontal routing interconnecting the MIM capacitor 100 and the one or more active or passive features disposed in a multi-layer interconnect (MLI) structure of the substrate 101. In some embodiments, the bottom electrode routing 132 may be a top (e.g., uppermost) metal layer of the MLI structure. The MLI structure may include a plurality of metal, or otherwise conductive, lines and vias and may be formed over and used to interconnect active devices such as transistors formed in the substrate 101. In some embodiments, the substrate 101 may include a gate structure interposing source and drain features forming a transistor. The transistor(s) may be a fin-type field effect transistor (FinFET). The MIM capacitor 100 may be interconnected with one or more transistors formed on the substrate 101 through the bottom electrode routing 132. In some embodiments, the MIM capacitor 100 is part a memory device, for example, the MIM capacitor 100 may be a memory element of a resistive random-access memory (RRAM) cell and/or of a suitable type of various non-volatile computer memory cells.

Figure 2E:
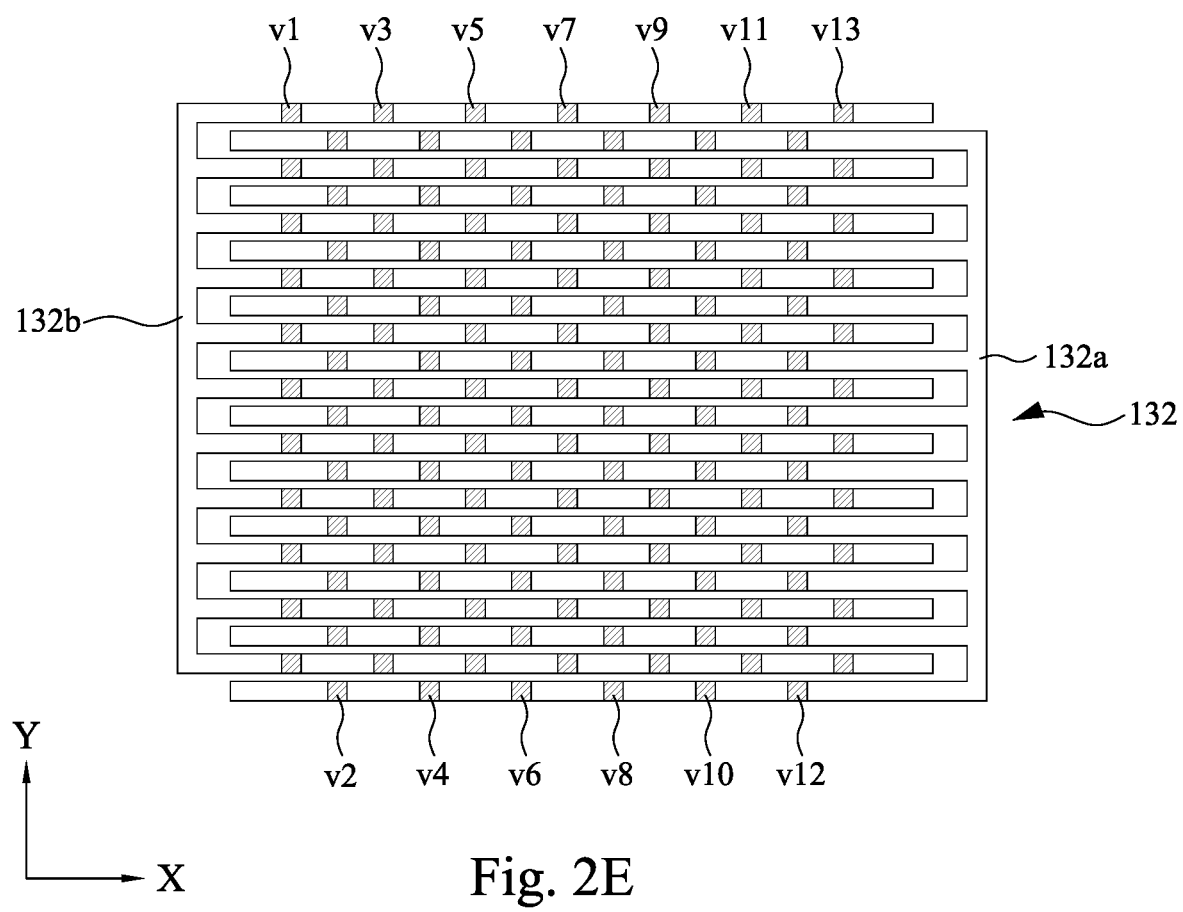

As shown in FIG. 2E, the bottom electrode routing 132 has the third and fourth electrode 132a and 132b spaced apart from each other. The third electrode 132a of the bottom electrode routing 132 is connected to the middle metal layer 104 to maintain the middle metal layer 104 at the first voltage potential through the metal vias v1, v3, v5, v7, v9, v11, and v13, and fourth electrode 132b of the bottom electrode routing 132 is connected to the top and bottom metal layers 106 and 102 to maintain the top and bottom metal layers 106 and 102 at the second voltage potential through the metal vias v2, v4, v6, v8, v10, and v12. In some embodiments, the bottom electrode routing 132 may include copper, aluminum, polysilicon, combinations thereof, or other suitable materials. In some embodiments, the bottom electrode routing 132 may be made of the same material as the top electrode routing 134. In some embodiments, the bottom electrode routing 132 may be made of a different material than the top electrode routing 134.

In FIGS. 3A to 3D, the capacitor dielectric layers 108 and 110 may use to inhibit current flow between the adjacent top, middle, and bottom metal layers 106, 104, and 102. In some embodiments, the materials of the capacitor dielectric layers 108 and 110 may be high-k dielectrics. By way of example and not limitation, the capacitor dielectric layers 108 and 110 may include $Al_2O_3$, $ZrO_2$, $Ta_2O_5$, $HfO_2$, $HfAlO$, $La_2O_3$, $TiO_2$, $SiO_2$, $SiN$, $Si_3N_4$, combinations thereof, or other suitable dielectric materials. The thickness of the capacitor dielectric layers 108 and 110 may be determined as desired to tune the capacitance of the MIM capacitor 100. By way of example and not limitation, the capacitor dielectric layers 108 and/or 110 may have a thickness in a range from about 2 nm, to about 20 nm. In some embodiments, the capacitor dielectric layers 108 and/or 110 may have a thinner thickness than the bottom, middle, and/or top metal layers 102, 104, and/or 106. In some embodiments, a variety of suitable processes including chemical vapor depositions (CVD), low-pressure CVD (LPCVD), plasma-enhanced CVD (PECVD), and atomic layer deposition (ALD) may be used to form the capacitor dielectric layers 108 and/or 110.

In FIGS. 3A to 3D, insulating layers 112 and 114 are formed in the MIM capacitor 100. In some embodiments, the insulating layer 112 may have a top surface coplanar with a top surface of the bottom metal layer 102. According to embodiments, substantially coplanar layers may be defined as layers that are laterally aligned at least one portion of the layers. In some embodiments, the insulating layer 114 may have a top surface coplanar with a top surface of the middle metal layer 104. In some embodiments, the insulating layer 112 and/or 114 may have a substantially similar thickness as the bottom and/or middle metal layer 102 and/or 104. In some embodiments, the insulating layers 112 and 114 may be made of the same composition as each other. In some embodiments, any at least two of the insulating layers 112 and 114 may be made of a different composition than each other. In some embodiments, the insulating layers 112 and 114 may be made of the same composition as one or more of capacitor dielectric layers 108 and 110. In some embodiments, the insulating layers 112 and 114 may be made of a different composition than one or more of capacitor dielectric layers 108 and 110. By way of example and not limitation, the insulating layers 112 and 114 may be silicon oxide. In some embodiments, the insulating layers 112 and/or 114 may be silicon nitride.

In FIGS. 3A to 3D, an insulating layer 126L is below the bottom metal layer 102. In some embodiments, the insulating layer 126L is silicon oxide. The oxide composition and thickness may be determined such that sufficient isolation is provided to the MIM capacitor 100. An etch stop layer 118 may underlie the insulating layer 126L for subsequent processes such as, etching of through holes 102a, 104a, and 106a. In some embodiments, the layer 118 is a silicon nitride. Above the top metal layer 106 is an insulating layer 126U, such as an oxide (e.g., silicon oxide). The insulating layer 126U may be the same composition as the insulating layer 126L. The oxide composition and thickness may be determined such that sufficient isolation is provided for the capacitor 100.

As a result, in some such embodiments, these structures such as MIM capacitor 100 are formed as part of a back end of line (BEOL) process. In contrast, forming a gate structure is typically a front end of line (FEOL) process. In such embodiments, the MIM capacitor 100 is formed after FEOL processes have completed. As a further advantage, the density of the MIM capacitor may be increased without the spatial limitations of the MLI structure or the patterning of the active device such as transistors.

Figure 4:
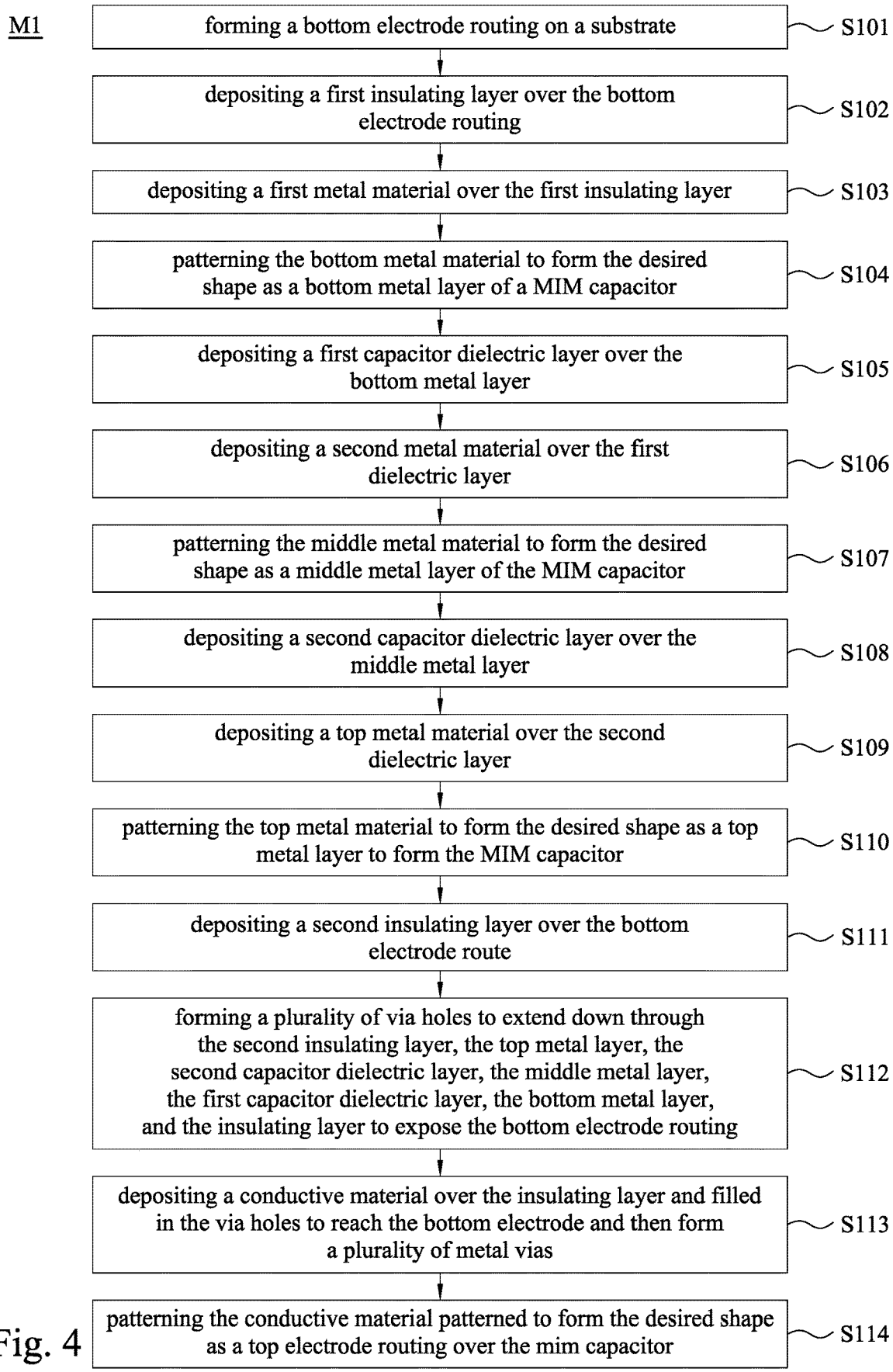
FIG. 4 is a method M1 of manufacturing an integrated circuit including a MIM capacitor in accordance with some embodiments of the present disclosure.

Referring now to FIG. 4, illustrated is a flowchart of an exemplary method M1 for fabrication of an integrated circuit including a capacitor in accordance with some embodiments. The method M1 includes a relevant part of the entire manufacturing process. It is understood that additional operations may be provided before, during, and after the operations shown by FIG. 4, and some of the operations described below can be replaced or eliminated for additional embodiments of the method. The order of the operations/processes may be interchangeable. The method M1 includes fabrication of a semiconductor device. However, the fabrication of the semiconductor device is merely an example for describing the manufacturing process according to some embodiments of the present disclosure.

Figure 5A:
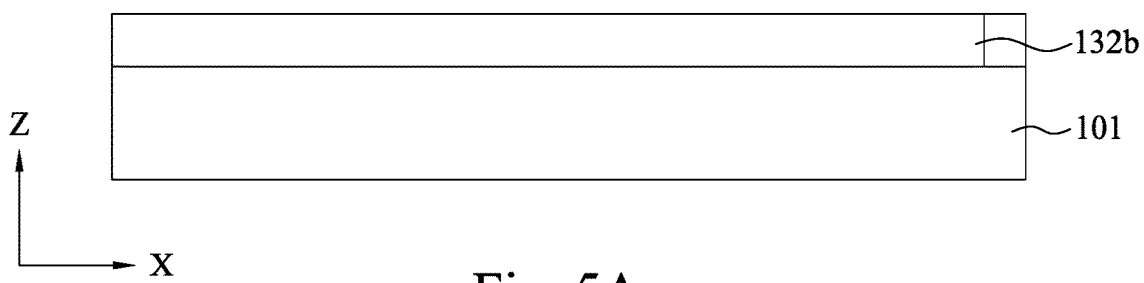
FIGS. 5A to 18B illustrate cross-sectional views of intermediate stages in the formation of a MIM capacitor in an integrated circuit in accordance with some embodiments of the present disclosure.
Figure 5B:
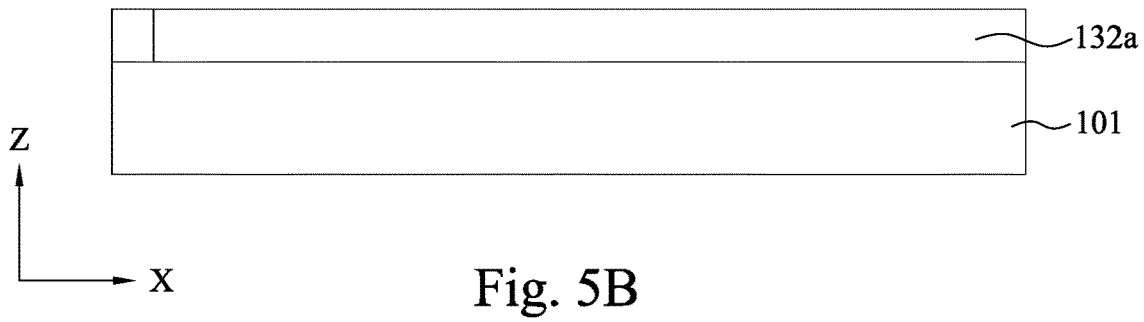

FIGS. 5A to 16B illustrate cross-sectional views of intermediate stages in the formation of a capacitor in an integrated circuit in accordance with some embodiments of the present disclosure. FIGS. 5A, 6A, 7A, 8A, 9A, 10A, 11A, 12A, 13A, 14A, 15A, and 16A are cross-sectional views obtained from a vertical plane corresponding to line A-A' in FIG. 1A. FIGS. 5B, 6B, 7B, 8B, 9B, 10B, 11B, 12B, 13B, 14B, 15B, and 16B, are cross-sectional views obtained from a vertical plane corresponding to line B-B' in FIG. 2A. The method M1 begins at block S101. Referring to FIGS. 5A and 5B, in some embodiments of block S101, a bottom electrode routing 132 is formed on a substrate 101. The substrate 101 may include various features such as active transistors interconnected by a MLI structure. The bottom electrode routing 132 includes the electrode 132a and the electrode 132b spaced apart from the electrode 132a. The substrate 101 and the bottom electrode routing 132 may be substantially similar to as discussed above with reference to FIGS. 1A to 3D. In some embodiments, the bottom electrode routing 132 may include copper, aluminum, polysilicon, combinations thereof, or other suitable materials.

Figure 6A:
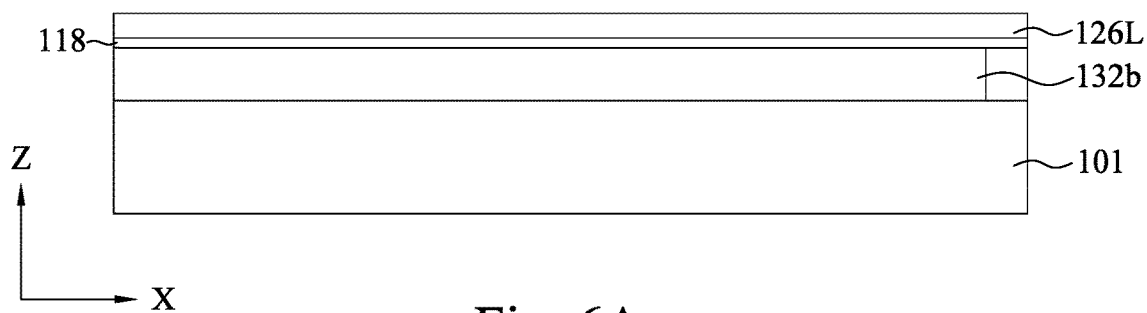
Figure 6B:
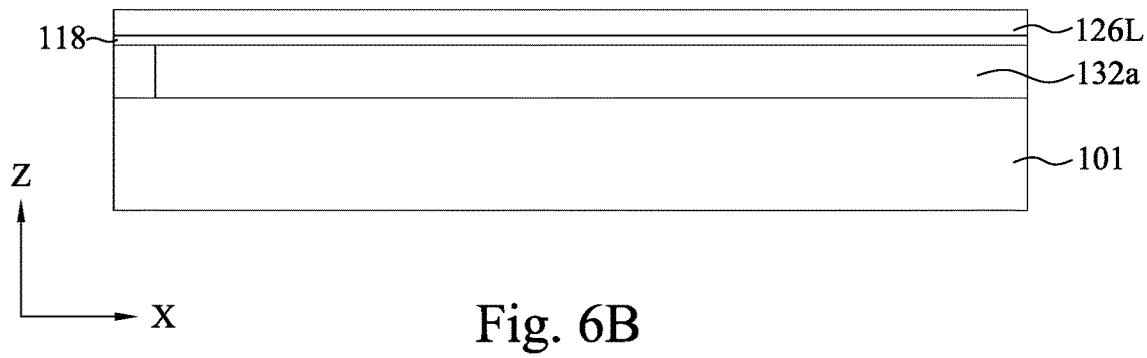

Referring back to FIG. 4, the method M1 then proceeds to block S102 where a first insulating layer is deposited over the bottom electrode routing. With reference to FIGS. 6A and 6B, in some embodiments of block S102, an insulating layer 126L is disposed over the substrate. An etch stop layer 118, such as silicon nitride, may underlie the insulating layer 126L. The etch stop layer 118 and the insulating layer 126L may be substantially similar to as discussed above with reference to FIGS. 3A to 3D. In some embodiments, the insulating layer 126L is an oxide such as silicon oxide. In some embodiments, the insulating layer 126L and/or the etch stop layer 118 may be deposited using any suitable method, such as CVD, physical vapor deposition (PVD), ALD, PEALD, PECVD, SACVD, FCVD, spin-on, and/or the like, or a combination thereof.

Figure 7A:
Figure 7B:
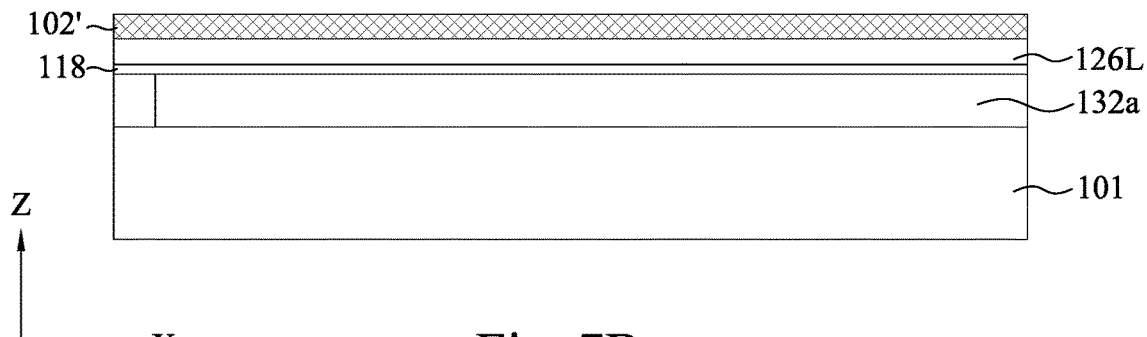

Referring back to FIG. 4, the method M1 then proceeds to block S103 where a bottom metal material is deposited over the first insulating layer. With reference to FIGS. 7A and 7B, in some embodiments of block S103, a bottom metal material 102' is formed over the insulating layer 126L. The bottom metal material 102' may be fabricated by depositing a conformal layer of conductive material that is subsequently patterned to form the bottom electrode of the MIM capacitor 100. In some embodiments, the bottom metal material 102' may include TiN, TaN, Ti, Ta, Cu, Al, Ag, W, Ir, Ru, Pt, combinations thereof, or other suitable conductive materials. In some embodiments, the bottom metal material 102' may be deposited using any suitable method, such as CVD, physical vapor deposition (PVD), ALD, PEALD, PECVD, SACVD, FCVD, spin-on, and/or the like, or a combination thereof.

Figure 8A:
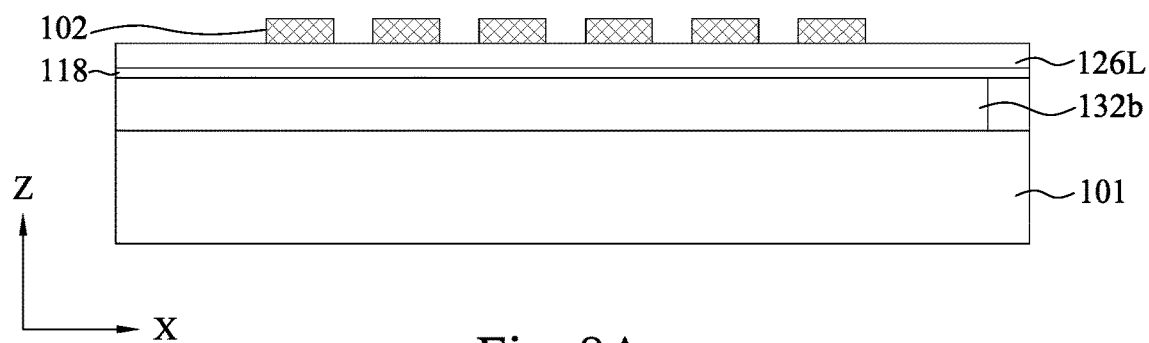
Figure 8B:
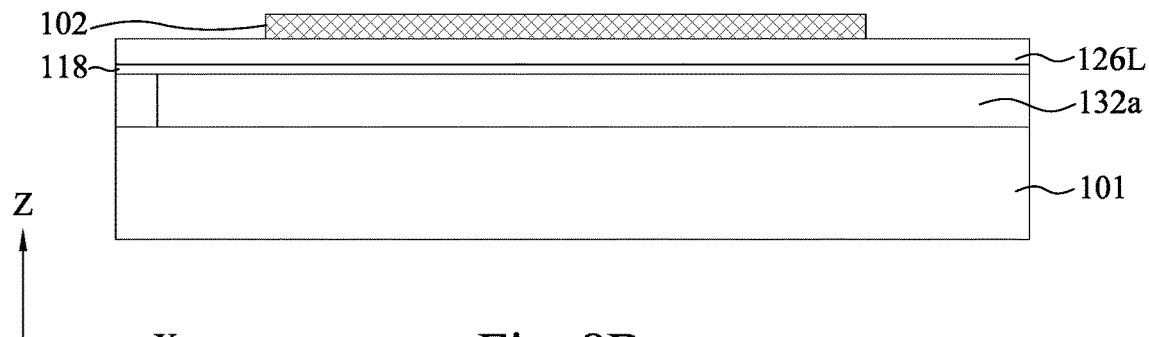

Referring back to FIG. 4, the method M1 then proceeds to block S104 where the bottom metal material is patterned to form the desired shape as a bottom metal layer of a MIM capacitor. With reference to FIGS. 8A and 8B, in some embodiments of block S104, the bottom metal material 102' shown in FIGS. 7A and 7B may be then patterned to form the desired shape as discussed above in the MIM capacitor 100 of FIGS. 1A to 3D. The deposited conductive material may be patterned by conducting a photolithography process, a maskless lithography process, or a variety of processes suitable for transferring a pattern to the bottom metal material 102'. This may be done by any number of combinations of material removal processes or it may be accomplished by a single material removal process. The bottom metal material 102' may have been patterned to form the bottom metal layer 102. The through holes 102a are formed on the bottom metal layer 102 to expose the underlying insulating layer 126L. In some embodiments, an etching of a portion of the insulating layer 126L may also occur during the patterning of the bottom metal material 102'. Thus, the exposed top surface of the insulating layer 126L may be below the top surface of the insulating layer 126L directly under the bottom metal layer 102. The through holes 102a on the bottom metal layer 102 may be formed in square-shaped in a plan or top view as shown in FIG. 2B. By way of example but not limiting the present disclosure, the through hole 102a may have rectangular-shaped, line-shaped, polygon-shaped, circular-shaped, elliptical-shaped, and/or other suitable shapes.

Figure 9A:
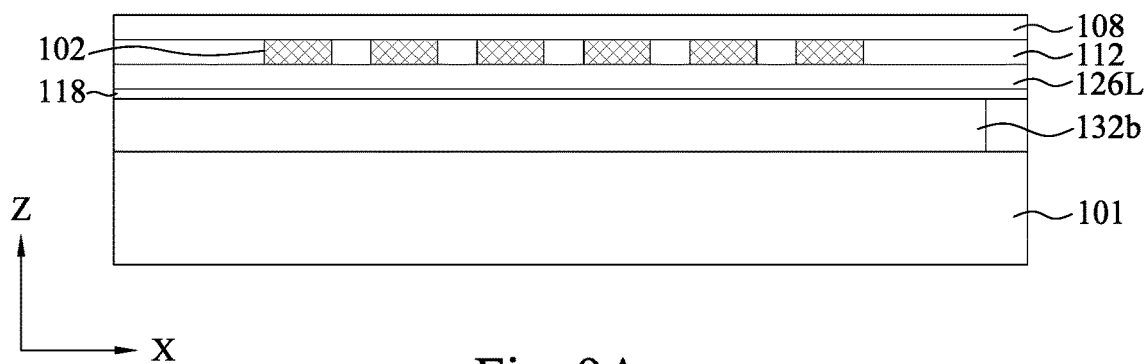
Figure 9B:
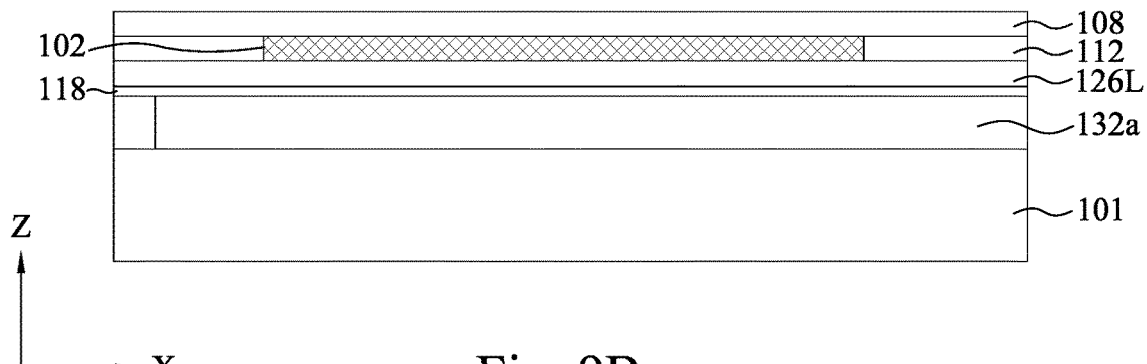

Referring back to FIG. 4, the method M1 then proceeds to block S105 where a first capacitor dielectric layer is deposit over the bottom metal layer. With reference to FIGS. 9A and 9B, in some embodiments of block S105, the insulating layer 112 is formed adjacent the bottom metal layer 102 of the MIM capacitor and in the through holes 102a of the bottom metal layer 102. Subsequently, the capacitor dielectric layer 108 is then deposited over the bottom metal layer 102. The insulating layer 112 and the capacitor dielectric layer 108 may be substantially similar to as discussed above with reference to FIGS. 1A to 3D.

In greater detail, an insulating material may be formed to a thickness that is greater than that of the bottom metal layer 102 such that a top surface of the insulating material lies above the top surface of the bottom metal layer 102. A chemical mechanical planarization (CMP) process may then be formed that reduces the thickness of the deposited insulating material and provides a planar top surface. In an embodiment, the CMP process has an end point (e.g., a timed-endpoint) approximately on the top surface of the bottom metal layer 102. For example, the CMP may stop approximately at a top surface of the bottom metal layer 102 (e.g., within fabrication processes tolerances such as 5% over etch of the bottom metal layer 102). As illustrated in the example of FIGS. 9A and 9B, a planar top surface including the bottom metal layer 102 and the insulating layer 112 is formed. In some embodiments, the resultant thickness of insulating layer 112 is approximately equal to that of the bottom metal layer 102. In some embodiments, the resultant thickness of the insulating layer 112 is greater than that of the bottom metal layer 102. In some embodiments, the thickness difference between the insulating layer 112 and the bottom metal layer 102 may be controlled by controlling an over etch time or amount. In an embodiment, if the over etch amount is less, a subsequent planarization process can be reduced in the amount of removed material providing a more efficient process.

In some embodiments, the insulating layer 112 may include silicon oxide, silicon nitride, combinations thereof, and/or other suitable compositions. In some embodiments, the insulating layer 112 may be formed by chemical vapor deposition (CVD). However, a variety of suitable processes including CVD, low-pressure CVD (LPCVD), plasma-enhanced CVD (PECVD), atomic layer deposition (ALD), thermal oxidation, combinations thereof, and/or other suitable processes may be used to form the insulating layer 112.

In some embodiments, the materials of the capacitor dielectric layer 108 may be high-k dielectrics. By way of example and not limitation, the capacitor dielectric layer 108 may include $Al_2O_3$, $ZrO_2$, $Ta_2O_5$, $HfO_2$, HfAlO, $La_2O_3$, $TiO_2$, $SiO_2$, SiN, $Si_3N_4$, combinations thereof, or other suitable dielectric materials. In some embodiments, a variety of suitable processes including chemical vapor depositions (CVD), low-pressure CVD (LPCVD), plasma-enhanced CVD (PECVD), and atomic layer deposition (ALD) may be used to form the capacitor dielectric layer 108.

Figure 10A:
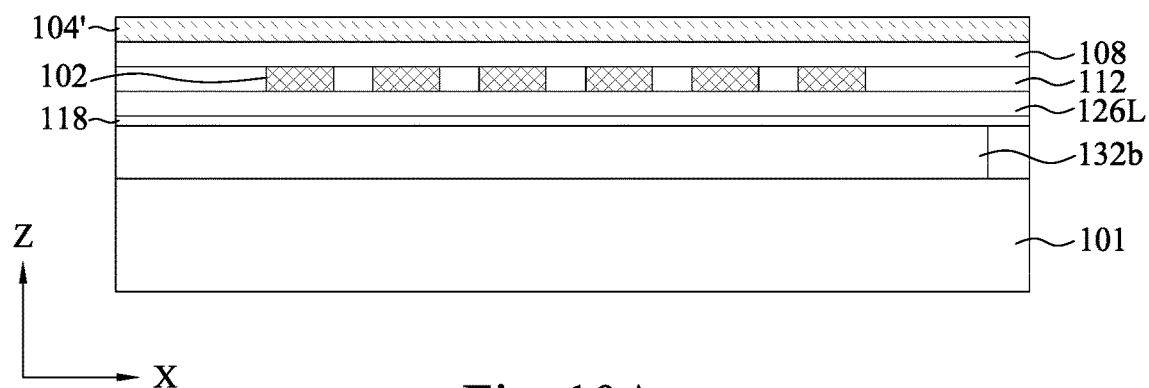
Figure 10B:
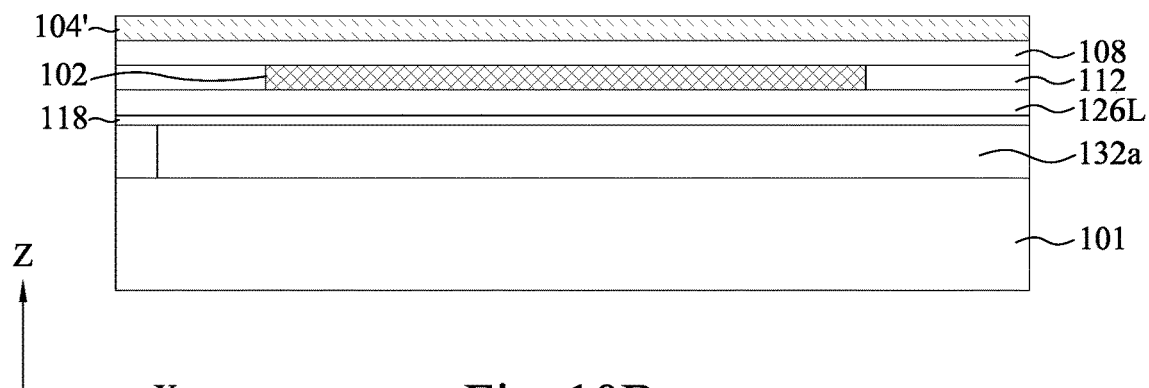

Referring back to FIG. 4, the method M1 then proceeds to block S106 where a middle metal material is deposited over the first capacitor dielectric layer. With reference to FIGS. 10A and 10B, in some embodiments of block S106, a middle metal material 104' is formed over the capacitor dielectric layer 108. The middle metal material 104' may be fabricated by depositing a conformal layer of conductive material that is subsequently patterned to form the bottom electrode of the MIM capacitor 100. In some embodiments, the middle metal material 104' may include TiN, TaN, Ti, Ta, Cu, Al, Ag, W, Ir, Ru, Pt, combinations thereof, or other suitable conductive materials. In some embodiments, the middle metal material 104' may be the same composition as the bottom metal layer 102, or alternatively, a different composition may be provided. In some embodiments, the middle metal material 104' may be deposited using any suitable method, such as CVD, physical vapor deposition (PVD), ALD, PEALD, PECVD, SACVD, FCVD, spin-on, and/or the like, or a combination thereof.

Figure 11A:
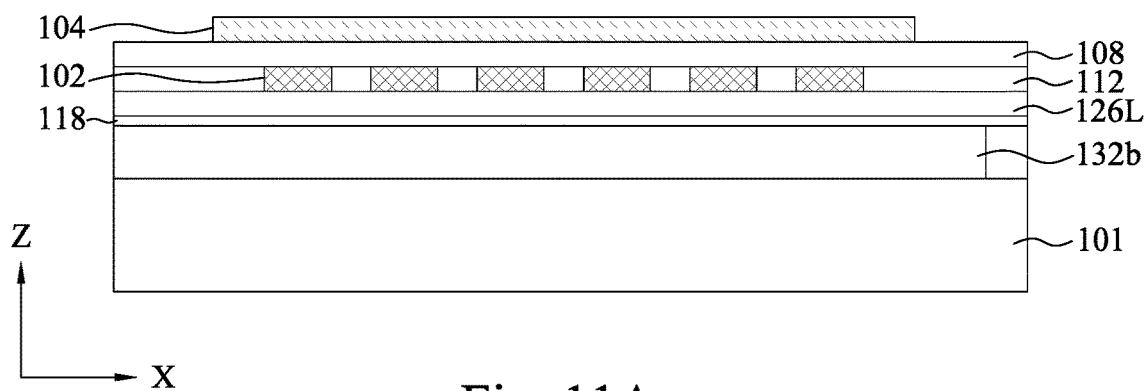
Figure 11B:
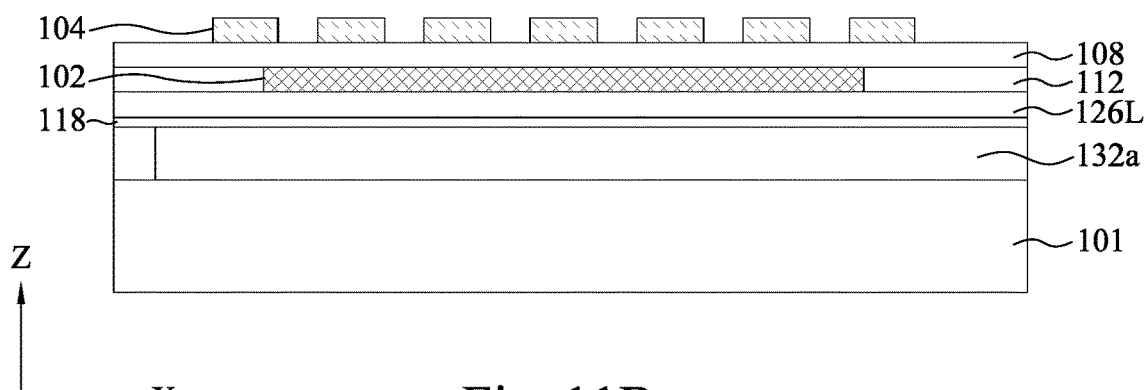

Referring back to FIG. 4, the method M1 then proceeds to block S107 where the middle metal material is patterned to form the desired shape as a middle metal layer of the MIM capacitor. With reference to FIGS. 11A and 11B, in some embodiments of block S107, the middle metal material 104' shown in FIGS. 10A and 10B may be then patterned to form the desired shape as discussed above in the MIM capacitor 100 of FIGS. 1A to 3D. The deposited conductive material may be patterned by conducting a photolithography process, a maskless lithography process, or a variety of processes suitable for transferring a pattern to the middle metal material 104'. This may be done by any number of combinations of material removal processes or it may be accomplished by a single material removal process. The middle metal material 104' may have been patterned to form the middle metal layer 104. The through holes 104a are formed on the middle metal material 104' to expose the underlying capacitor dielectric layer 108. The through holes 104a on the middle metal layer 104 may be formed in square-shaped in a plan or top view as shown in FIG. 2C. By way of example but not limiting the present disclosure, the through hole 104a may have rectangular-shaped, line-shaped, polygon-shaped, circular-shaped, elliptical-shaped, and/or other suitable shapes.

Figure 12A:
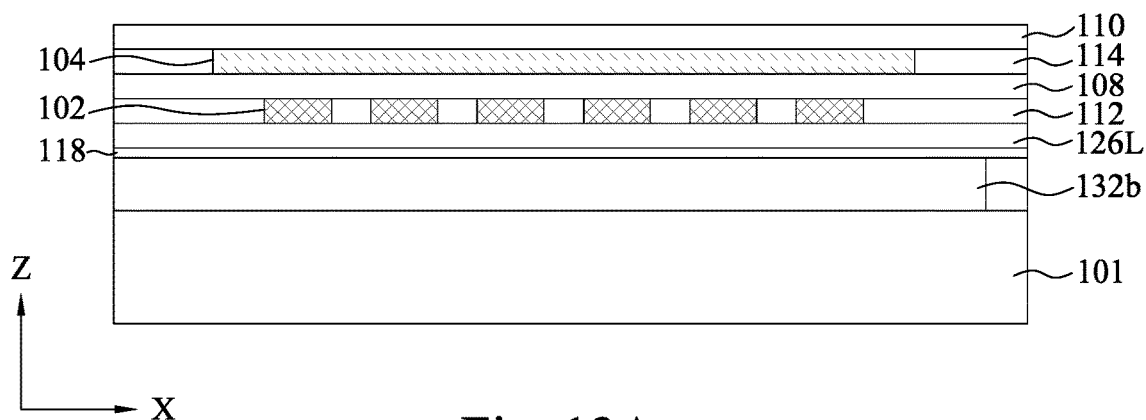
Figure 12B:
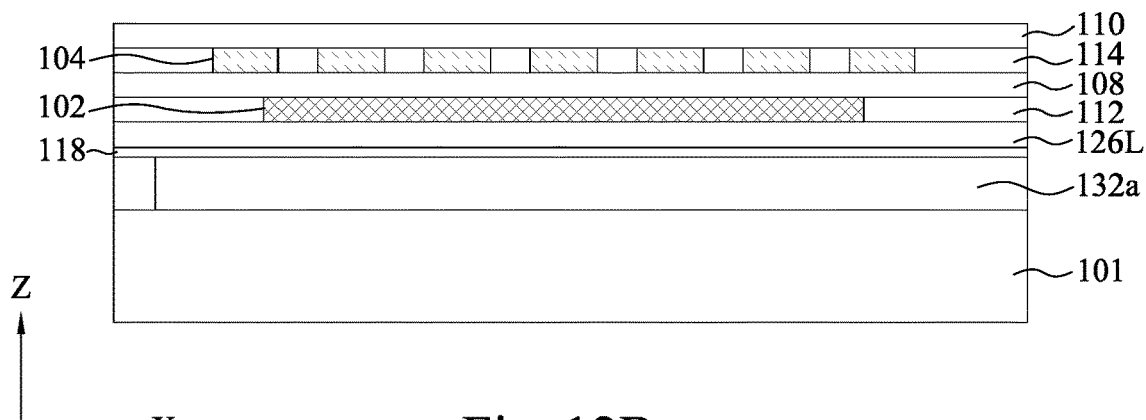

Referring back to FIG. 4, the method M1 then proceeds to block S108 where a second capacitor dielectric layer is deposit over the middle metal layer. With reference to FIGS. 12A and 12B, in some embodiments of block S108, the insulating layer 114 is formed adjacent the middle metal layer 104 of the MIM capacitor and in the through holes 104a of the middle metal layer 104. Subsequently, the capacitor dielectric layer 110 is then deposited over the middle metal layer 104. The insulating layer 114 and the capacitor dielectric layer 110 may be substantially similar to as discussed above with reference to FIGS. 1A to 3D.

In greater detail, an insulating material may be formed to a thickness that is greater than that of the middle metal layer 104 such that a top surface of the insulating material lies above the top surface of the middle metal layer 104. A chemical mechanical planarization (CMP) process may then be formed that reduces the thickness of the deposited insulating material and provides a planar top surface. In an embodiment, the CMP process has an end point (e.g., a timed-endpoint) approximately on the top surface of the middle metal layer 104. For example, the CMP may stop approximately at a top surface of the middle metal layer 104 (e.g., within fabrication processes tolerances such as 5% over etch of the middle metal layer 104). As illustrated in the example of FIGS. 12A and 12B, a planar top surface including the middle metal layer 104 and the insulating layer 114 is formed. In some embodiments, the resultant thickness of insulating layer 114 is approximately equal to that of the middle metal layer 104. In some embodiments, the resultant thickness of the insulating layer 114 is greater than that of the middle metal layer 104. In some embodiments, the thickness difference between the insulating layer 114 and the middle metal layer 104 may be controlled by controlling an over etch time or amount. In an embodiment, if the over etch amount is less, a subsequent planarization process can be reduced in the amount of removed material providing a more efficient process.

In some embodiments, the insulating layer 114 may include silicon oxide, silicon nitride, combinations thereof, and/or other suitable compositions. In some embodiments, the insulating layer 114 may be formed by chemical vapor deposition (CVD). However, a variety of suitable processes including CVD, low-pressure CVD (LPCVD), plasma-enhanced CVD (PECVD), atomic layer deposition (ALD), thermal oxidation, combinations thereof; and/or other suitable processes may be used to form the insulating layer 114.

In some embodiments, the materials of the capacitor dielectric layer 110 may be high-k dielectrics. By way of example and not limitation, the capacitor dielectric layer 110 may include $Al_2O_3$, $ZrO_2$, $Ta_2O_5$, $HfO_2$, HfAlO, $La_2O_3$, $TiO_2$, $SiO_2$, SiN, $Si_3N_4$, combinations thereof, or other suitable dielectric materials. In some embodiments, a variety of suitable processes including chemical vapor depositions (CVD), low-pressure CVD (LPCVD), plasma-enhanced CVD (PECVD), and atomic layer deposition (ALD) may be used to form the capacitor dielectric layer 110.

Figure 13A:
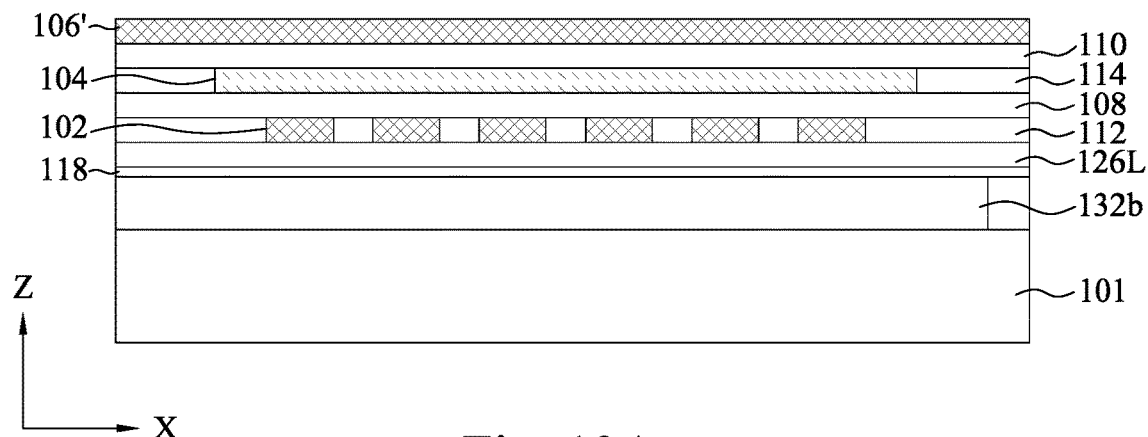
Figure 13B:
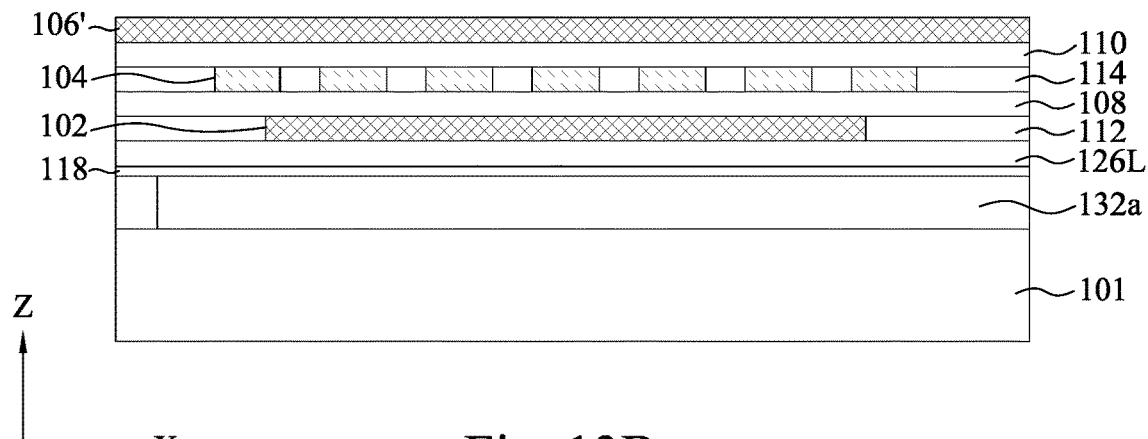

Referring back to FIG. 4, the method M1 then proceeds to block S109 where a top metal material is deposited over the second capacitor dielectric layer. With reference to FIGS. 13A and 13B, in some embodiments of block S110, a top metal material 106' is formed over the capacitor dielectric layer 110. The top metal material 106' may be fabricated by depositing a conformal layer of conductive material that is subsequently patterned to form the bottom electrode of the MIM capacitor 100. In some embodiments, the top metal material 106' may include TiN, TaN, Ti, Ta, Cu, Al, Ag, W, Ir, Ru, Pt, combinations thereof, or other suitable conductive materials. In some embodiments, the top metal material 106' may be the same composition as the middle metal layer 104 and/or the bottom metal layer 102, or alternatively, a different composition may be provided. In some embodiments, the top metal material 106' may be deposited using any suitable method, such as CVD, physical vapor deposition (PVD), ALD, PEALD, PECVD, SACVD, FCVD, spin-on, and/or the like, or a combination thereof.

Figure 14A:
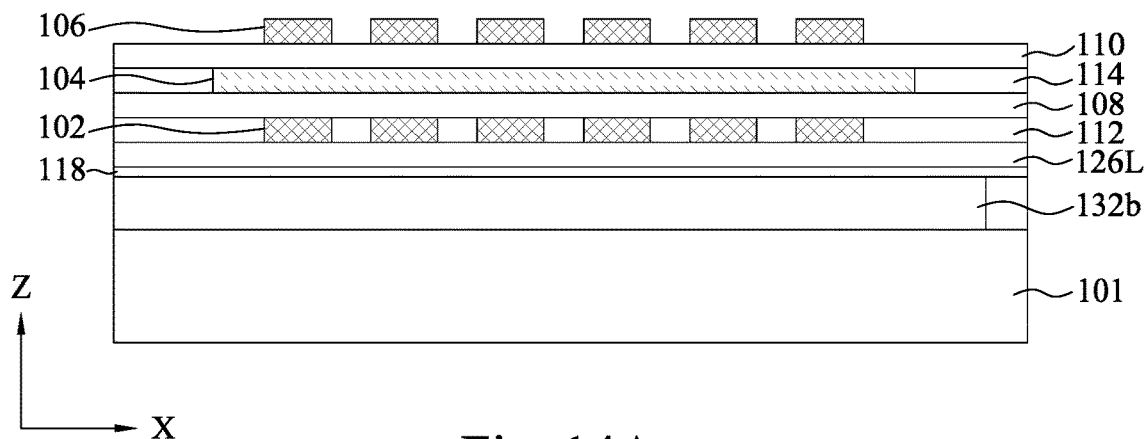
Figure 14B:
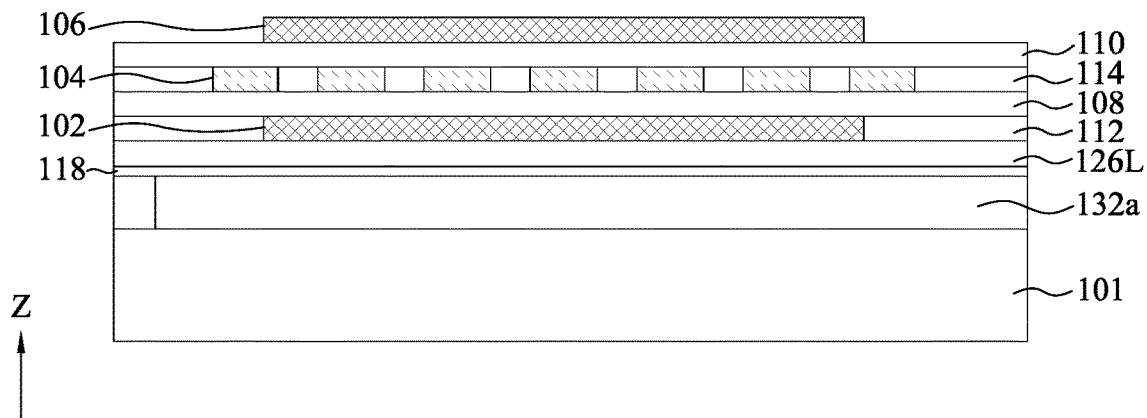

Referring back to FIG. 4, the method M1 then proceeds to block S110 where the top metal material is patterned to form the desired shape as a top metal layer to form the MIM capacitor. With reference to FIGS. 14A and 14B, in some embodiments of block S110, the top metal material 106' shown in FIGS. 13A and 13B may be then patterned to form the desired shape as discussed above in the MIM capacitor 100 of FIGS. 1A to 3D. The deposited conductive material may be patterned by conducting a photolithography process, a maskless lithography process, or a variety of processes suitable for transferring a pattern to the top metal material 106'. This may be done by any number of combinations of material removal processes or it may be accomplished by a single material removal process. The top metal material 106' may have been patterned to form the top metal layer 106. The through holes 106a are formed on the top metal material 106' to expose the underlying capacitor dielectric layer 110. The through holes 106a on the top metal layer 106 may be formed in square-shaped in a plan or top view as shown in FIG. 2D. By way of example but not limiting the present disclosure, the through hole 104a may have rectangular-shaped, line-shaped, polygon-shaped, circular-shaped, elliptical-shaped, and/or other suitable shapes.

Figure 15A:
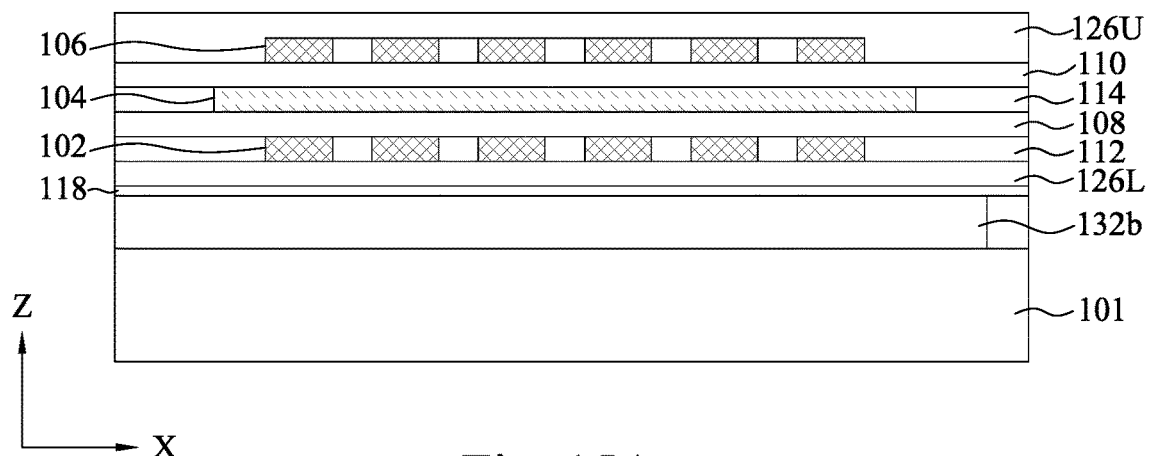
Figure 15B:
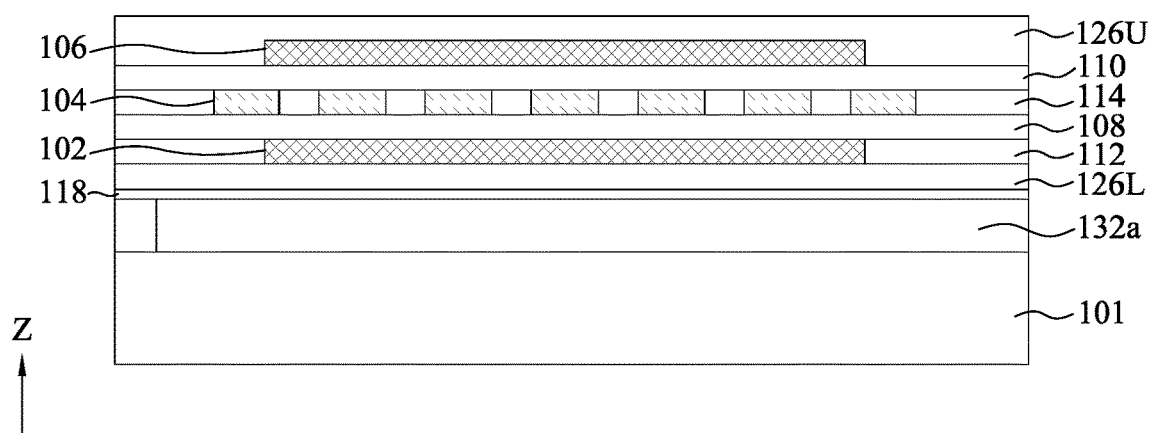

Referring back to FIG. 4, the method M1 then proceeds to block S111 where a second insulating layer is deposited over the bottom electrode routing. With reference to FIGS. 15A and 15B, in some embodiments of block S111, an insulating layer 126U is disposed over the top metal layer 106 and in the through holes 106a of the top metal layer 106. The insulating layer 126U may be substantially similar to as discussed above with reference to FIGS. 1A to 3D. In some embodiments, the insulating layer 126U is an oxide such as silicon oxide. In some embodiments, the insulating layer 126U may be deposited using any suitable method, such as CVD, physical vapor deposition (PVD), ALD, PEALD, PECVD, SACVD, FCVD, spin-on, and/or the like, or a combination thereof.

Figure 16A:
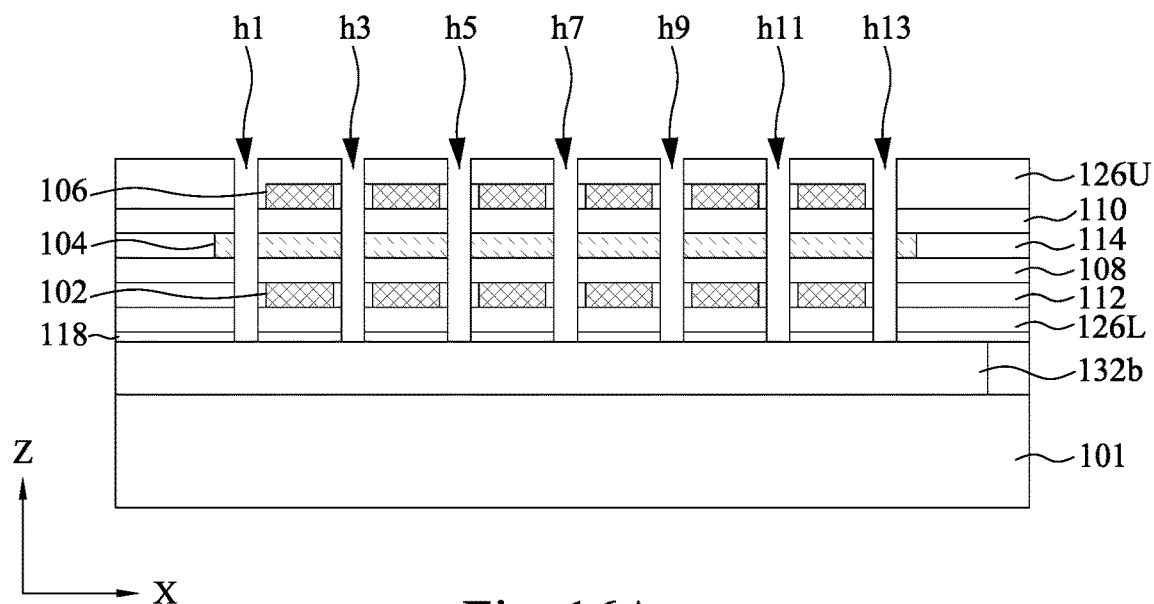
Figure 16B:
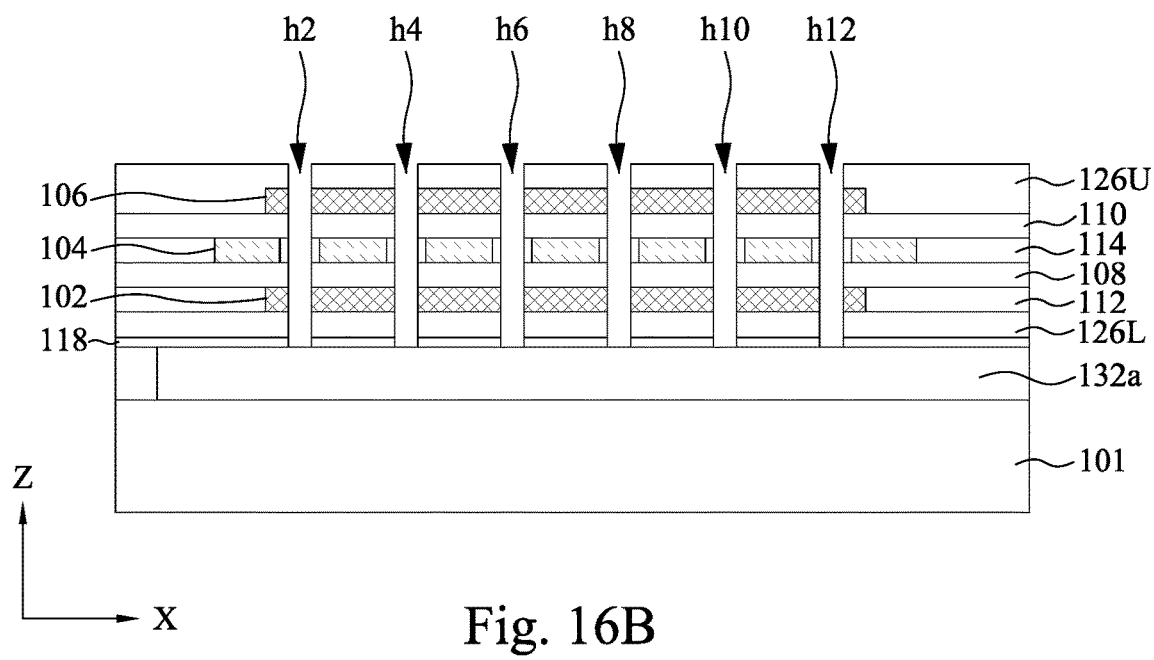

Referring back to FIG. 4, the method M1 then proceeds to block S112 where a plurality of via holes are formed to extend down through the second insulating layer, the top metal layer, the second capacitor dielectric layer, the middle metal layer, the first capacitor dielectric layer, the bottom metal layer, and the insulating layer to expose the bottom electrode routing. With reference to FIGS. 16A and 16B, in some embodiments of block S112, a plurality of via holes h1-h13 are formed down through the insulating layer 126U, the top metal layer 106, the capacitor dielectric layer 110, the middle metal layer 104, the capacitor dielectric layer 108, the bottom metal layer 102, and the insulating layer 126L to expose the bottom electrode routing 132. The via holes h1-h13 are formed the desired shape as the metal vias v1-v13 discussed above shown in FIGS. 1A to 3D that inherit the shape of the via holes h1-h13.

This is described in greater detail with reference to FIG. 16A, via holes h1, h3, h5, h7, h9, h11, and h13 extend from the top surface of the insulating layer 126U down to the fourth electrode 132b of the bottom electrode routing 132 to penetrate the middle metal layer 104 of the MIM capacitor 100, but spaced apart from the top and bottom metal layers 106 and 102 through the through holes 102a and 106a on the top and bottom metal layers 106 and 102. This is described in greater detail with reference to FIG. 16B, the via holes h2, h4, h6, h8, h10, and h12 extend from a top surface of the insulating layer 126U down to the second electrode 132a of the bottom electrode routing 132 to penetrate the top metal layer 106 and the bottom metal layer 102 of the MIM capacitor 100, but spaced apart from the middle metal layer 104 through the through holes 104a on the middle metal layer 104.

Because the metal vias v1-v13 as shown in FIGS. 1A to 3D inherit the shape of the via holes h1-h13, the via holes h1-h13 may have the same pattern as the metal vias v1-v13 as shown in FIGS. 1A to 3D. In some embodiments, the via holes h1-h13 may a square-shaped as the metal vias v1-v13 as shown in FIGS. 1A to 3D in a plan or top view. By way of example but not limiting the present disclosure, the via holes h1-h13 may have rectangular-shaped, line-shaped, polygon-shaped, circular-shaped, elliptical-shaped, and/or other suitable shapes in a plan or top view. In some embodiments, the etching of the insulating layer 126U, the top metal layer 106, the capacitor dielectric layer 110, the middle metal layer 104, the capacitor dielectric layer 108, the bottom metal layer 102, and the insulating layer 126L expose the bottom electrode routing 132 may include a plasma-induced etching process(es) by way of example but not limiting the present disclosure.

Figure 17A:
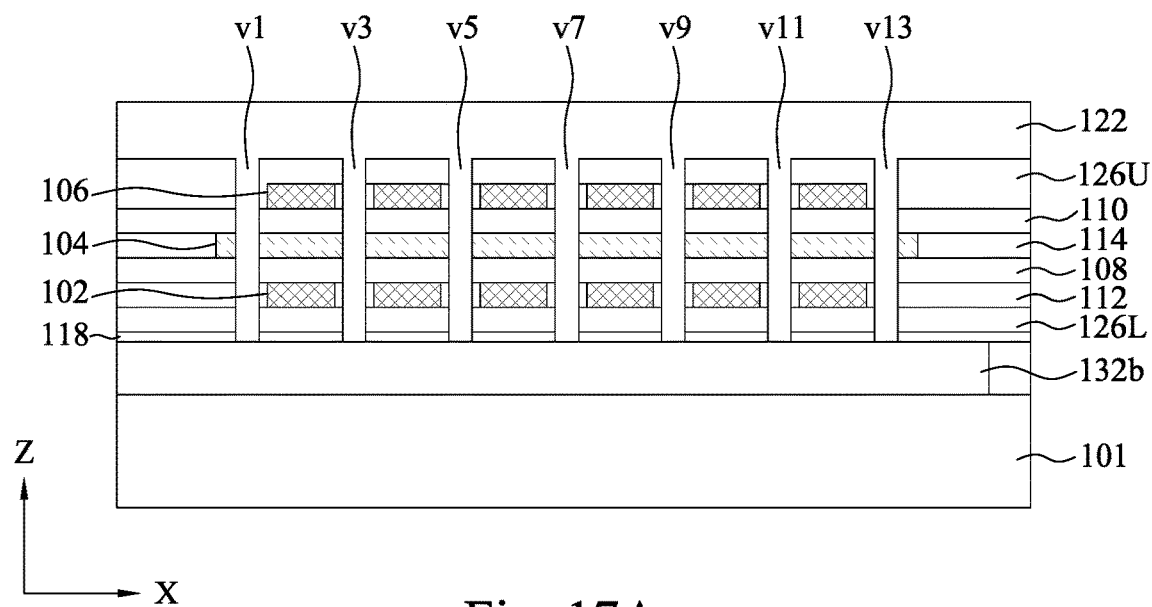
Figure 17B:
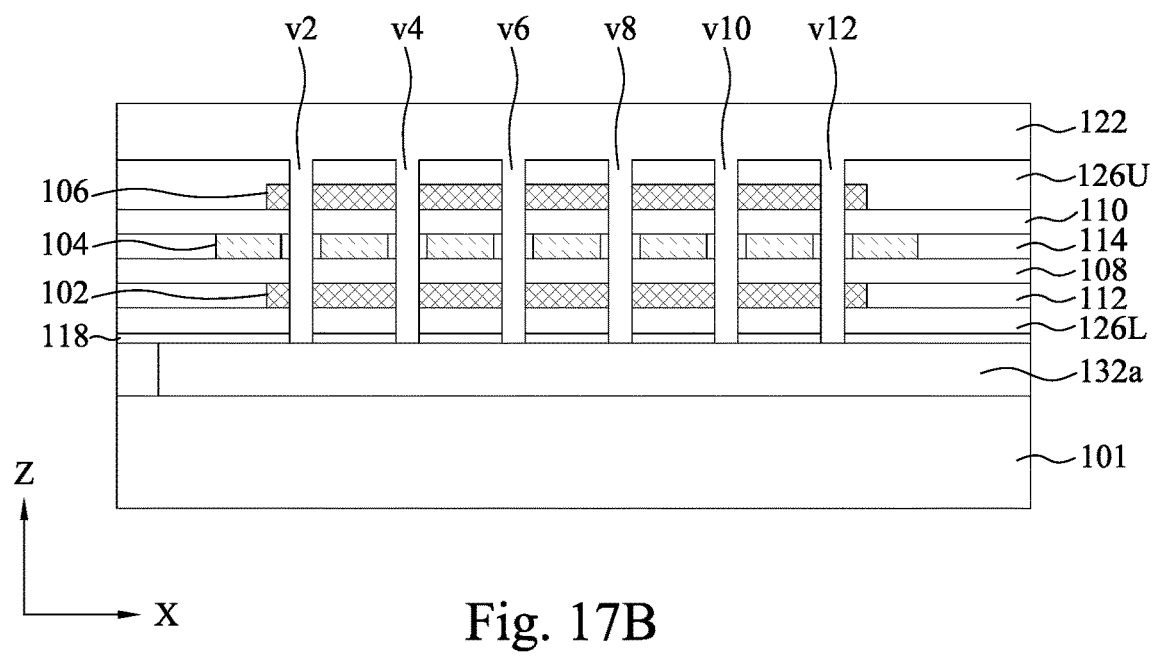

Referring back to FIG. 4, the method M1 then proceeds to block S113 where a conductive material is deposited over the insulating layer and filled in the via holes to reach the bottom electrode routing and then form a plurality of metal vias. With reference to FIGS. 17A and 17B, in some embodiments of block S113, a conductive material 122 is deposited over the insulating layer 126U and filled in the via holes h1-h13 to reach the bottom electrode routing 132 and then form a plurality of metal vias v1-v13.

This is described in greater detail with reference to FIG. 17A, the metal vias v1, v3, v5, v7, v9, v11, and v13 extend from the top surface of the insulating layer 126U down to the fourth electrode 132b of the bottom electrode routing 132 to connect with the middle metal layer 104 of the MIM capacitor 100, but pass through the top and bottom metal layers 106 and 102 through the through holes 106a and 102a on the top and bottom metal layers 106 and 102, such that the metal vias v1, v3, v5, v7, v9, v11, and v13 are spaced apart from the top and bottom metal layers 106 and 102 and in contact with the middle metal layer 104, which in turn allows for maintaining a first voltage potential (in operation) on the top and bottom metal layers 106 and 102 and a second voltage potential (in operation) on the middle metal layer 104.

This is described in greater detail with reference to FIG. 17B, the metal vias v2, v4, v6, v8, v10, and v12 extend from the top surface of the insulating layer 126U down to the second electrode 132a of the bottom electrode routing 132 to connect the top metal layer 106 and the bottom metal layer 102 of the MIM capacitor 100, but pass through the middle metal layer 104 from the through holes 104a on the middle metal layer 104, such that the metal vias v2, v4, v6, v8, v10, and v12 are spaced apart from the middle metal layer 104 and in contact with the top and bottom metal layers 106 and 102, which in turn allows for maintaining a first voltage potential (in operation) on the top and bottom metal layers 106 and 102 and a second voltage potential (in operation) on the middle metal layer 104.

In some embodiments, the conductive material 122 may include copper, aluminum, polysilicon, combinations thereof, or other suitable materials. In some embodiments, the conductive material 122 may be made of the same material as the bottom electrode routing 132. In some embodiments, the conductive material 122 may be made of a different material than the bottom electrode routing 132. In some embodiments, the conductive material 122 may be deposited using any suitable method, such as CVD, physical vapor deposition (PVD), ALD, PEALD, PECVD, SACVD, FCVD, spin-on, and/or the like, or a combination thereof.

Figure 18A:
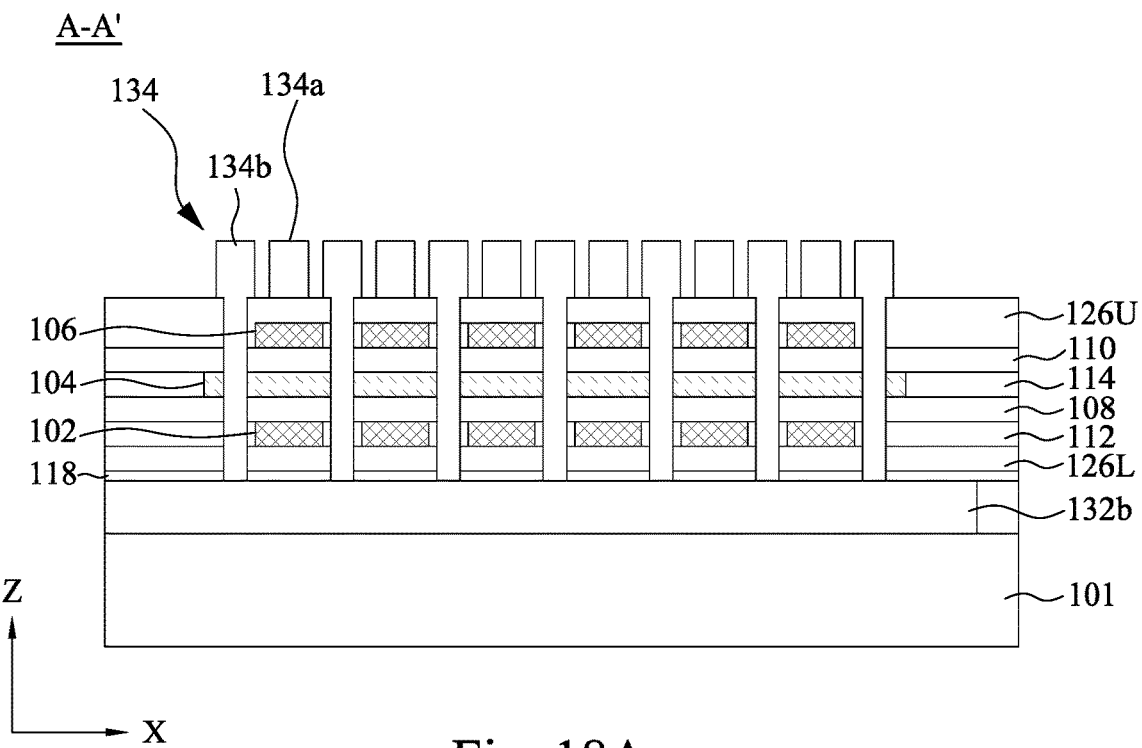
Figure 18B:
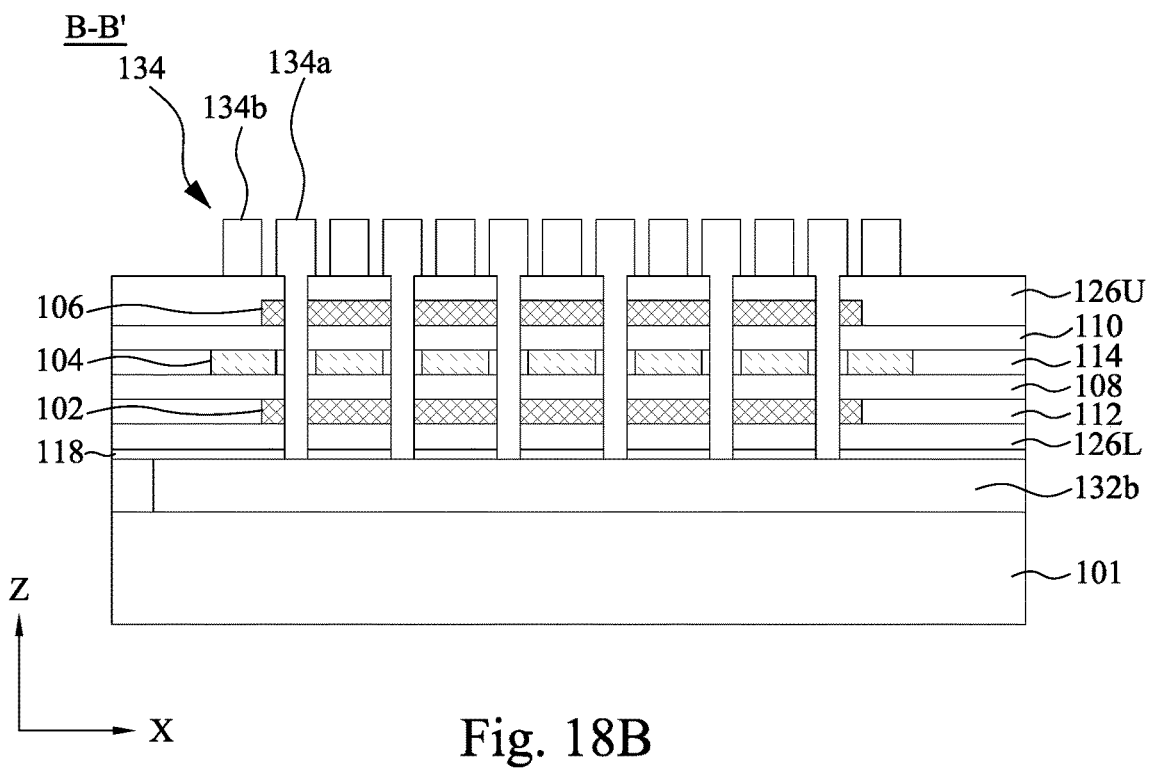

Referring back to FIG. 4, the method M1 then proceeds to block S114 where the conductive material is patterned to form the desired shape as a top electrode routing over the MIM capacitor. With reference to FIGS. 18A and 18B, in some embodiments of block S114, the conductive material 122 is patterned to form a top electrode routing 134 over the MIM capacitor 100 as the desired shape as discussed above in FIGS. 1A to 3D.

Figure 22A:
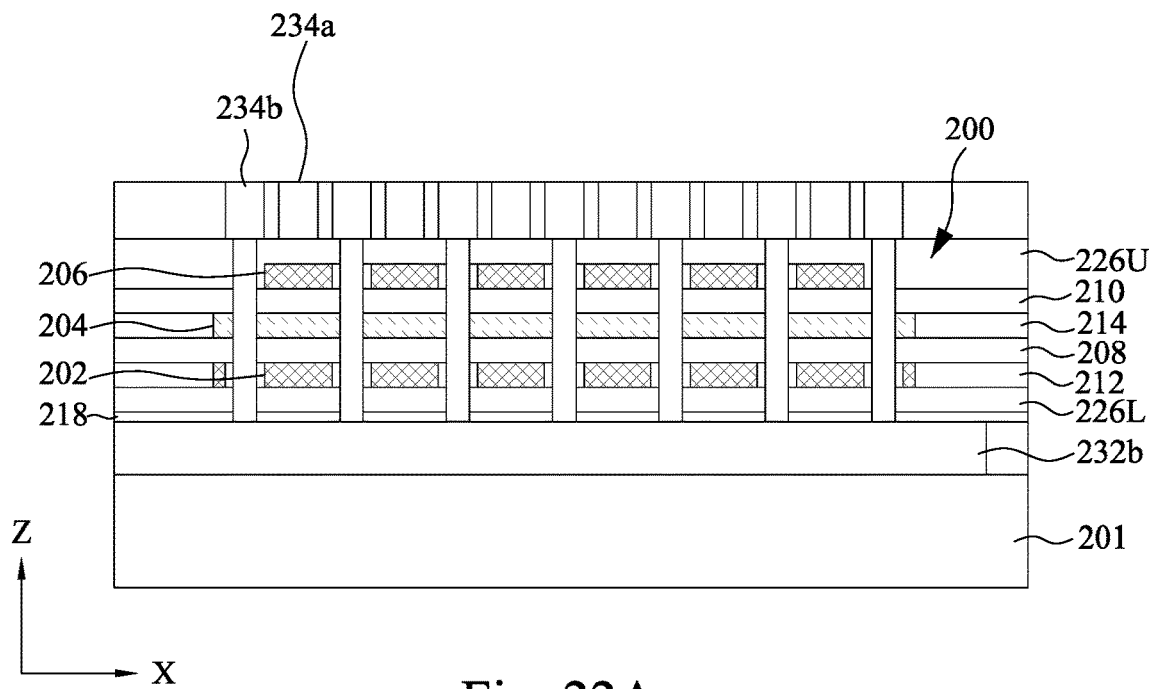
FIGS. 22A and 22B illustrate cross-sectional views of a MIM capacitor in an integrated circuit in accordance with some embodiments corresponding to the vertical plane containing line A-A' and line B-B' in FIG. 1A.
Figure 22B:
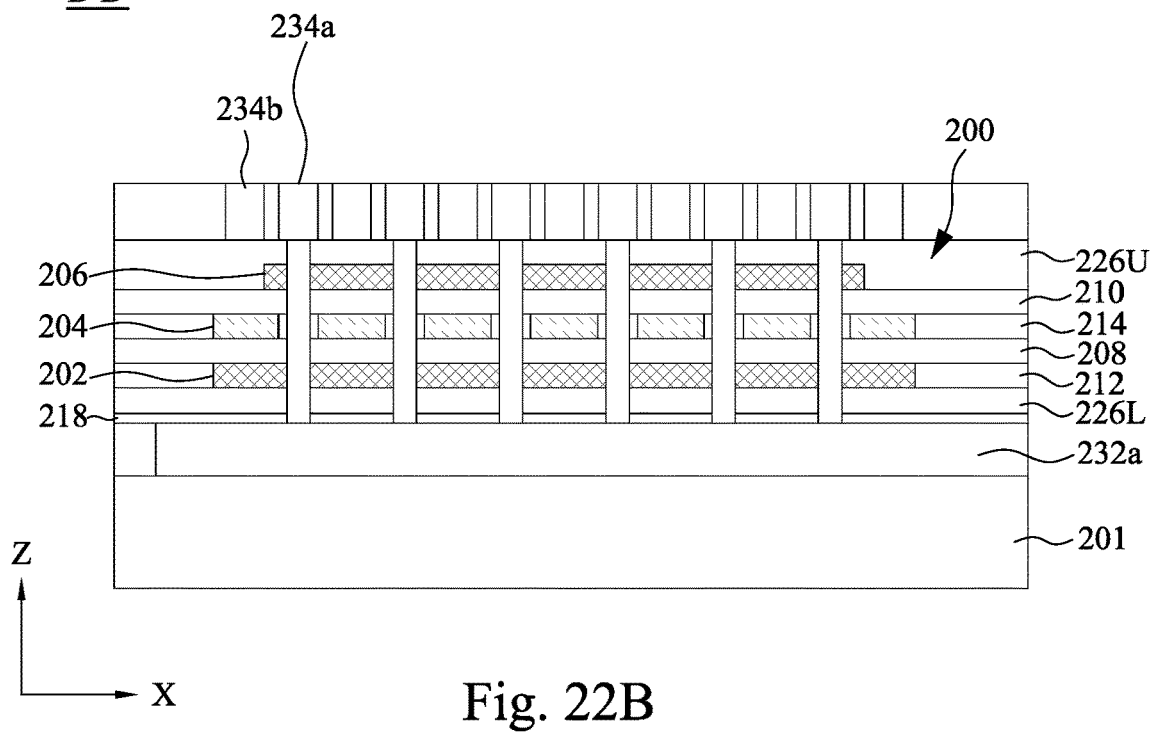

FIGS. 22A and 22B illustrate cross-sectional views of a capacitor in an integrated circuit in accordance with some embodiments corresponding to the vertical plane containing line A-A' and line B-B' in FIG. 1A. Operations for forming the integrated circuit of the present embodiment are substantially the same as the operations for forming the integrated circuit described in foregoing descriptions associated with FIGS. 1A to 3D and thus are not repeated herein for the sake of clarity. For example, materials and manufacturing processes related to a substrate 201, a bottom electrode routing 232, a MIM capacitor 200, a top electrode routing 234 may be substantially the same as those of the substrate 101, the bottom electrode routing 132, the MIM capacitor 100, the top electrode routing 134 as shown in FIGS. 1A to 3D. Therefore, reference may be made to the foregoing paragraphs for the related detailed descriptions, and are not described again herein. The difference between the present embodiment and the embodiment in FIGS. 1A to 3D is that the straight edges 206d and 206e of the bottom metal layer 202 do not set back from the straight edges 204d and 204e of the middle metal layer 204 along the X-direction as the embodiment shown in FIGS. 1A to 3D, and therefore the middle metal layer 204 has a same lateral dimension as the bottom metal layer 202 along the X-direction.

Figure 23A:
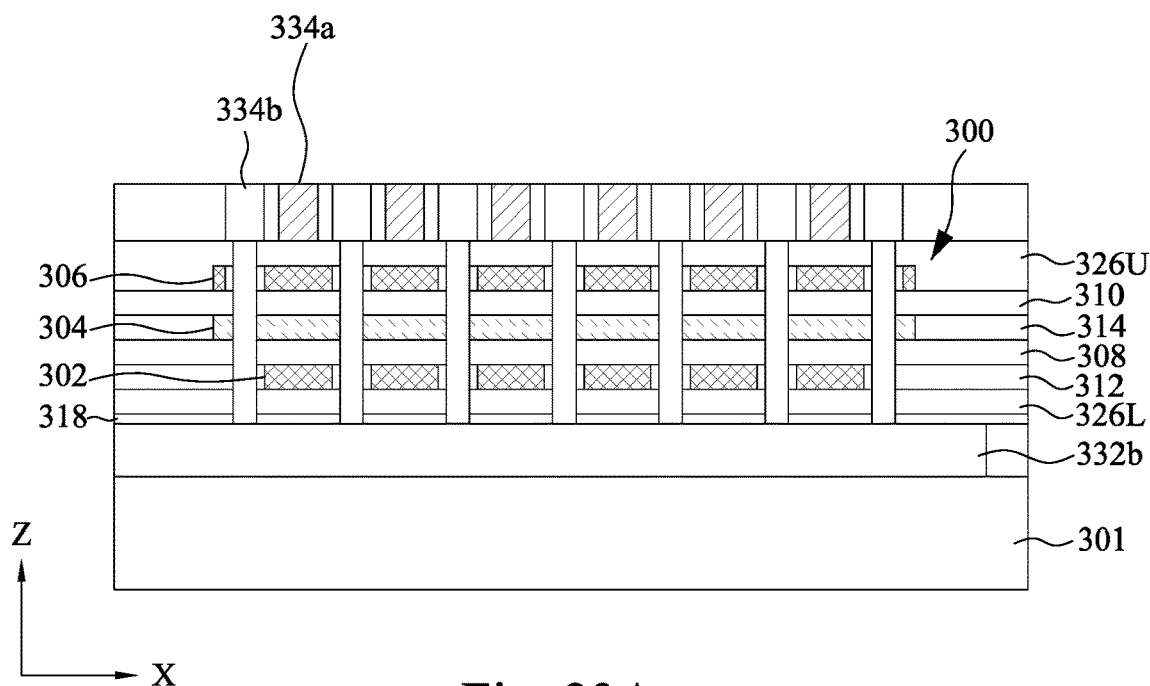
FIGS. 23A and 23B illustrate cross-sectional views of a MIM capacitor in an integrated circuit in accordance with some embodiments corresponding to the vertical plane containing line A-A' and line B-B' in FIG. 1A.
Figure 23B:
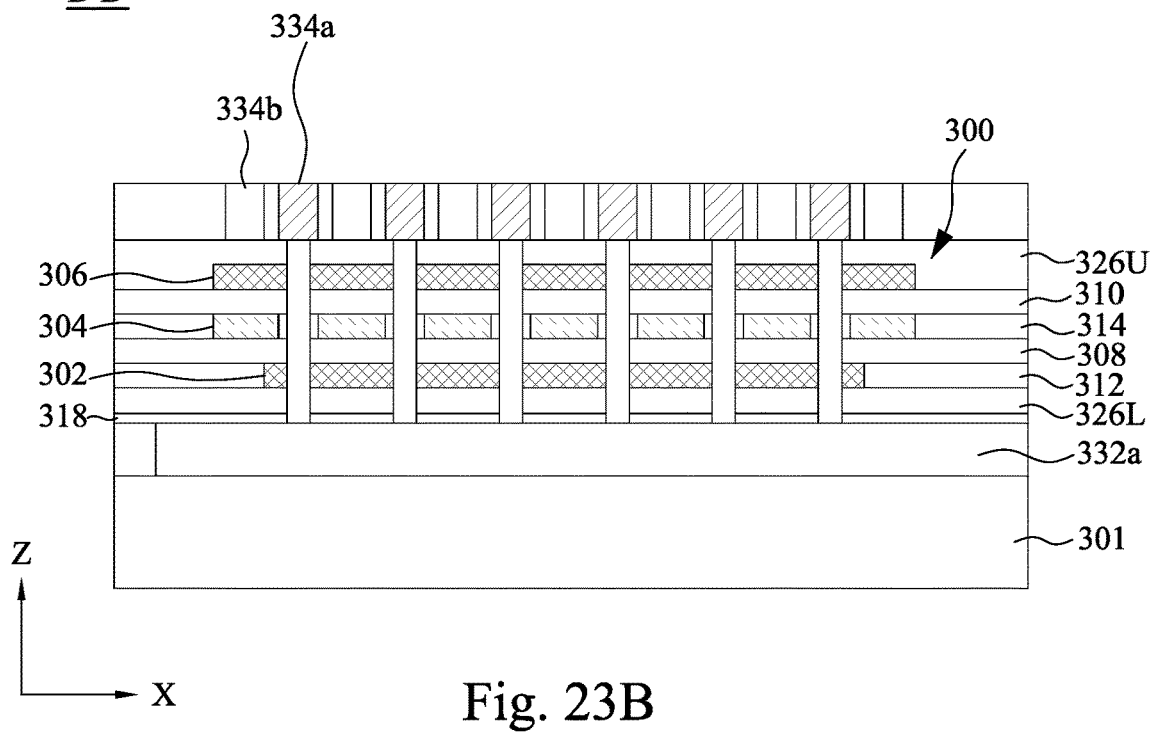

FIGS. 23A and 23B illustrate cross-sectional views of a capacitor in an integrated circuit in accordance with some embodiments corresponding to the vertical plane containing line A-A' and line B-B' in FIG. 1A. Operations for forming the integrated circuit of the present embodiment are substantially the same as the operations for forming the integrated circuit described in foregoing descriptions associated with FIGS. 1A to 3D and thus are not repeated herein for the sake of clarity. For example, materials and manufacturing processes related to a substrate 201, a bottom electrode routing 332, a MIM capacitor 300, a top electrode routing 334 may be substantially the same as those of the substrate 101, the bottom electrode routing 132, the MIM capacitor 100, the top electrode routing 134 as shown in FIGS. 1A to 3D. Therefore, reference may be made to the foregoing paragraphs for the related detailed descriptions, and are not described again herein. The difference between the present embodiment and the embodiment in FIGS. 1A to 3D is that the straight edges 306d and 306e of the top metal layer 306 do not set back from the straight edges 304d and 304e of the middle metal layer 304 along the X-direction as the embodiment shown in FIGS. 1A to 3D, and therefore the middle metal layer 304 has a same lateral dimension as the top metal layer 306 along the X-direction.

Figure 24A:
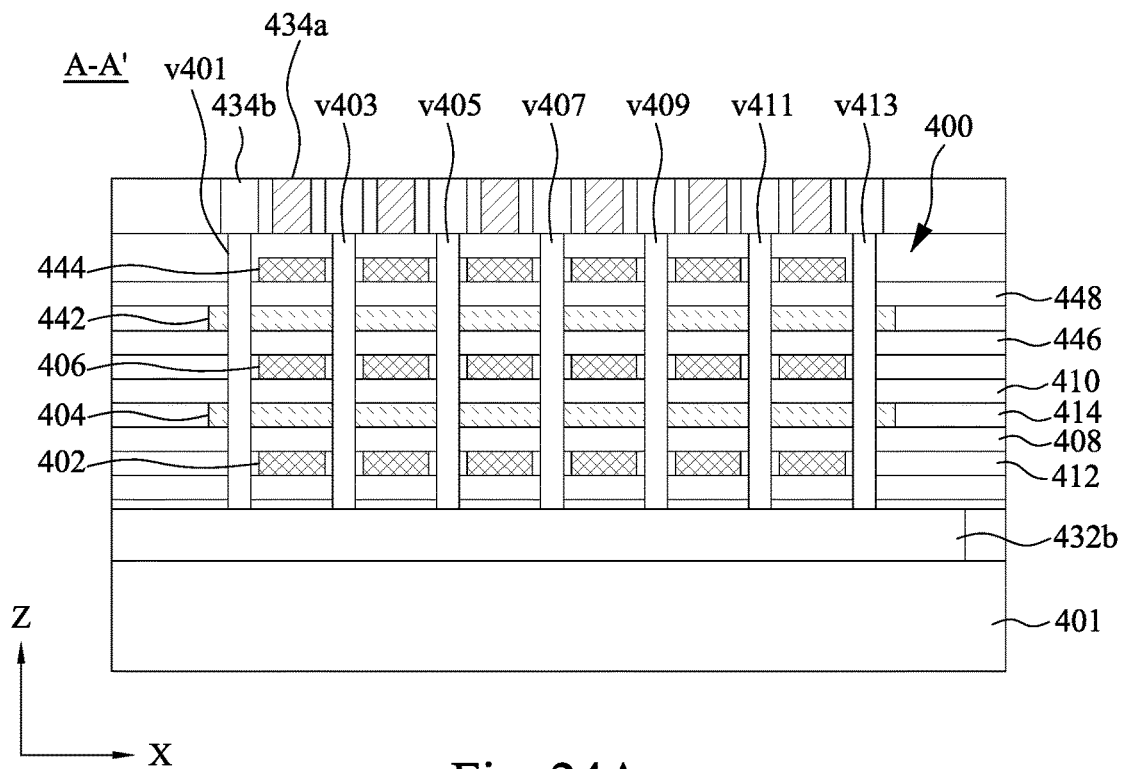
FIGS. 24A and 24B illustrate cross-sectional views of a MIM capacitor in an integrated circuit in accordance with some embodiments corresponding to the vertical plane containing line A-A' and line B-B' in FIG. 1A.
Figure 24B:
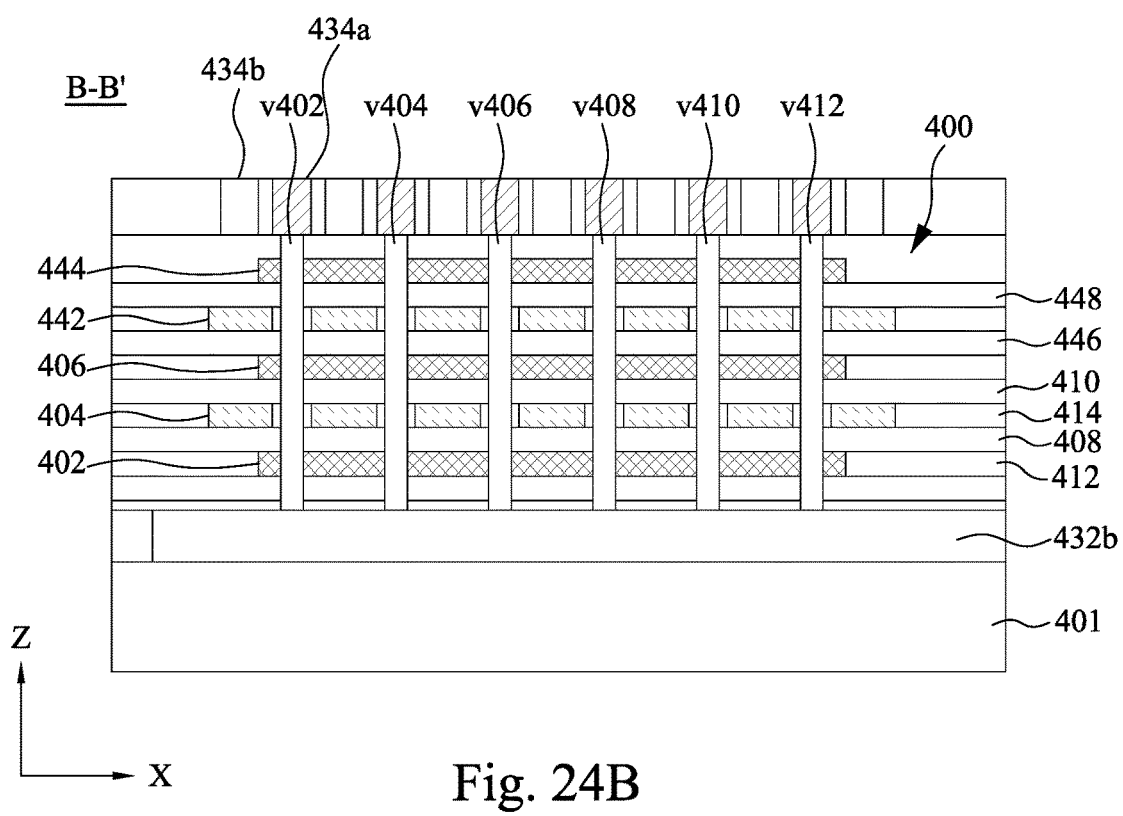

FIGS. 24A and 24B illustrate cross-sectional views of a capacitor in an integrated circuit in accordance with some embodiments corresponding to the vertical plane containing line A-A' and line B-B' in FIG. 1A. Operations for forming the integrated circuit of the present embodiment are substantially the same as the operations for forming the integrated circuit described in foregoing descriptions associated with FIGS. 1A to 3D and thus are not repeated herein for the sake of clarity. For example, materials and manufacturing processes related to a substrate 401, a bottom electrode routing 432, a MIM capacitor 400, a top electrode routing 434 may be substantially the same as those of the substrate 101, the bottom electrode routing 132, the MIM capacitor 100, the top electrode routing 134 as shown in FIGS. 1A to 3D. Therefore, reference may be made to the foregoing paragraphs for the related detailed descriptions, and are not described again herein. The difference between the present embodiment and the embodiment in FIGS. 1A to 3D is that the MIM capacitor 400 further includes additional metal layers.

In FIGS. 24A and 24B, the capacitor 400 further includes metal layers 442 and 444. Each metal layers 442 and 444 is in the form of the plate. A capacitor dielectric layer 446 interposes the top metal layer 406 and the metal layer 442, and a capacitor dielectric layer 448 interposes the metal layers 442 and 444. The metal layer 442 is maintained at the second voltage potential (in operation) as the middle metal layer 404 and the metal layer 444 is maintained at the first voltage potential (in operation) as the top and bottom metal layer 406 and 402. Thus, capacitance is formed between each of the top metal layer 406 and metal layer 442 (e.g., at the region of their overlap), and between the metal layers 442 and 444 (e.g., at the region of their overlap).

In FIG. 24A, the metal layer 442 of the MIM capacitor 400 is connected to the electrode 434b of the top electrode routing 434 and the electrode 432b of the bottom electrode routing 432 through the metal vias v401, v403, v405, v407, v409, v411, and v413 and spaced apart from the top and bottom metal layers 406 and 402 and the metal layer 444. The electrode 434b of the top electrode routing 434 and the electrode 432b of the bottom electrode routing 432 may be use to provide the second voltage potential to the middle metal layer 404 and the metal layer 442 of the MIM capacitor 400. In FIG. 24B, the metal layer 444 of the MIM capacitor 400 is connected to the electrode 434a of the top electrode routing 434 and the electrode 432a of the bottom electrode routing 432 through metal vias v402, v404, v406, v408, v410, and v412 and spaced apart from the middle metal layer 404 and the metal layer 442. The electrode 434a of the top electrode routing 434 and the second electrode 432a of the bottom electrode routing 432 may be use to provide the first voltage potential to the metal layer 444, the top metal layer 406, and the bottom metal layer 402 of the MIM capacitor 400.

In some embodiments, the metal layer 442 may be formed to have the same pattern as the middle metal layer 404, such that the metal layer 442 can be formed with the same mask as the middle metal layer 404 and without additional mask and hence additional cost. In some embodiments, the metal layer 444 may be formed to have the same pattern as the top and bottom metal layers 406 and 402, such that the metal layer 444 can be formed with the same mask as the top and bottom metal layers 406 and 402 and without additional mask and hence additional cost.

Figure 25A:
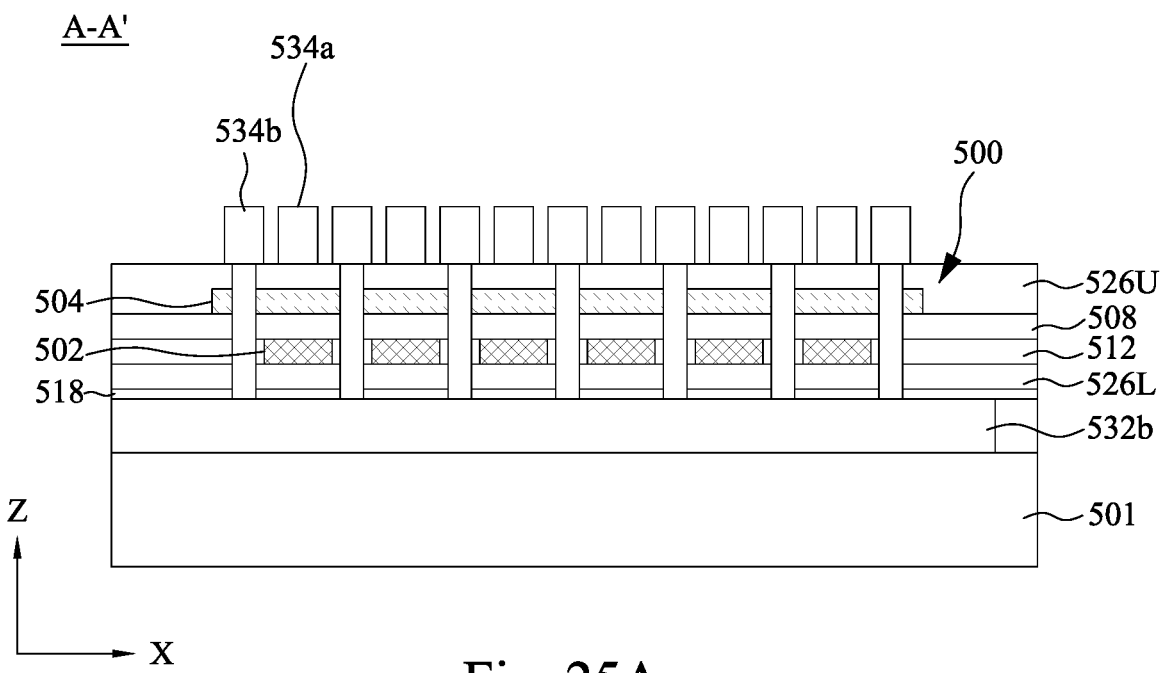
FIGS. 25A and 25B illustrate cross-sectional views of a MIM capacitor in an integrated circuit in accordance with some embodiments corresponding to the vertical plane containing line A-A' and line B-B' in FIG. 1A.
Figure 25B:
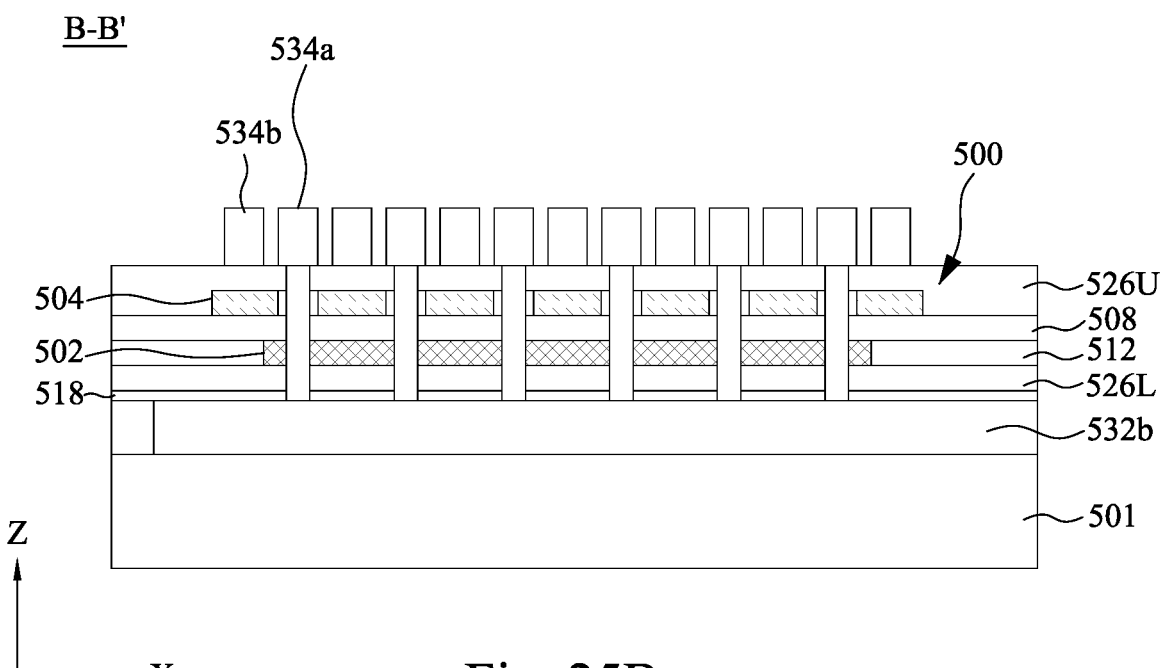

FIGS. 25A and 25B illustrate cross-sectional views of a capacitor in an integrated circuit in accordance with some embodiments corresponding to the vertical plane containing line A-A' and line B-B' in FIG. 1A. Operations for forming the integrated circuit of the present embodiment are substantially the same as the operations for forming the integrated circuit described in foregoing descriptions associated with FIGS. 1A to 3D and thus are not repeated herein for the sake of clarity. For example, materials and manufacturing processes related to a substrate 501, a bottom electrode routing 532, a MIM capacitor 500, a top electrode routing 534 may be substantially the same as those of the substrate 101, the bottom electrode routing 132, the MIM capacitor 100, the top electrode routing 134 as shown in FIGS. 1A to 3D. Therefore, reference may be made to the foregoing paragraphs for the related detailed descriptions, and are not described again herein. The difference between the present embodiment and the embodiment in FIGS. 1A to 3D is that the MIM capacitor 500 is omitted the top metal layer 106 as shown in FIGS. 1A to 3D.

Figure 26A:
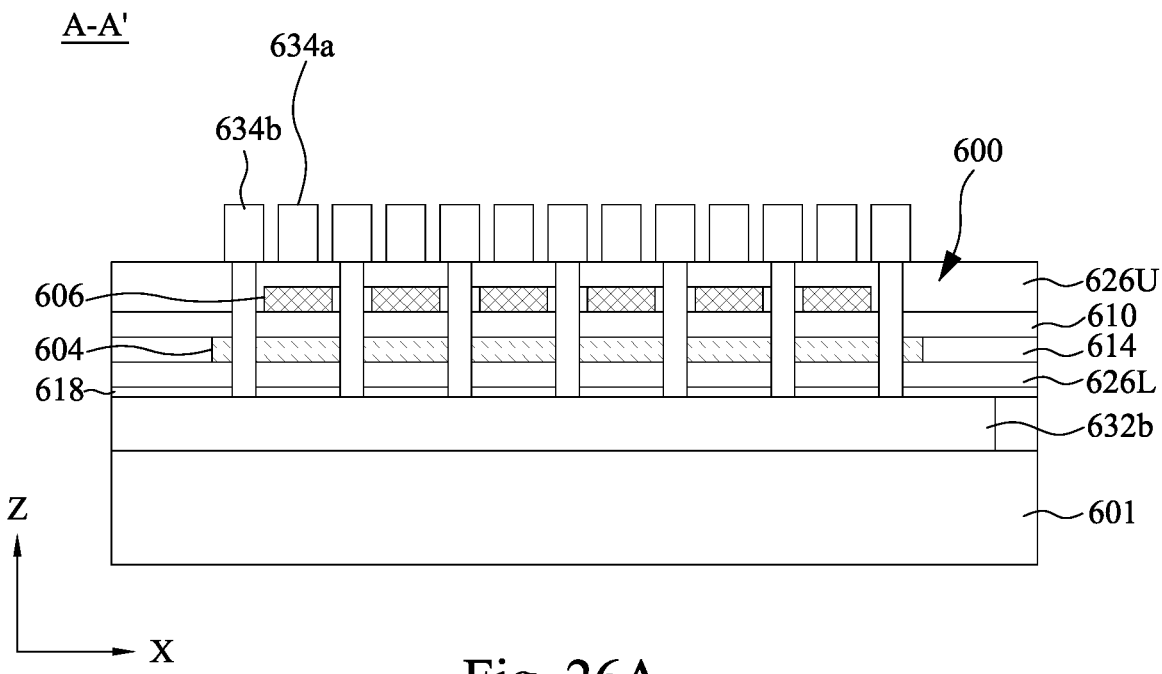
FIGS. 26A and 26B illustrate cross-sectional views of a MIM capacitor in an integrated circuit in accordance with some embodiments corresponding to the vertical plane containing line A-A' and line B-B' in FIG. 1A.
Figure 26B:
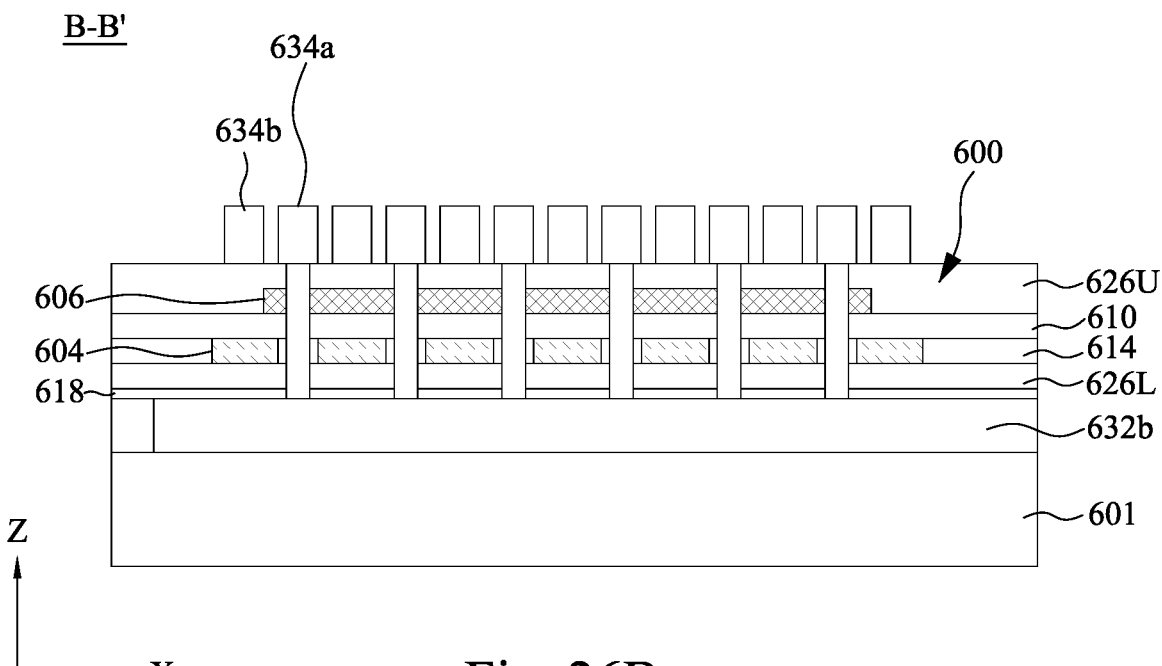

FIGS. 26A and 26B illustrate cross-sectional views of a capacitor in an integrated circuit in accordance with some embodiments corresponding to the vertical plane containing line A-A' and line B-B' in FIG. 1A. Operations for forming the integrated circuit of the present embodiment are substantially the same as the operations for forming the integrated circuit described in foregoing descriptions associated with FIGS. 1A to 3D and thus are not repeated herein for the sake of clarity. For example, materials and manufacturing processes related to a substrate 601, a bottom electrode routing 632, a MIM capacitor 600, a top electrode routing 634 may be substantially the same as those of the substrate 101, the bottom electrode routing 132, the MIM capacitor 100, the top electrode routing 134 as shown in FIGS. 1A to 3D. Therefore, reference may be made to the foregoing paragraphs for the related detailed descriptions, and are not described again herein. The difference between the present embodiment and the embodiment in FIGS. 1A to 3D is that the MIM capacitor 600 is omitted the bottom metal layer 102 as shown in FIGS. 1A to 3D.

Figure 27A:
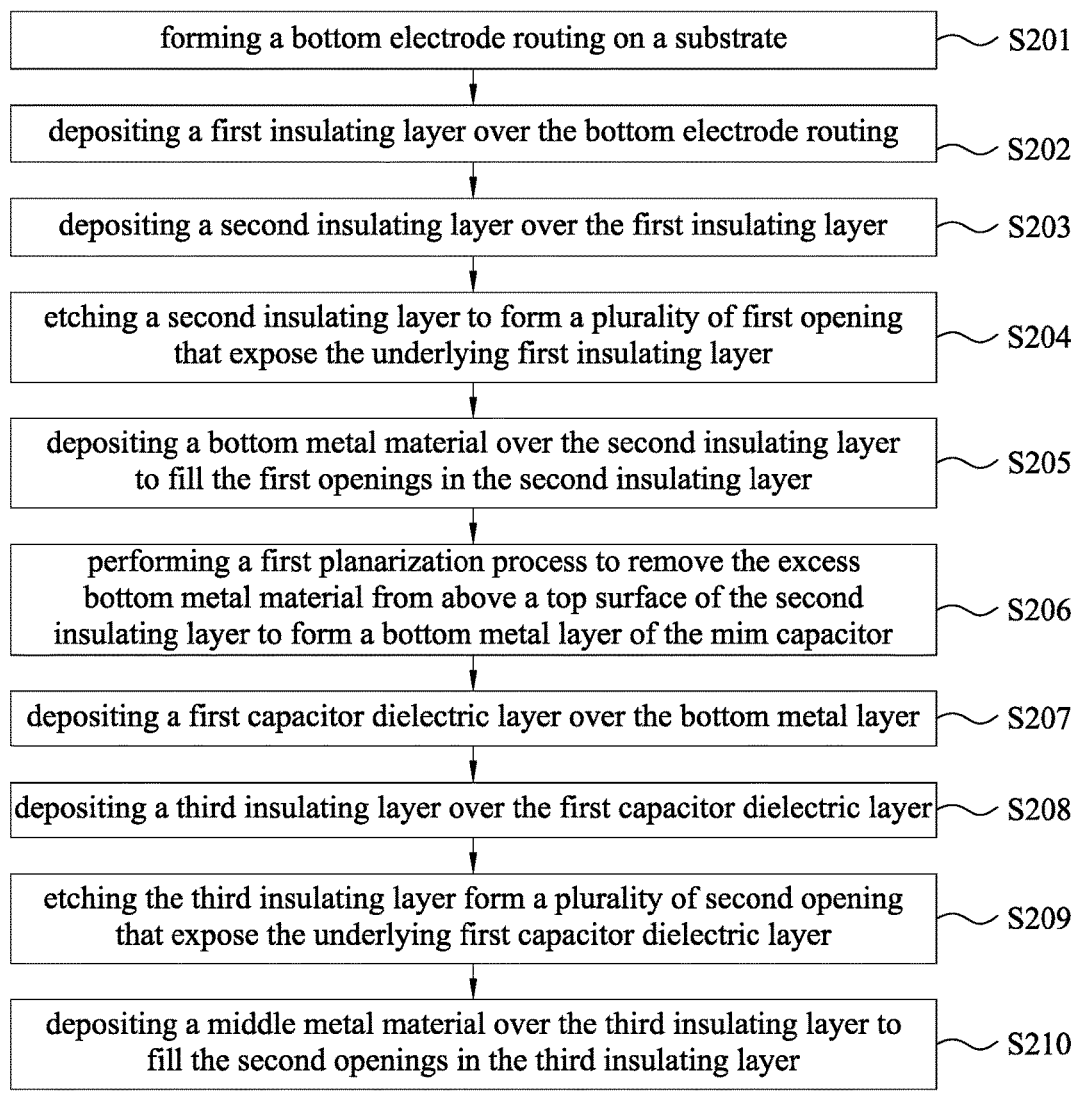
FIGS. 27A and 27B are a method M2 of manufacturing an integrated circuit including a MIM capacitor in accordance with some embodiments of the present disclosure.
Figure 27B:
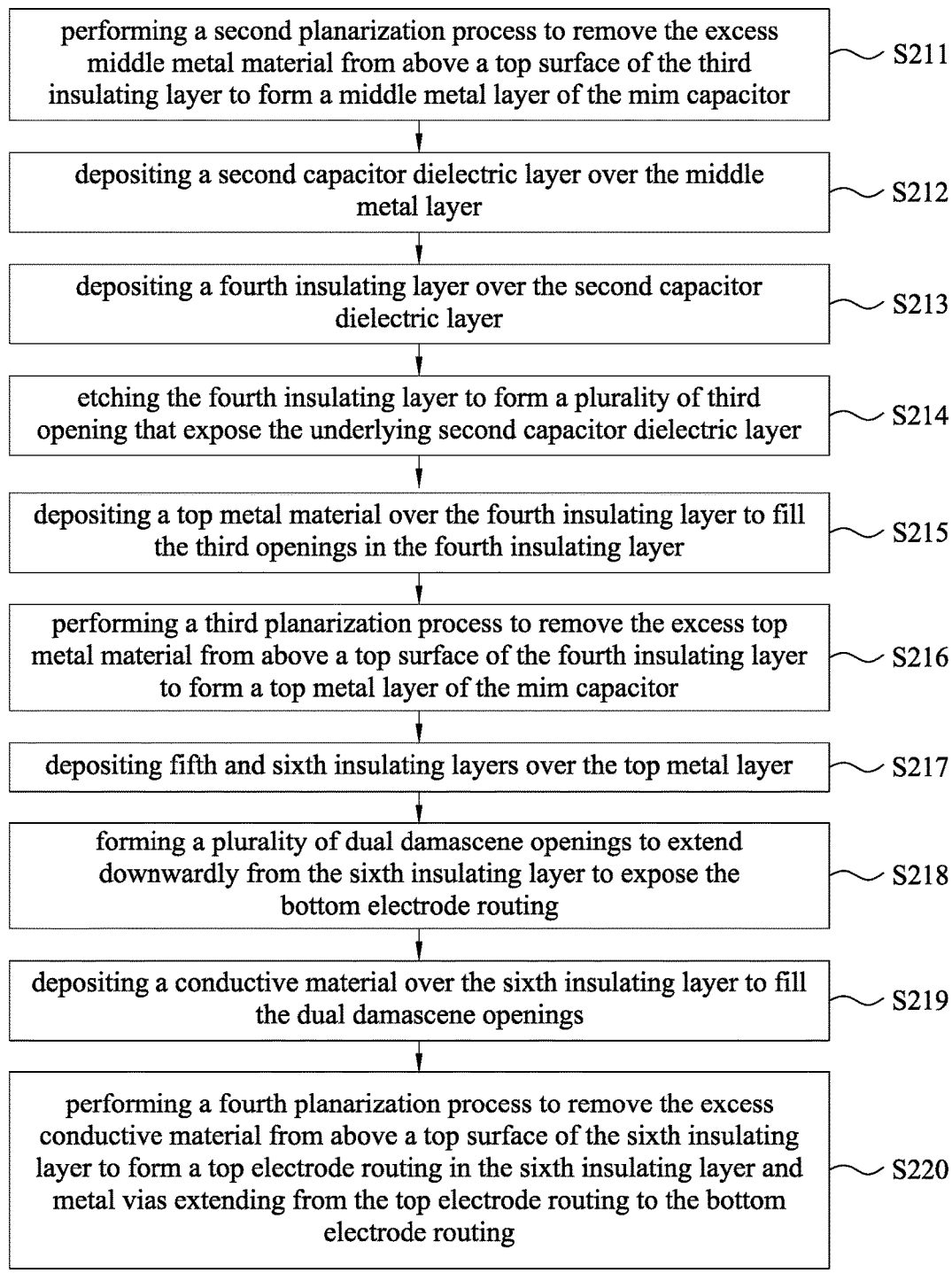

Referring now to FIGS. 27A and 27B, illustrated is a flowchart of an exemplary method M2 for fabrication of an integrated circuit including a capacitor in accordance with some embodiments. Blocks S201-S202 of method M2 for forming the integrated circuit structure including the capacitor prior to FIGS. 28A and 28B of the present embodiment are substantially the same as the block S101-S102 of method M1 for forming the integrated circuit structure including the capacitor in foregoing descriptions associated with FIGS. 5A to 6B and thus are not repeated herein for the sake of clarity. For example, materials and manufacturing processes related to a substrate 701, electrodes 732a and 732b, an etch stop layer 718, and an insulating layer 726L may be substantially the same as those of the substrate 101, the electrodes 132a and 132b, the etch stop layer 118, and the insulating layer 126L as shown in FIGS. 5A to 6B. Therefore, reference may be made to the foregoing paragraphs for the related detailed descriptions, and are not described again herein.

Figure 28A:
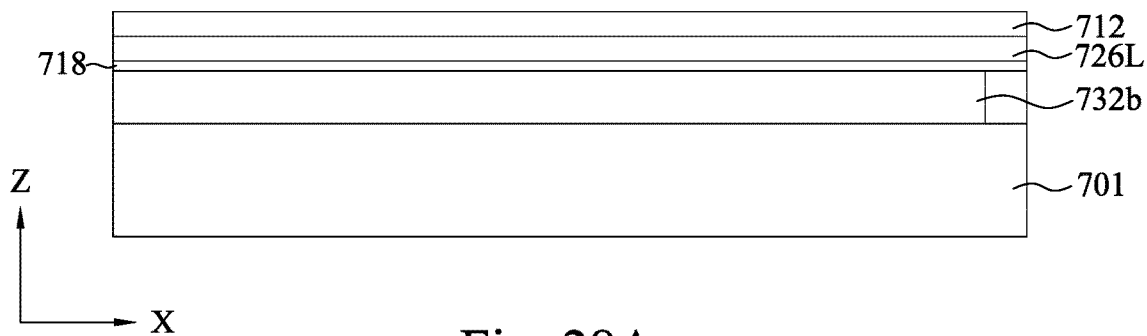
FIGS. 28A to 42B illustrate cross-sectional views of intermediate stages in the formation of a MIM capacitor in an integrated circuit in accordance with some embodiments of the present disclosure.
Figure 28B:
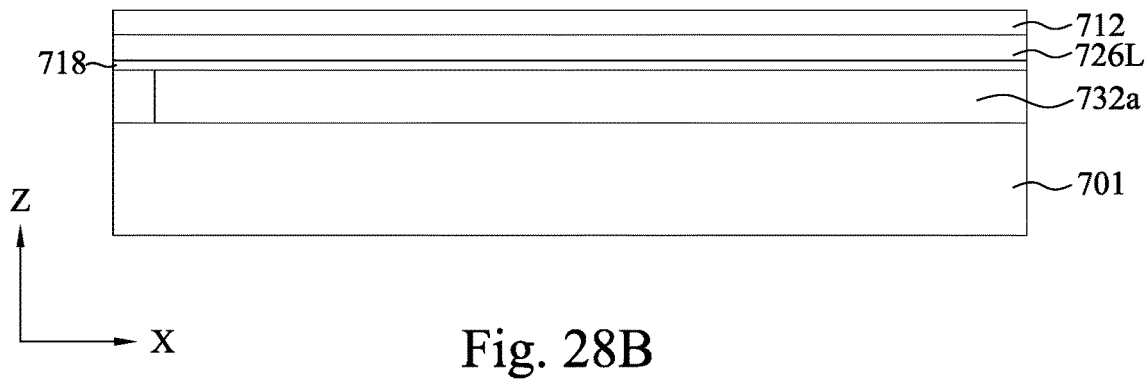

Referring back to FIG. 27A, the method M2 then proceeds to block S203 where a second insulating layer is deposited over the first insulating layer. With reference to FIGS. 28A and 28B, in some embodiments of block S203, an insulating layer 712 is deposited over the insulating layer 726L and may be made of a material different than the underlying insulating layer 726L. In some embodiments, the material and manufacturing process related to the insulating layer 712 may be substantially the same as that of the insulating layer 112 as shown in FIGS. 9A and 9B. Therefore, reference may be made to the foregoing paragraphs for the related detailed descriptions, and are not described again herein.

Figure 29A:
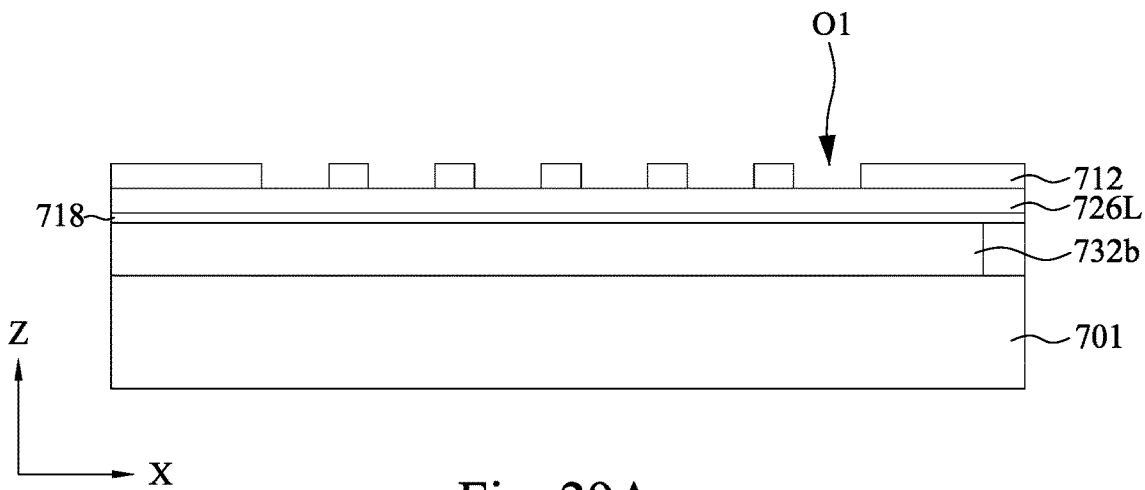
Figure 29B:
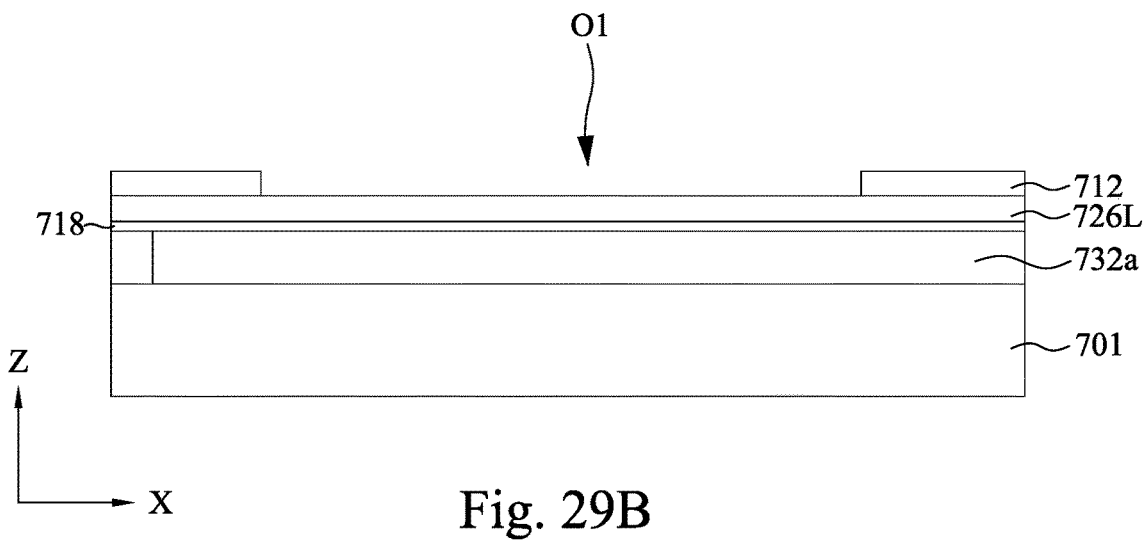

Referring back to FIG. 27A, the method M2 then proceeds to block S204 where the second insulating layer is etched to form a plurality of first opening that expose the underlying first insulating layer. With reference to FIGS. 29A and 29B, in some embodiments of block S204, the insulating layer 712 is etched to form openings O1 that expose the underlying insulating layer 726L, wherein the openings O1 may allow for forming the subsequent bottom metal layer 702 of the MIM capacitor as shown in 31A and 31B. The openings O1 are formed by using a photolithography and a first etching process. For example, a first patterned mask (not shown) may be formed over the insulating layer 712 and used to protect the insulating layer 712 underlying thereof from the first etching process. Subsequently, the first etching process is performed on the insulating layer 712 through the first patterned mask and stops until the underlying insulating layer 726L is reached. The first etching process may include a dry etch, a wet etch, a reactive ion etch (RIE), another suitable etching process, or combinations thereof. Accordingly, the underlying insulating layer 726L is exposed in the openings O1. The first patterned mask subsequently stripped, such as by wet stripping or plasma ashing.

Figure 30A:
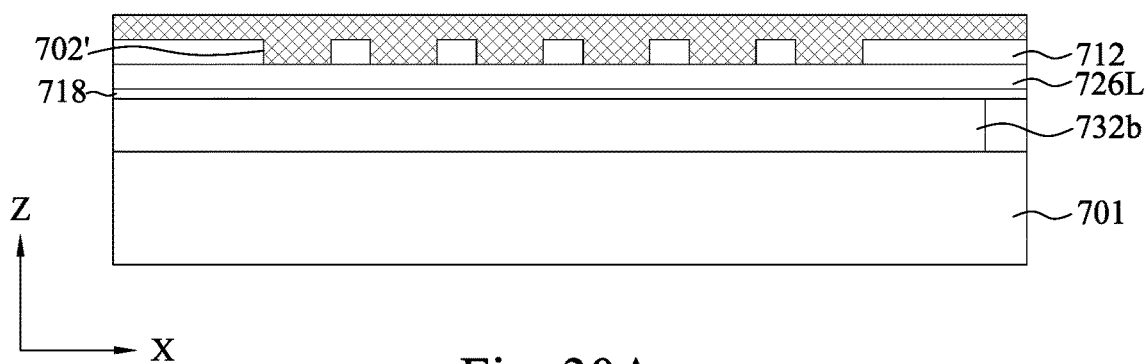
Figure 30B:
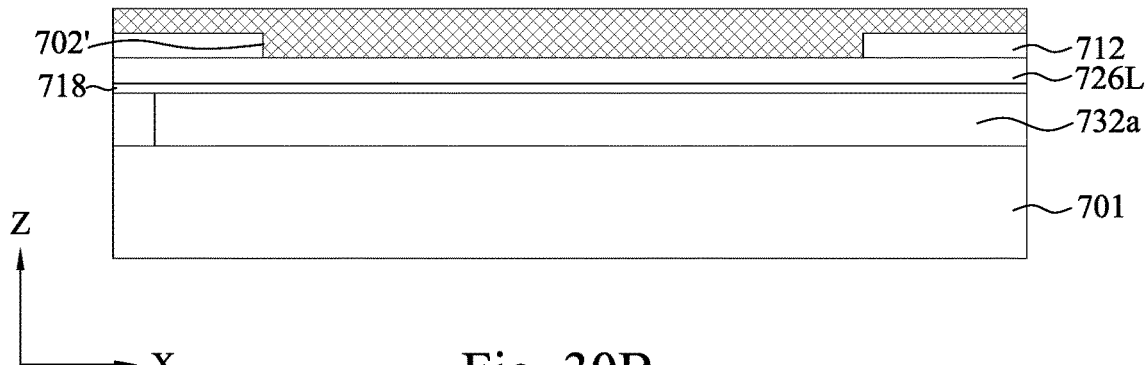

Referring back to FIG. 27A, the method M2 then proceeds to block S205 where a bottom metal material is deposited over the second insulating layer to fill the first openings in the second insulating layer. With reference to FIGS. 30A and 30B, in some embodiments of block S205, a bottom metal material 702' is deposited over the insulating layer 712 to fill the openings O1 in the insulating layer 712. In some embodiments, the material and manufacturing process related to the bottom metal material 702' may be substantially the same as those of the bottom metal layer 102' as shown in FIGS. 7A and 7B. Therefore, reference may be made to the foregoing paragraphs for the related detailed descriptions, and are not described again herein.

Figure 31A:
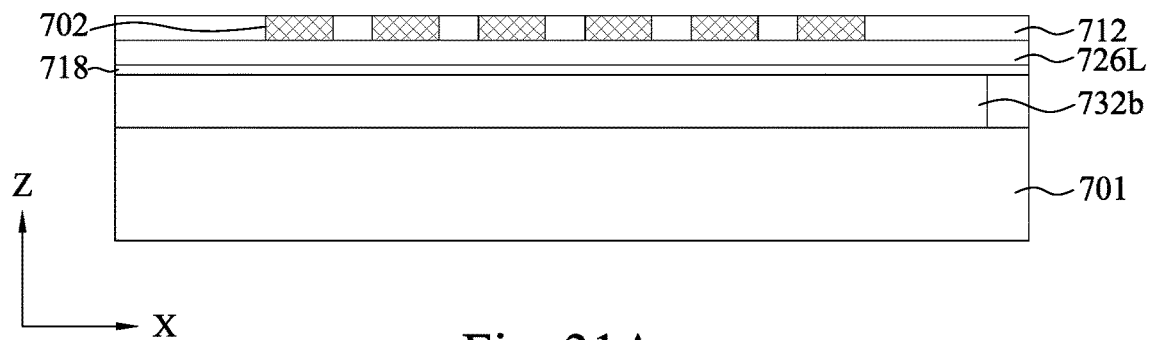
Figure 31B:
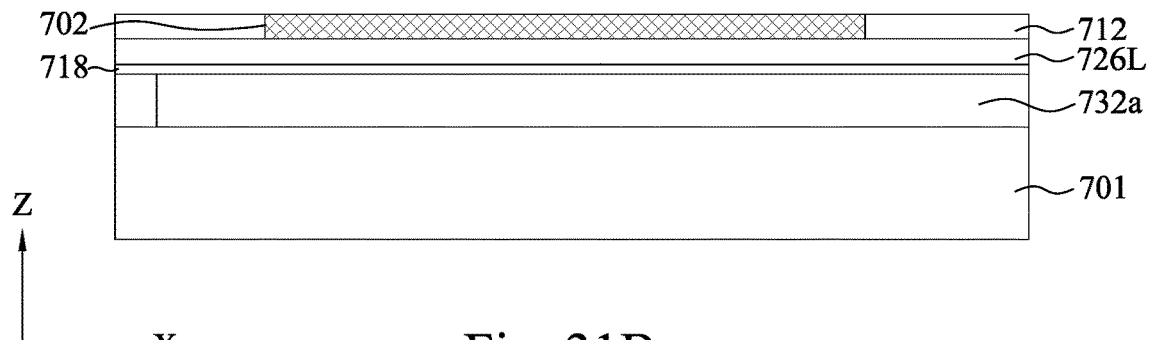

Referring back to FIG. 27A, the method M2 then proceeds to block S206 where a first planarization process is performed to remove the excess bottom metal material from above a top surface of the second insulating layer to form a bottom metal layer of the MIM capacitor. With reference to FIGS. 31A and 31B, in some embodiments of block S206, a chemical mechanical polish (CMP) process may be used to remove the excess bottom metal material 702' from above a top surface of the insulating layer 712. The remaining conductive structures fill the openings O1 (see FIGS. 29A and 29B) in the insulating layer 712 and serve as the bottom metal layer 702 of the MIM capacitor.

Figure 32A:
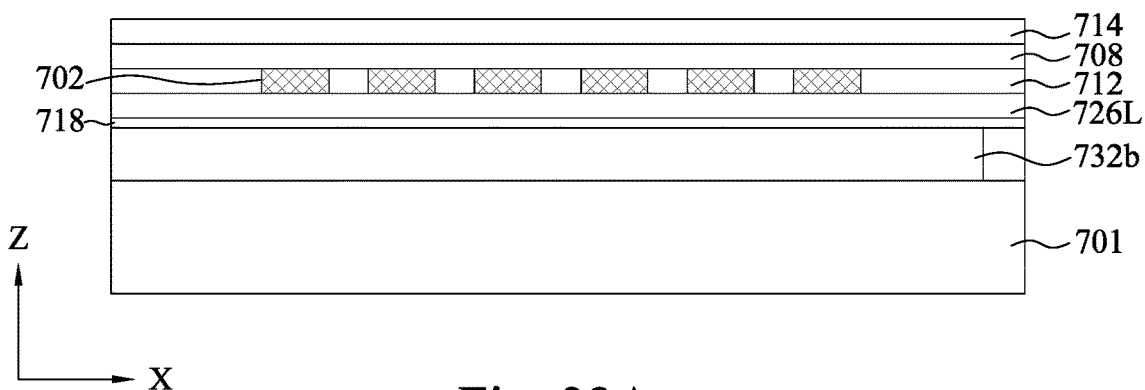
Figure 32B:
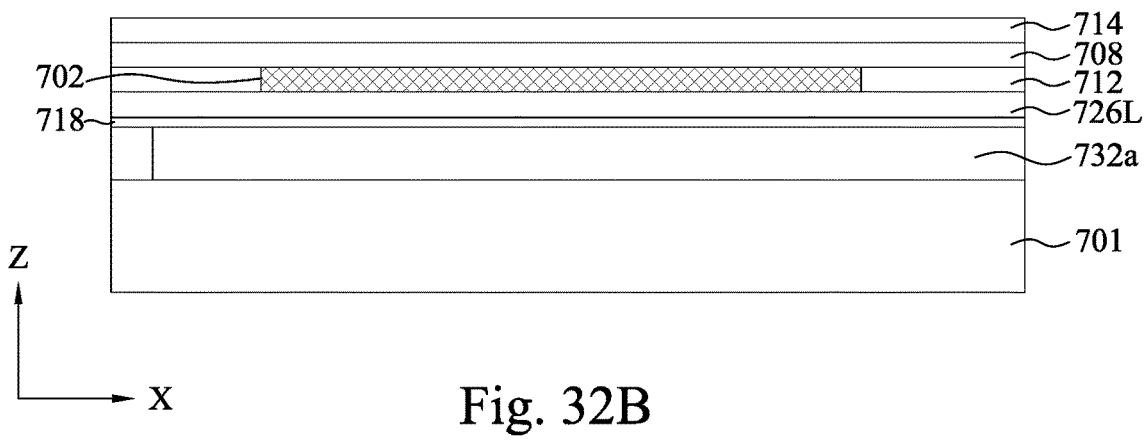

Referring back to FIG. 27A, the method M2 then proceeds to block S207 where a first capacitor dielectric layer is then deposited over the bottom metal layer and block S208 where a third insulating layer is deposited over the first capacitor dielectric layer. With reference to FIGS. 32A and 32B, in some embodiments of blocks S207 and S208, the capacitor dielectric layer 708 is deposited over the bottom metal layer 702. Subsequently, the insulating layer 714 is deposited over the capacitor dielectric layer 708. In some embodiments, the insulating layer 714 may have a material different than the capacitor dielectric layer 708. In some embodiments, the materials and manufacturing processes related to the capacitor dielectric layer 708 and the insulating layer 714 may be substantially the same as those of the capacitor dielectric layer 108 and the insulating layer 114 as shown in FIGS. 9A, 9B, 12A, and 12B. Therefore, reference may be made to the foregoing paragraphs for the related detailed descriptions, and are not described again herein.

Figure 33A:
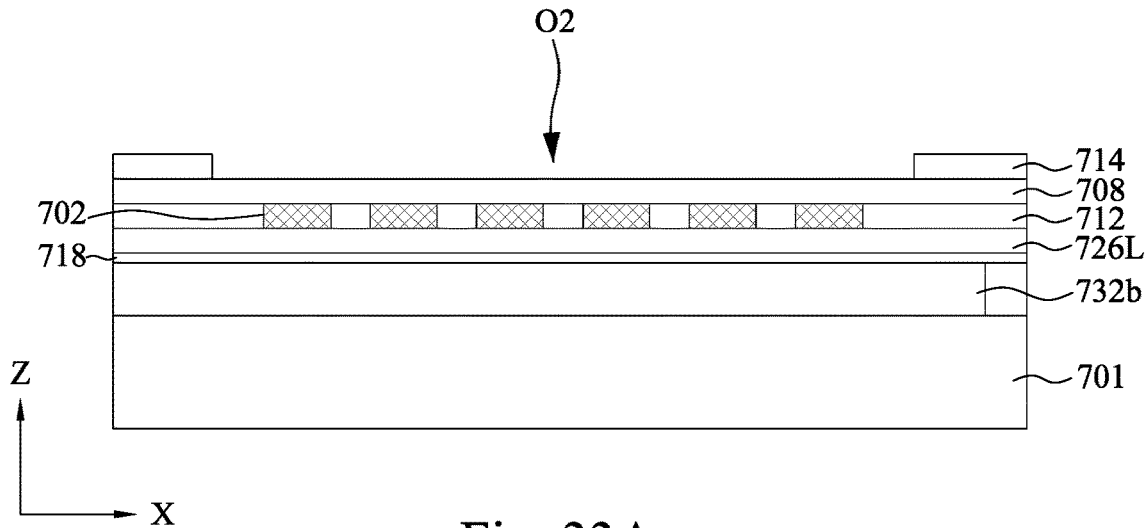
Figure 33B:
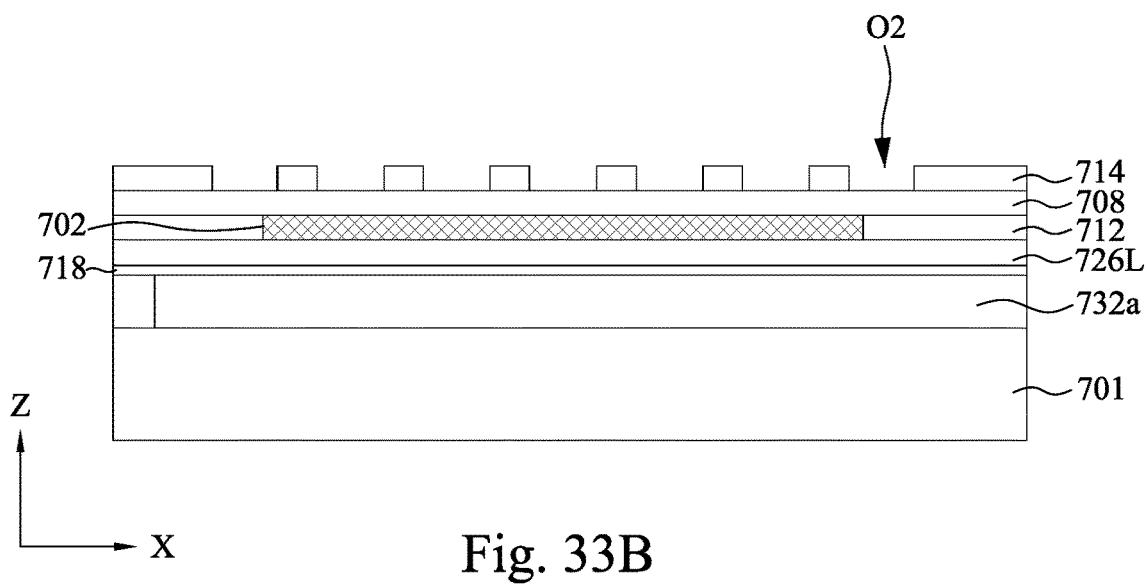

Referring back to FIG. 27A, the method M2 then proceeds to block S209 where the third insulating layer is etched to form a plurality of second opening that expose the underlying first capacitor dielectric layer. With reference to FIGS. 33A and 33B, in some embodiments of block S209, the insulating layer 714 is etched to form openings O2 that expose the underlying capacitor dielectric layer 708, wherein the openings O2 may allow for forming the subsequent middle metal layer 704 of the MIM capacitor as shown in 35A and 35B. The openings O2 are formed by using a photolithography and a second etching process. For example, a second patterned mask (not shown) may be formed over the insulating layer 714 and used to protect the insulating layer 714 underlying thereof from the second etching process. Subsequently, the second etching process is performed on the insulating layer 714 through the second patterned mask and stops until the underlying capacitor dielectric layer 708 is reached. The second etching process may include a dry etch, a wet etch, a reactive ion etch (RIE), another suitable etching process, or combinations thereof. Accordingly, the underlying capacitor dielectric layer 708 is exposed in the openings O2. The second patterned mask subsequently stripped, such as by wet stripping or plasma ashing.

Figure 34A:
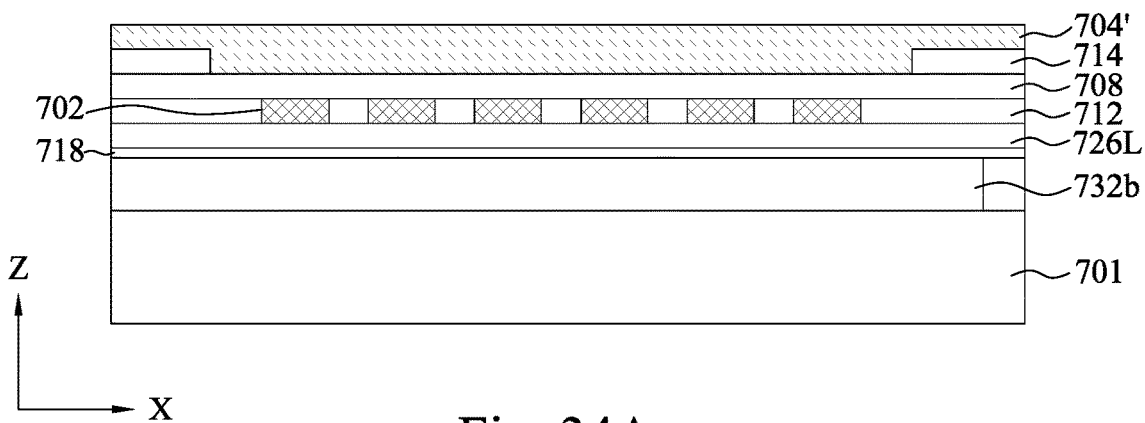
Figure 34B:
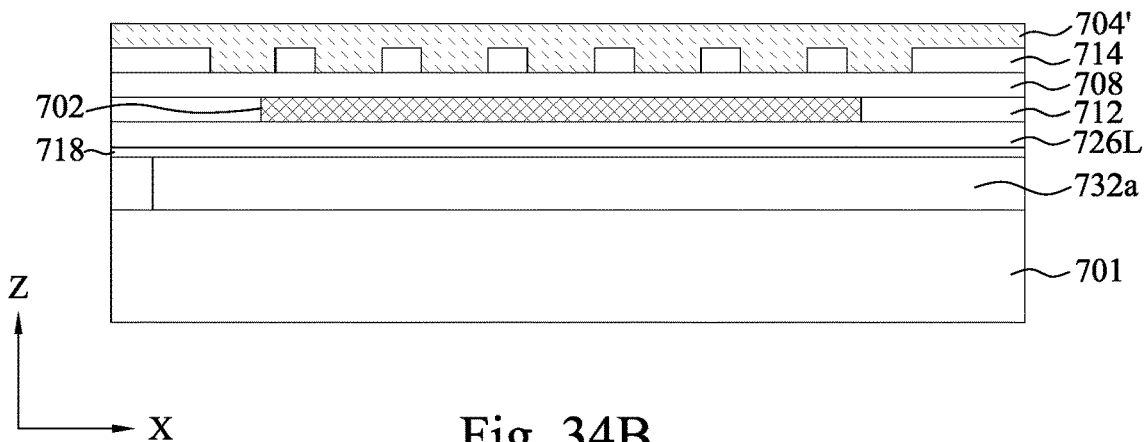

Referring back to FIG. 27A, the method M2 then proceeds to block S210 where a middle metal material is deposited over the third insulating layer to fill the second openings in the third insulating layer. With reference to FIGS. 34A and 34B, in some embodiments of block S210, a middle metal material 704' is deposited over the insulating layer 714 to fill the openings O2 in the insulating layer 714. In some embodiments, the material and manufacturing process related to the middle metal material 704' may be substantially the same as those of the middle metal layer 104 as shown in FIGS. 10A and 10B. Therefore, reference may be made to the foregoing paragraphs for the related detailed descriptions, and are not described again herein.

Figure 35A:
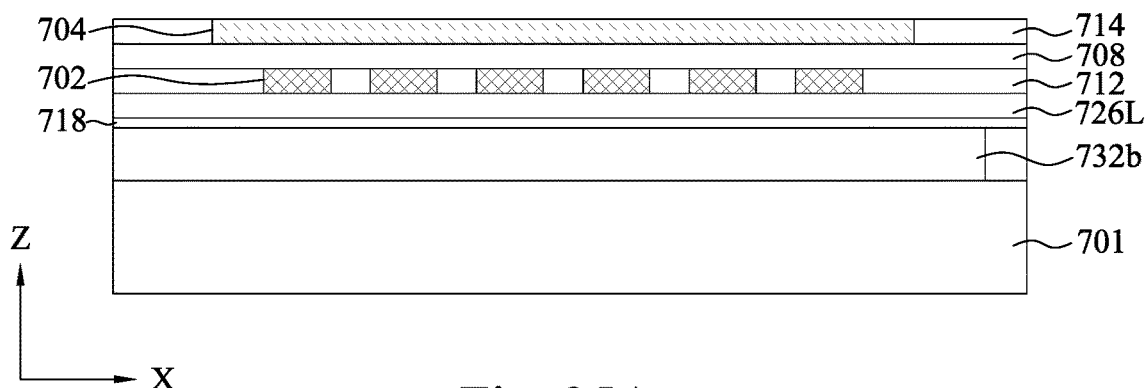
Figure 35B:
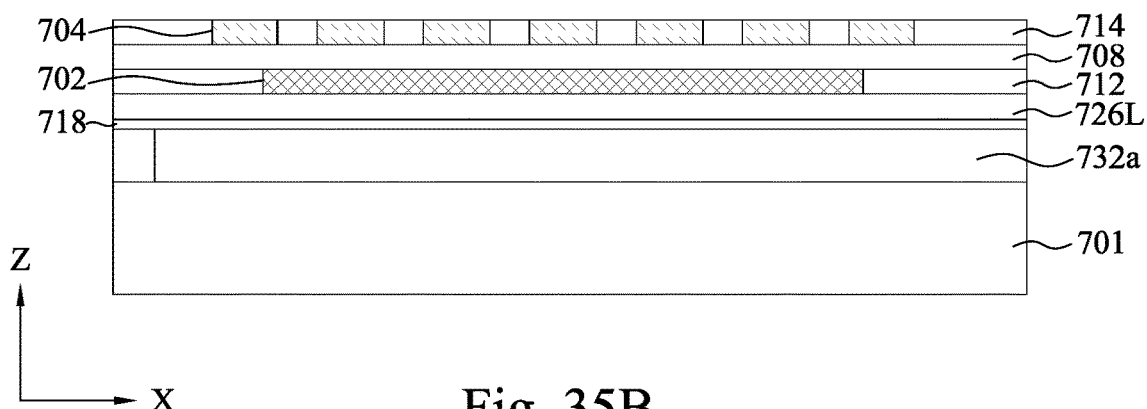

Referring back to FIG. 27A, the method M2 then proceeds to block S211 where a second planarization process is performed to remove the excess middle metal material from above a top surface of the third insulating layer to form a middle metal layer of the MIM capacitor. With reference to FIGS. 35A and 35B, in some embodiments of block S211, a chemical mechanical polish (CMP) process may be used to remove the excess middle metal material 704' from above a top surface of the insulating layer 714. The remaining conductive structures fill the openings O2 (see FIGS. 33A and 33B) in the insulating layer 714 and serve as the middle metal layer 704 of the MIM capacitor.

Figure 36A:
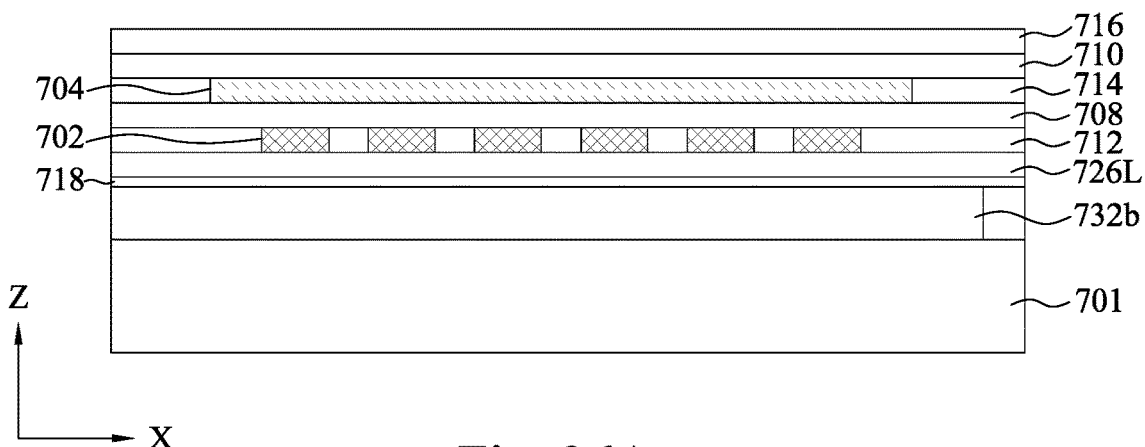
Figure 36B:
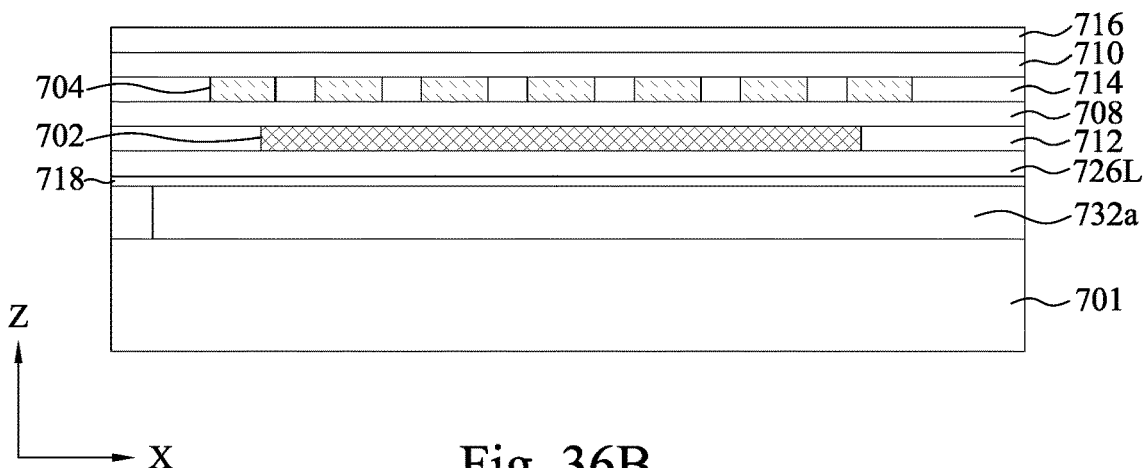

Referring back to FIG. 27A, the method M2 then proceeds to block S212 where a second capacitor dielectric layer is then deposited over the middle metal layer and S213 where a fourth insulating layer is deposited over the second capacitor dielectric layer. With reference to FIGS. 36A and 36B, in some embodiments of blocks S212 and S213, the capacitor dielectric layer 710 is deposited over the middle metal layer 704. Subsequently, the insulating layer 716 is deposited over the capacitor dielectric layer 710. In some embodiments, the insulating layer 716 may have a material different than the capacitor dielectric layer 710. In some embodiments, the materials and manufacturing processes related to the capacitor dielectric layer 710 and the insulating layer 716 may be substantially the same as those of the capacitor dielectric layer 110 and the insulating layer 126U as shown in FIGS. 12A, 12B, 15A, and 15B. Therefore, reference may be made to the foregoing paragraphs for the related detailed descriptions, and are not described again herein.

Figure 37A:
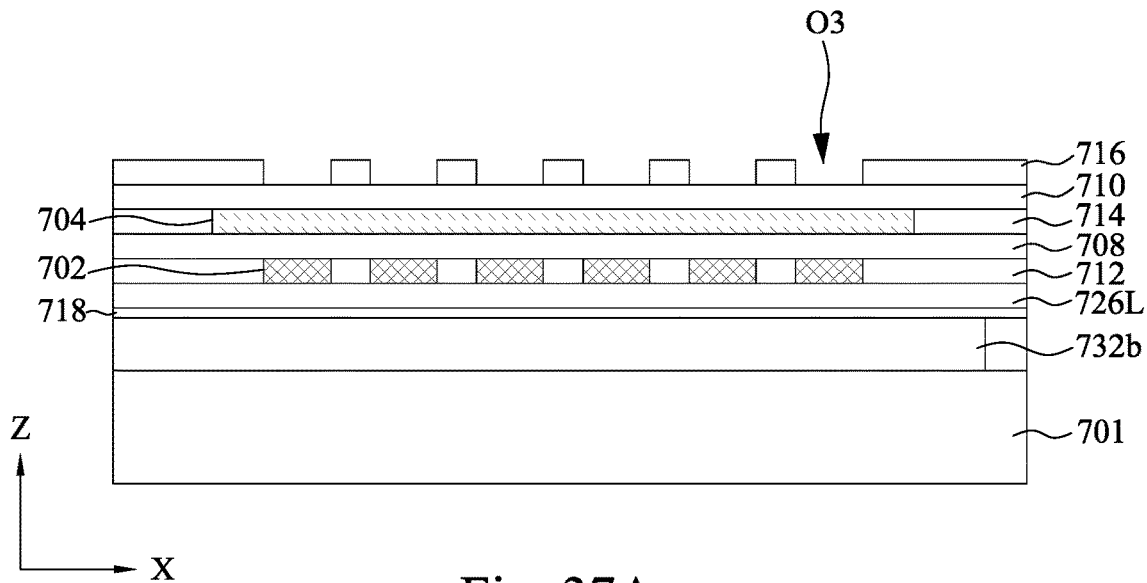
Figure 37B:
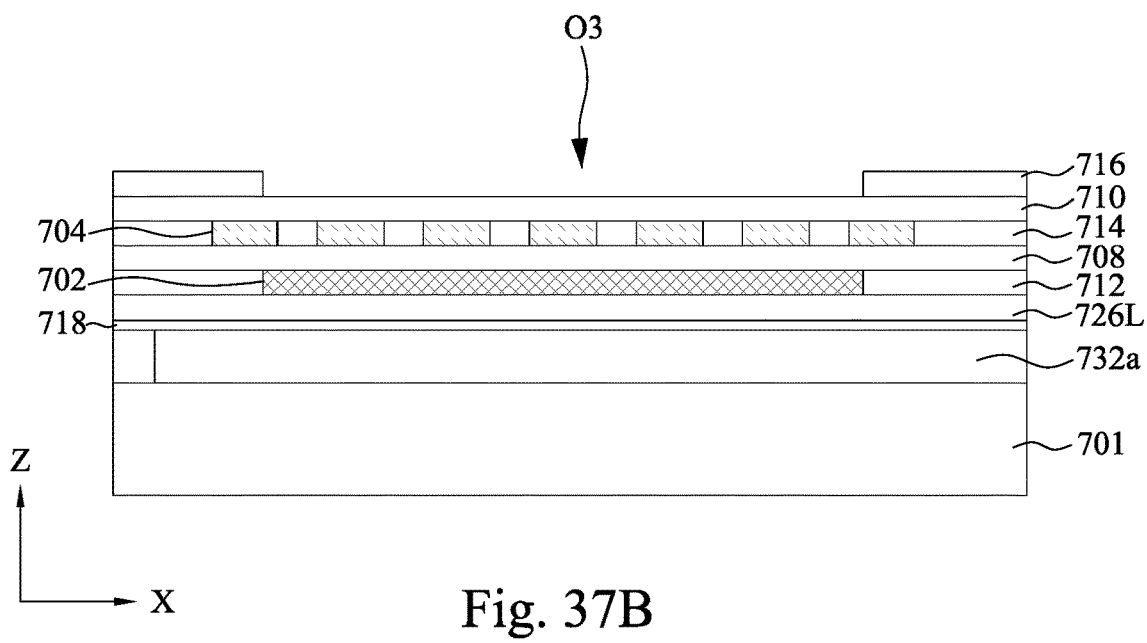

Referring back to FIG. 27B, the method M2 then proceeds to block S214 where the fourth insulating layer is etched to form a plurality of third opening that expose the underlying second capacitor dielectric layer. With reference to FIGS. 37A and 37B, in some embodiments of block S214, the insulating layer 716 is etched to form openings O3 that expose the underlying capacitor dielectric layer 710, wherein the openings O3 may allow for forming the subsequent top metal layer 706 of the MIM capacitor as shown in 39A and 39B. The openings O3 are formed by using a photolithography and a third etching process. For example, a third patterned mask (not shown) may be formed over the insulating layer 716 and used to protect the insulating layer 716 underlying thereof from the third etching process. Subsequently, the third etching process is performed on the insulating layer 716 through the third patterned mask and stops until the underlying capacitor dielectric layer 710 is reached. The third etching process may include a dry etch, a wet etch, a reactive ion etch (RIE), another suitable etching process, or combinations thereof. Accordingly, the underlying capacitor dielectric layer 710 is exposed in the openings O3. The third patterned mask subsequently stripped, such as by wet stripping or plasma ashing.

Figure 38A:
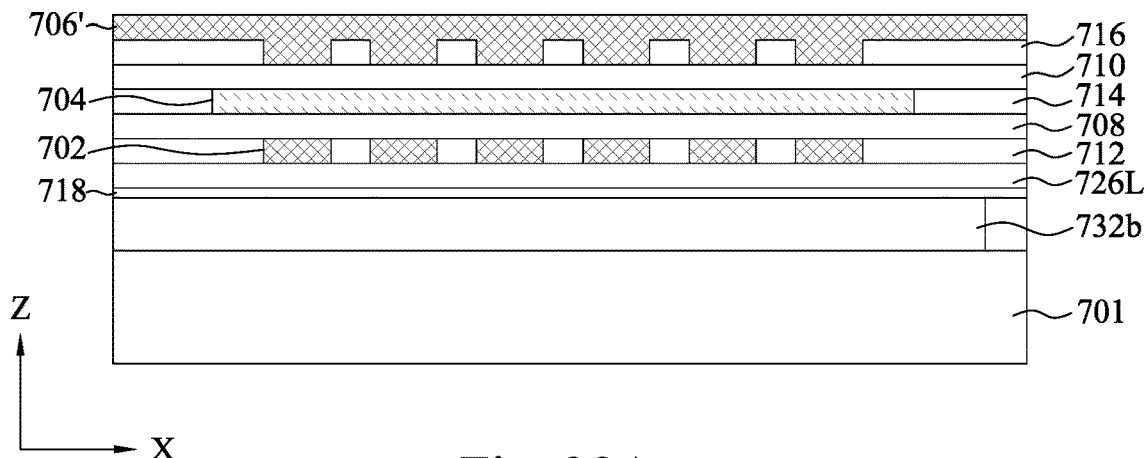
Figure 38B:
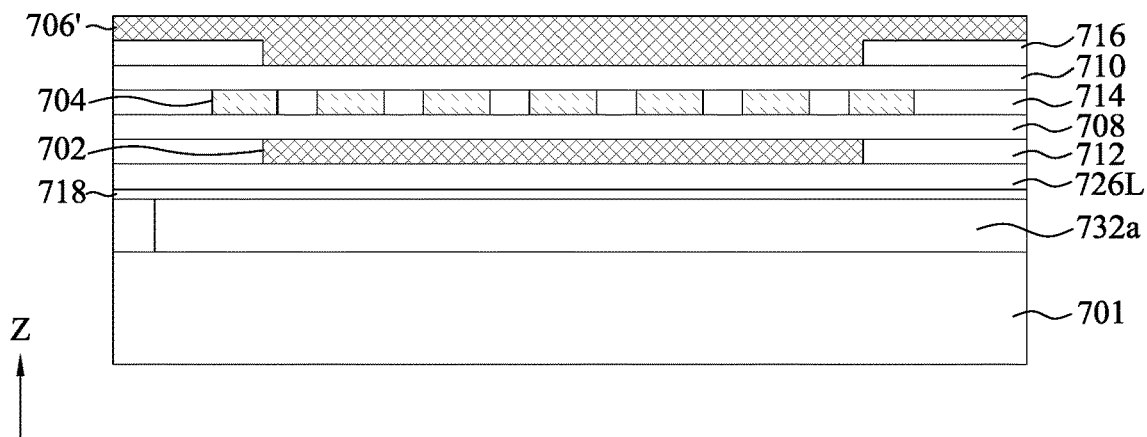

Referring back to FIG. 27B, the method M2 then proceeds to block S215 where a top metal material is deposited over the fourth insulating layer to fill the third openings in the fourth insulating layer. With reference to FIGS. 38A and 38B, in some embodiments of block S215, a top metal material 706' is deposited over the insulating layer 716 to fill the openings O3 in the insulating layer 716. In some embodiments, the material and manufacturing process related to the top metal material 706' may be substantially the same as those of the top metal layer 106 as shown in FIGS. 13A and 13B. Therefore, reference may be made to the foregoing paragraphs for the related detailed descriptions, and are not described again herein.

Figure 39A:
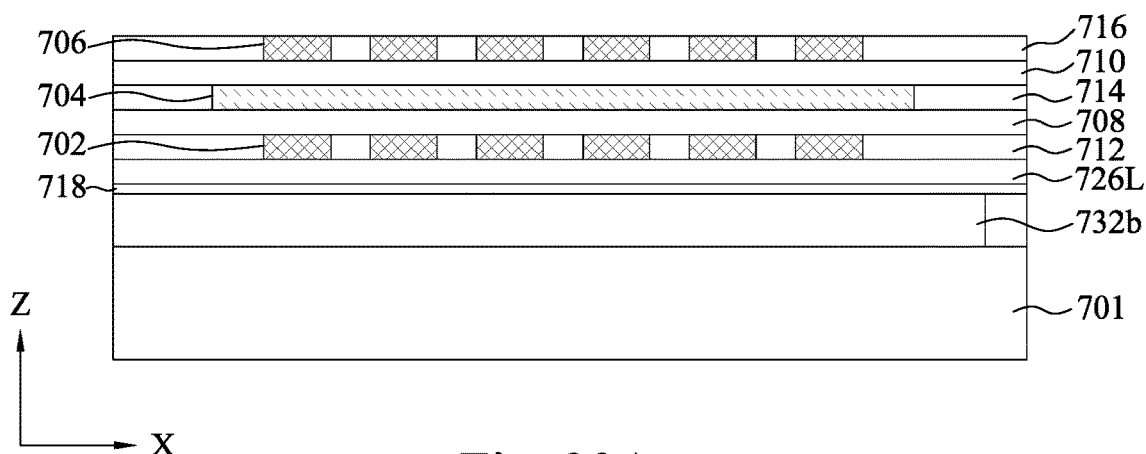
Figure 39B:
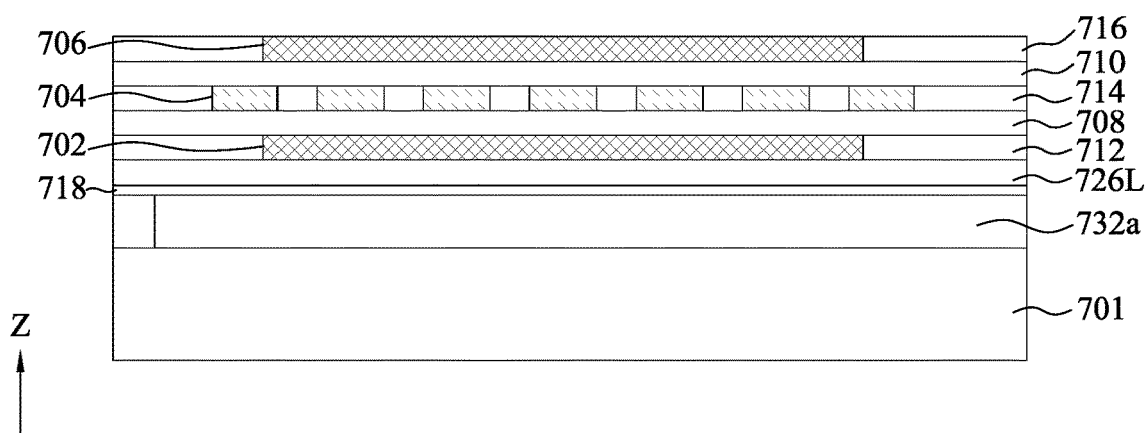

Referring back to FIG. 27B, the method M2 then proceeds to block S216 where a third planarization process is performed to remove the excess top metal material from above a top surface of the fourth insulating layer to form a top metal layer of the MIM capacitor. With reference to FIGS. 39A and 39B, in some embodiments of block S216, a chemical mechanical polish (CMP) process may be used to remove the excess top metal material 706' from above a top surface of the insulating layer 716. The remaining conductive structures fill the openings O3 (see FIGS. 37A and 37B) in the insulating layer 716 and serve as the top metal layer 706 of the MIM capacitor.

Figure 40A:
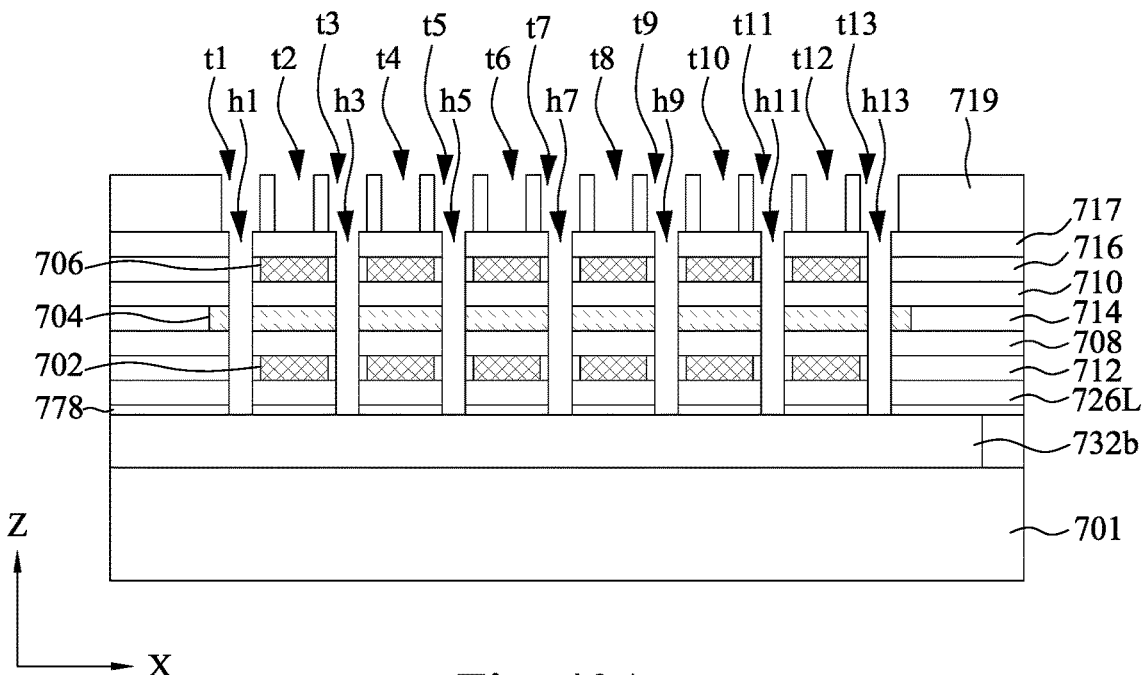
Figure 40B:
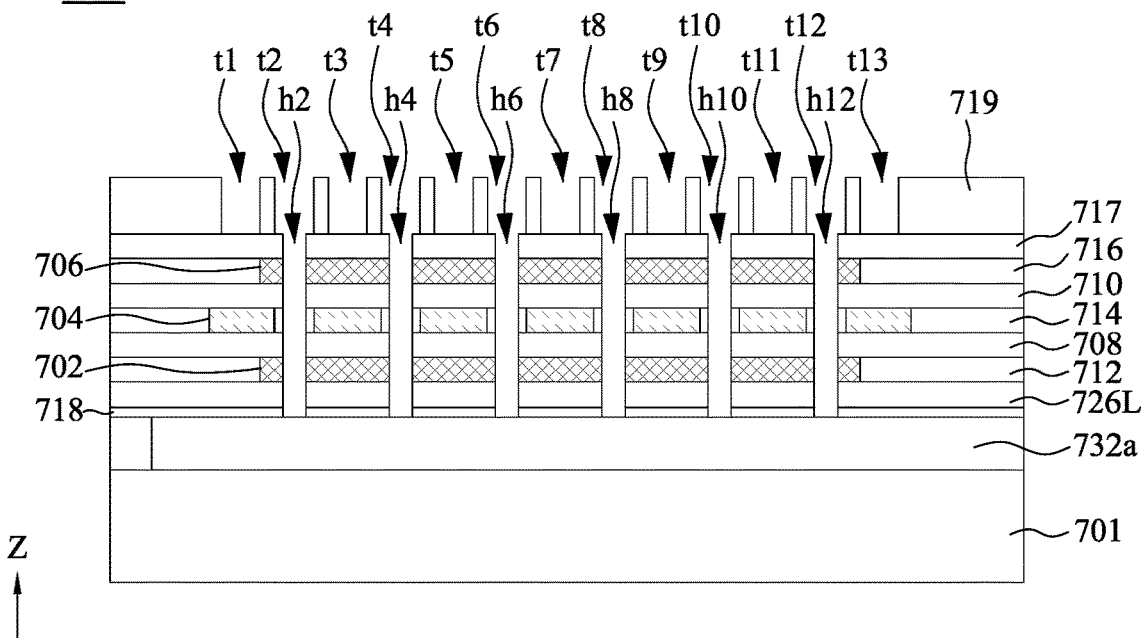

Referring back to FIG. 27B, the method M2 then proceeds to block S217 where fifth and sixth insulating layers are depositing over the top metal layer and block S218 where a plurality of dual damascene openings are formed to extend downwardly from the sixth insulating layer to expose the bottom electrode routing. With reference to FIGS. 40A and 40B, in some embodiments of blocks S217 and S218, the insulating layers 717 and 719 are deposited over the top metal layer 706, in which the insulating layer 719 may be made of a material different than the insulating layer 717. Subsequently, a plurality of dual damascene openings are formed to extend downwardly from the sixth insulating layer 719 to expose the bottom electrode routing 732. As shown in FIGS. 40A and 40B, the dual damascene openings may include line trenches t1-t13 formed in the insulating layer 719, the via holes h1, h3, h5, h7, h9, h11, and h13 (see FIG. 40A) formed to extend downwardly from bottoms of the line trenches t1, t3, t5, t7, t9, t11, and t13 to expose the electrode 732b of the bottom electrode routing 732, and the via holes h2, h4, h6, h8, h10, and h12 (see FIG. 40B) formed to extend downwardly from bottoms of the line trenches t2, t4, t6, t8, t10, and t12 to expose the electrode 732a of the bottom electrode routing 732.

In some embodiments, the dual damascene openings are formed using a dual damascene process. By way of example and not limitation, the dual damascene openings are formed by first sequentially photolitho-graphically patterning and anisotropically etching the via holes h1-h13 through the insulating layer 719, the insulating layer 717, insulating layer 716, the top metal layer 706, the capacitor dielectric layer 710, insulating layer 714, the middle metal layer 704, the capacitor dielectric layer 708, the insulating layer 712, the bottom metal layer 702, the insulating layer 726L, and etch stop layer 718 to expose the bottom electrode routing 732. This is followed by a similar process to photolithographically pattern and anisotropically etch to form line trenches t1-t13 through the insulating layer 719. These steps form line trenches t1-t13 overlying and encompassing the via holes h1-h13.

In some embodiments, the material and manufacturing process related to the insulating layer 717 or 719 may be substantially the same as that of the insulating layer 126U as shown in FIGS. 16A and 16B. Therefore, reference may be made to the foregoing paragraphs for the related detailed descriptions, and are not described again herein.

Figure 41A:
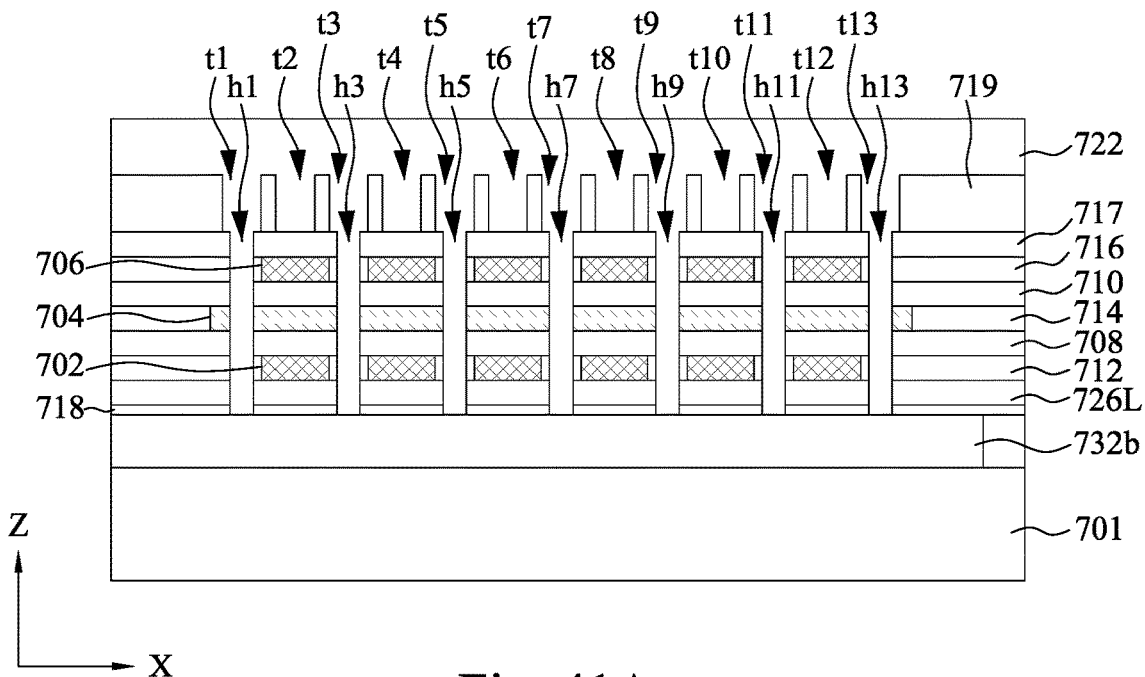
Figure 41B:
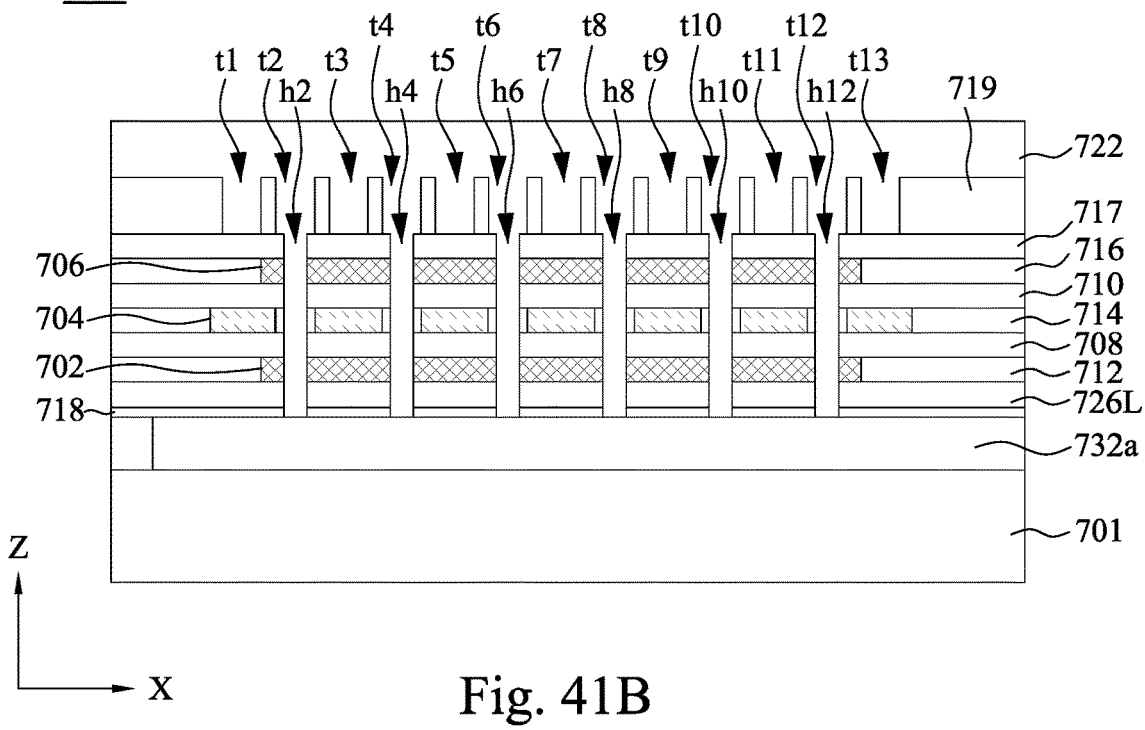

Referring back to FIG. 27B, the method M2 then proceeds to block S218 where a conductive material is deposited over the sixth insulating layer to fill the dual damascene openings. With reference to FIGS. 41A and 41B, in some embodiments of block S218, a conductive material 722 is deposited over the insulating layer 719 to fill the dual damascene openings. In some embodiments, the material and manufacturing process related to the conductive material 722 may be substantially the same as that of the conductive material 122 as shown in FIGS. 17A and 17B. Therefore, reference may be made to the foregoing paragraphs for the related detailed descriptions, and are not described again herein.

Figure 42A:
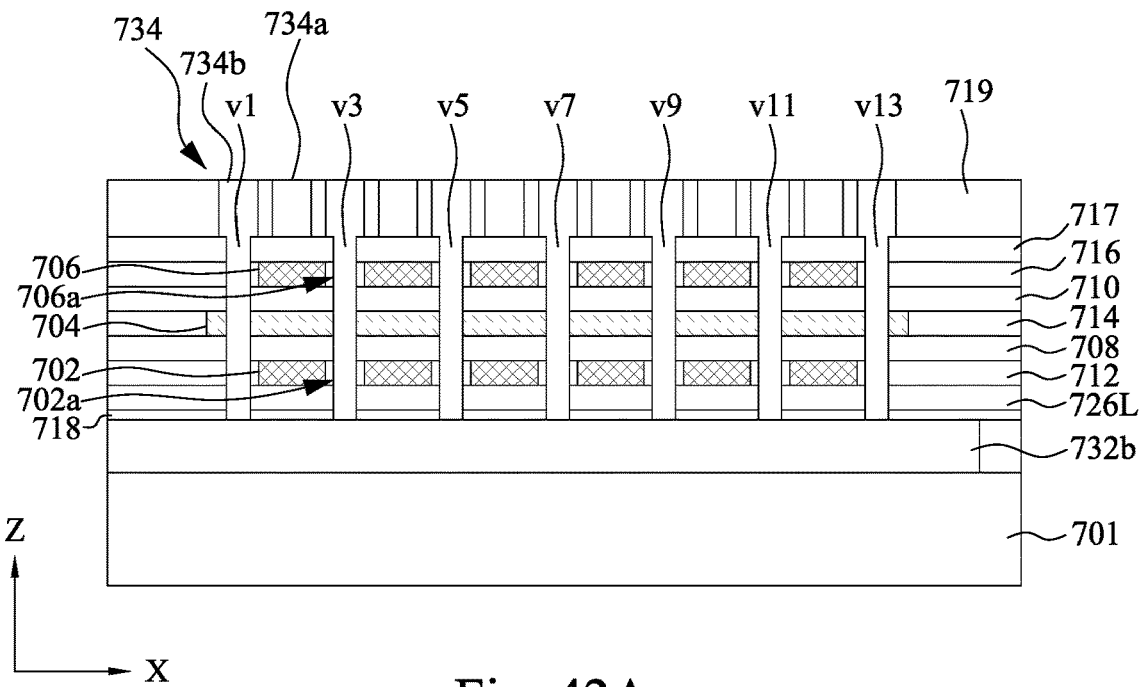
Figure 42B:
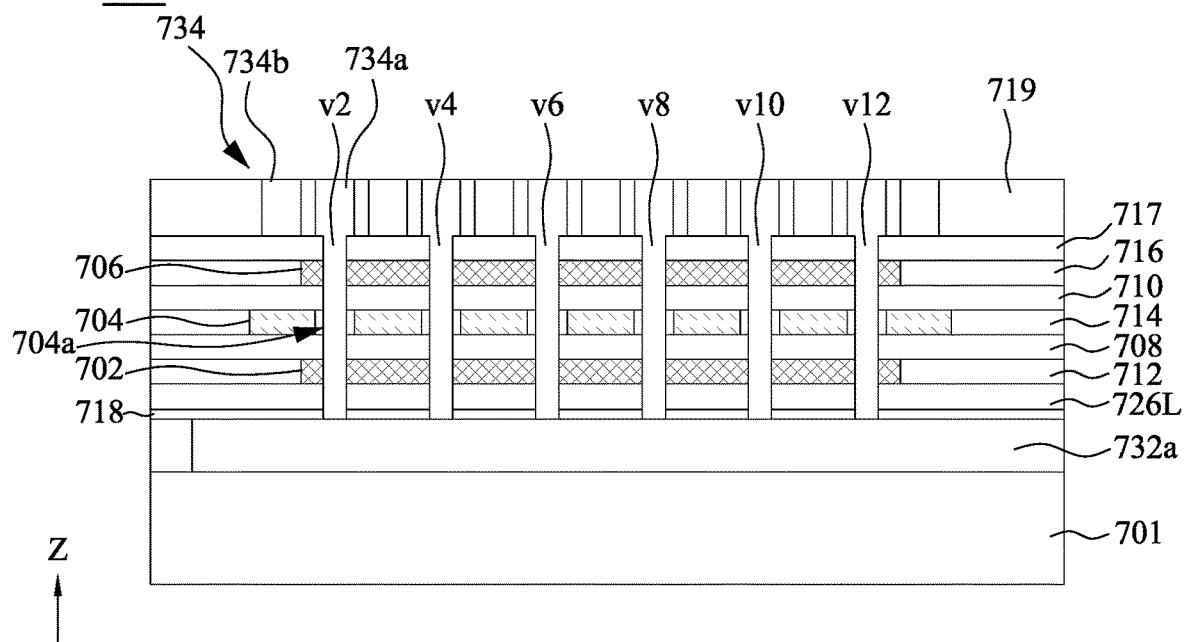

Referring back to FIG. 27B, the method M2 then proceeds to block S219 where a fourth planarization process is performed to remove the excess conductive material from above a top surface of the sixth insulating layer to form a top electrode routing in the sixth insulating layer and metal vias extending from the top electrode routing to the bottom electrode routing. With reference to FIGS. 42A and 42B, in some embodiments of block S219, a chemical mechanical polish (CMP) process may be used to remove the excess conductive material 722 from above a top surface of the insulating layer 719. As shown in FIGS. 42A and 42B, after the CMP process, the remaining conductive structures fill the dual damascene openings serve as a plurality of dual damascene structures.

This is described in greater detail with reference to FIG. 42A, the dual damascene structures include top electrode routing 734 including separated electrodes 734a and 734b and metal vias v1, v3, v5, v7, v9, v11, and v13 extend downwardly from bottoms of the electrode 734b of the top electrode routing 734 to the electrode 732b of the bottom electrode routing 732 to connect with the middle metal layer 704 of the MIM capacitor, but spaced apart from the top and bottom metal layers 706 and 702 through the through holes 706a and 702a on the top and bottom metal layers 706 and 702, which in turn allows for maintaining a first voltage potential (in operation) on the top and bottom metal layers 706 and 702 and a second voltage potential (in operation) on the middle metal layer 704. This is described in greater detail with reference to FIG. 42B, the dual damascene structures include top electrode routing 734 including separated electrodes 734a and 734b and the metal vias v2, v4, v6, v8, v10, and v12 extend downwardly from bottoms of the electrode 734a of the top electrode routing 734 to the electrode 732a of the bottom electrode routing 732 to connect the top metal layer 706 and the bottom metal layer 702 of the MIM capacitor, but spaced apart from the middle metal layer 704 through the through holes 704a on the middle metal layer 104, which in turn allows for maintaining a first voltage potential (in operation) on the top and bottom metal layers 706 and 702 and a second voltage potential (in operation) on the middle metal layer 704.

Figure 44:
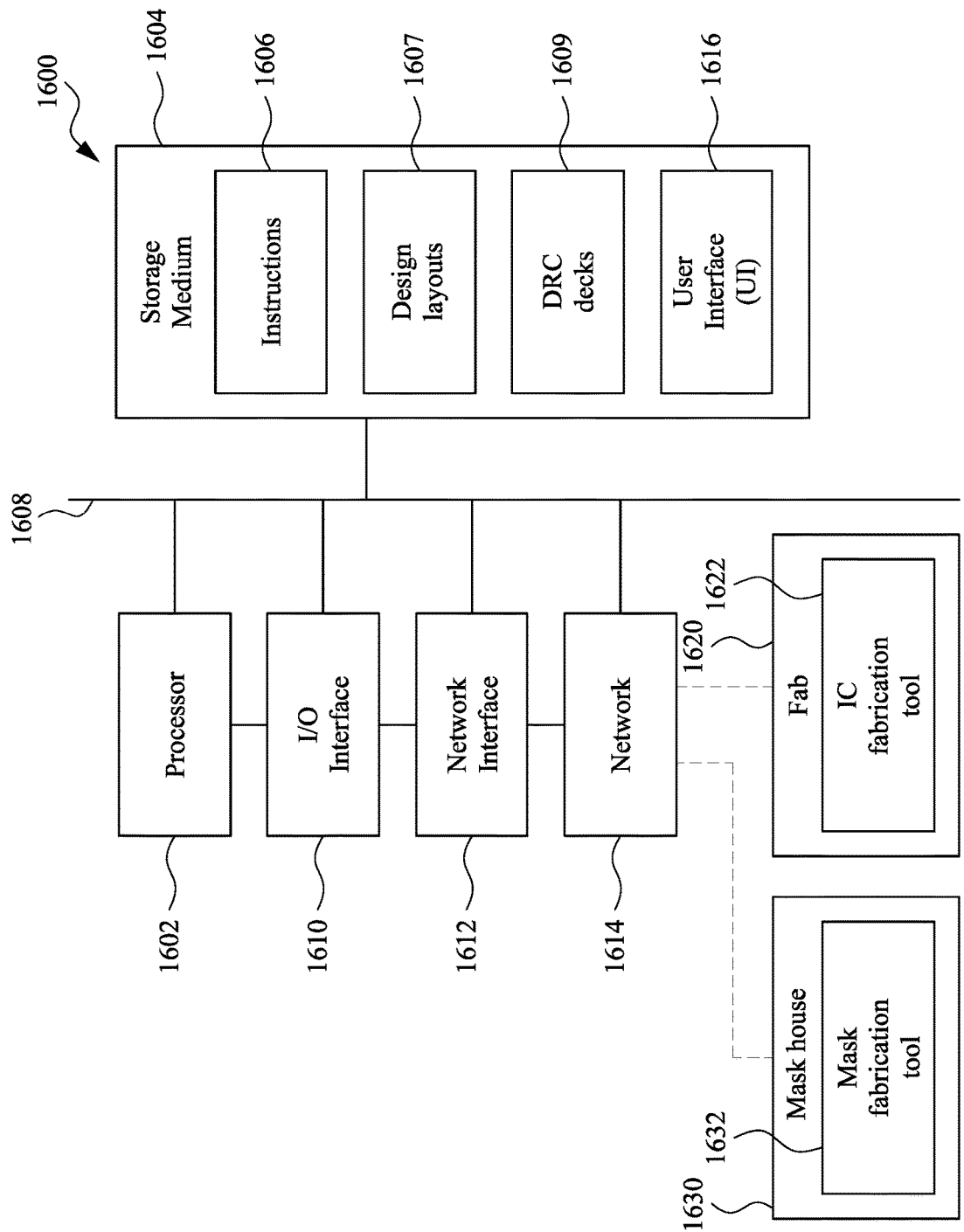
FIG. 44 illustrates a schematic diagram of an electronic design automation (EDA) system in accordance with some embodiments of the present disclosure.

FIG. 44 is a schematic diagram of an electronic design automation (EDA) system 1600, in accordance with some embodiments. Methods described herein of generating design layouts, e.g., layouts of the integrated circuits 10, 20, 30, 40, 50, 60, 70, 80, 90, 1000, 1100, 1200, 1300, 1400 and/or 1500 with capacitors as discussed above, in accordance with one or more embodiments, are implementable, for example, using EDA system 1600, in accordance with some embodiments. In some embodiments, EDA system 1600 is a general purpose computing device that is capable of executing an APR operation. The EDA system 1600 including a hardware processor 1602 and a non-transitory, computer-readable storage medium 1604. Computer-readable storage medium 1604, amongst other things, is encoded with, i.e., stores, a set of executable instructions 1606, design layouts 1607, design rule check (DRC) decks 1609 or any intermediate data for executing the set of instructions. Each design layout 1607 includes a graphical representation of an integrated chip, such as for example, a GSII file. Each DRC deck 1609 includes a list of design rules specific to a semiconductor process chosen for fabrication of a design layout 1607. Execution of instructions 1606, design layouts 1607 and DRC decks 1609 by hardware processor 1602 represents (at least in part) an EDA tool which implements a portion or all of, e.g., the methods described herein in accordance with one or more embodiments (hereinafter, the noted processes and/or methods).

Processor 1602 is electrically coupled to computer-readable storage medium 1604 via a bus 16016. Processor 1602 is also electrically coupled to an I/O interface 1610 by bus 16016. A network interface 1612 is also electrically connected to processor 1602 via bus 1608. Network interface 1612 is connected to a network 1614, so that processor 1602 and computer-readable storage medium 1604 are capable of connecting to external elements via network 1614. Processor 1602 is configured to execute instructions 1606 encoded in computer-readable storage medium 1604 in order to cause EDA system 1600 to be usable for performing a portion or all of the noted processes and/or methods. In one or more embodiments, processor 1602 is a central processing unit (CPU), a multi-processor, a distributed processing system, an application specific integrated circuit (ASIC), and/or a suitable processing unit.

In one or more embodiments, computer-readable storage medium 1604 is an electronic, magnetic, optical, electromagnetic, infrared, and/or a semiconductor system (or apparatus or device). For example, computer-readable storage medium 1604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1604 includes a compact disk-read only memory (CD-ROM), a compact disk-read/write (CD-R/W), and/or a digital video disc (DVD).

In one or more embodiments, computer-readable storage medium 1604 stores instructions 1606, design layouts 1607 (e.g., layouts of the integrated circuits 10, 20, 30, 40, 50, 60, 70, 80, 90, 1000, 1100, 1200, 1300, 1400 and/or 1500 with capacitors as discussed previously) and DRC decks 1609 configured to cause EDA system 1600 (where such execution represents (at least in part) the EDA tool) to be usable for performing a portion or all of the noted processes and/or methods. In one or more embodiments, storage medium 1604 also stores information which facilitates performing a portion or all of the noted processes and/or methods.

EDA system 1600 includes I/O interface 1610. I/O interface 1610 is coupled to external circuitry. In one or more embodiments, I/O interface 1610 includes a keyboard, keypad, mouse, trackball, trackpad, touchscreen, and/or cursor direction keys for communicating information and commands to processor 1602.

EDA system 1600 also includes network interface 1612 coupled to processor 1602. Network interface 1612 allows EDA system 1600 to communicate with network 1614, to which one or more other computer systems are connected. Network interface 1612 includes wireless network interfaces such as BLUETOOTH, WIFI, WIMAX, GPRS, or WCDMA; or wired network interfaces such as ETHERNET, USB, or IEEE-1388. In one or more embodiments, a portion or all of noted processes and/or methods, is implemented in two or more EDA systems 1600.

EDA system 1600 is configured to receive information through I/O interface 1610. The information received through I/O interface 1610 includes one or more of instructions, data, design rules, libraries of standard cells, and/or other parameters for processing by processor 1602. The information is transferred to processor 1602 via bus 1608. EDA system 1600 is configured to receive information related to a user interface (UI) 1616 through I/O interface 1610. The information is stored in computer-readable medium 1604 as UI 1616.

Also illustrated in FIG. 44 are fabrication tools associated with the EDA system 1600. For example, a mask house 1630 receives a design layout from the EDA system 1600 by, for example, the network 1614, and the mask house 1630 has a mask fabrication tool 1632 (e.g., a mask writer) for fabricating one or more photomasks (e.g., photomasks used for fabricating e.g., layouts of the integrated circuits 10, 20, 30, 40, 50, 60, 70, 80, 90, 1000, 1100, 1200, 1300, 1400 and/or 1500 with capacitors as discussed above) based on the design layout generated from the EDA system 1600. An IC fabricator ("Fab") 1620 may be connected to the mask house 1630 and the EDA system 1600 by, for example, the network 1614. Fab 1620 includes an IC fabrication tool 1622 for fabricating IC chips (e.g., layouts of the integrated circuits 10, 20, 30, 40, 50, 60, 70, 80, 90, 1000, 1100, 1200, 1300, 1400 and/or 1500 with capacitors as discussed above) using the photomasks fabricated by the mask house 1630. By way of example and not limitation, the IC fabrication tool 1622 includes one or more cluster tools for fabricating IC chips. The cluster tool may be a multiple reaction chamber type composite equipment which includes a polyhedral transfer chamber with a wafer handling robot inserted at the center thereof, a plurality of process chambers (e.g., CVD chamber, PVD chamber, etching chamber, annealing chamber or the like) positioned at each wall face of the polyhedral transfer chamber; and a loadlock chamber installed at a different wall face of the transfer chamber.

Figure 45:
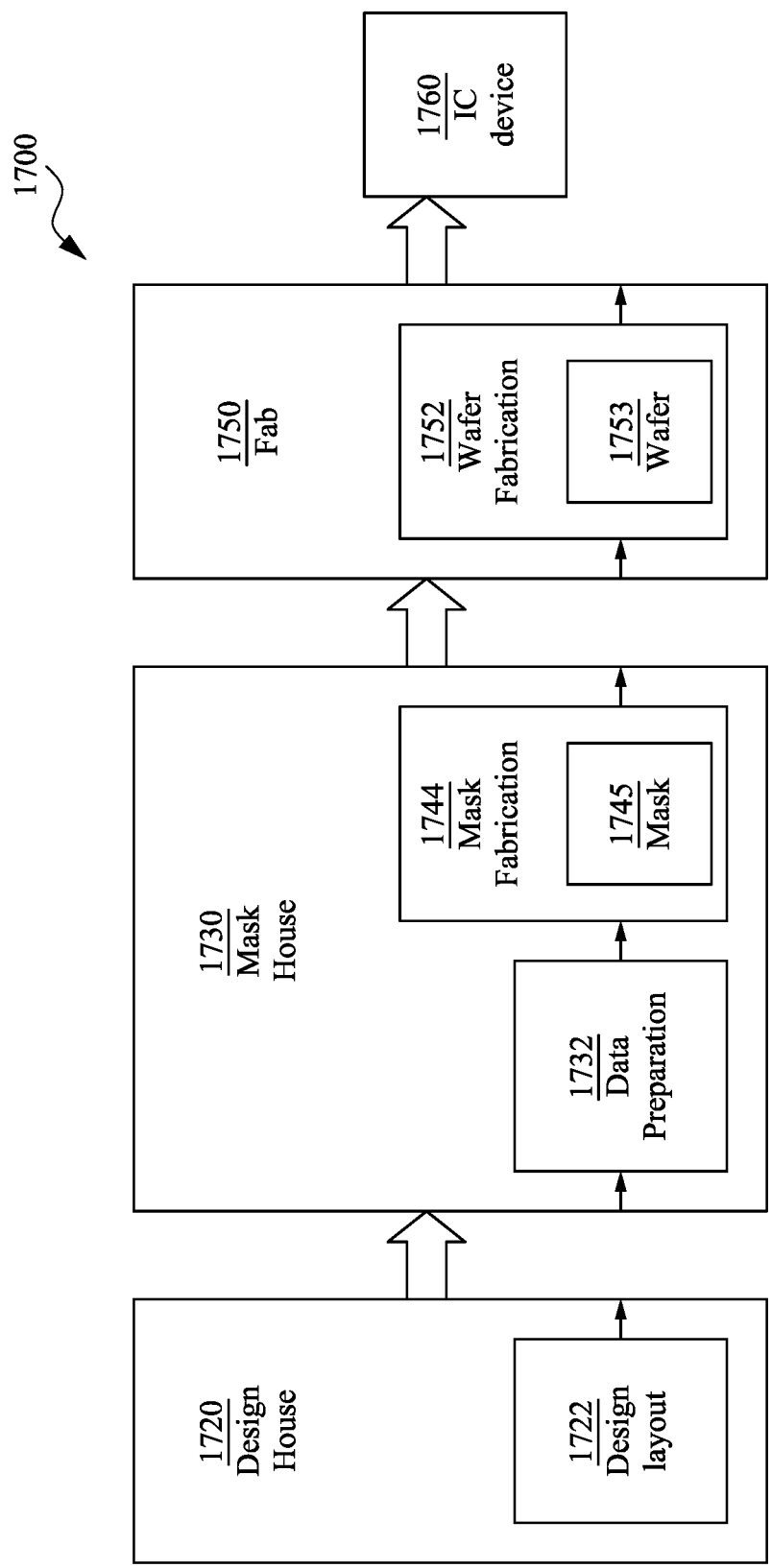
FIG. 45 illustrates a block diagram of an IC manufacturing system and an IC manufacturing flow associated therewith, in accordance with some embodiments of the present disclosure.

FIG. 45 is a block diagram of an IC manufacturing system 1700, and an IC manufacturing flow associated therewith, in accordance with some embodiments. In some embodiments, based on one or more design layouts, e.g., layouts of the integrated circuits 10, 20, 30, 40, 50, 60, 70, 80, 90, 1000, 1100, 1200, 1300, 1400 and/or 1500 with capacitors as discussed above, one or more photomasks and one or more integrated circuits are fabricated using manufacturing system 1700.

In FIG. 45, an IC manufacturing system 1700 includes entities, such as a design house 1720, a mask house 1730, and a Fab 1750, that interact with one another in the design, development, and manufacturing cycles and/or services related to manufacturing ICs 1760. The entities in IC manufacturing system 1700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1720, mask house 1730, and Fab 1750 is owned by a single larger company. In some embodiments, two or more of design house 1720, mask house 1730, and Fab 1750 coexist in a common facility and use common resources.

Design house (or design team) 1720 generates design layouts 1722 (e.g., layouts of the integrated circuits 10, 20, 30, 40, 50, 60, 70, 80, 90, 1000, 1100, 1200, 1300, 1400 and/or 1500 with capacitors as discussed above). Design layouts 1722 include various geometrical patterns designed for ICs 1760 (e.g., integrated circuits 10, 20, 30, 40, 50, 60, 70, 80, 90, 1000, 1100, 1200, 1300, 1400 and/or 1500 with capacitors as discussed above). The geometrical patterns correspond to patterns of metal, oxide, or semiconductor layers that make up the various components of ICs 1760 to be fabricated. The various layers combine to form various device features. For example, a portion of design layout 1722 includes various circuit features, such as active regions, passive regions, functional gate structures, dummy gate structures, gate contacts, dummy gate contacts, source/drain contacts, and/or metal lines, to be formed on a semiconductor wafer. Design house 1720 implements a proper design procedure to form design layout 1722. The design procedure includes one or more of logic design, physical design or place and routing. Design layout 1722 is presented in one or more data files having information of the geometrical patterns and a netlist of various nets. For example, design layout 1722 can be expressed in a GDSII file format or DFII file format.

Mask house 1730 includes data preparation 1732 and mask fabrication 1744. Mask house 1730 uses design layout 1722 (e.g., layout of the integrated circuit 10, 20, 30, 40, 50, 60, 70, 80, 90, 1000, 1100, 1200, 1300, 1400 or 1500 as discussed above) to manufacture one or more photomasks 1745 to be used for fabricating the various layers of IC 1760 according to design layout 1722. Mask house 1730 performs mask data preparation 1732, where design layout 1722 is translated into a representative data file ("RDF"). Mask data preparation 1732 provides the RDF to mask fabrication 1744. Mask fabrication 1744 includes a mask writer. A mask writer converts the RDF to an image on a substrate, such as a photomask (reticle) 1745. Design layout 1722 is manipulated by mask data preparation 1732 to comply with particular characteristics of the mask writer and/or rules of fab 1750. In FIG. 45, mask data preparation 1732 and mask fabrication 1744 are illustrated as separate elements. In some embodiments, mask data preparation 1732 and mask fabrication 1744 can be collectively referred to as mask data preparation.

In some embodiments, mask data preparation 1732 includes optical proximity correction (OPC) which uses lithography enhancement techniques to compensate for image errors, such as those that can arise from diffraction, interference, other process effects and the like. OPC adjusts design layout 1722. In some embodiments, mask data preparation 1732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1732 includes a mask rule checker (MRC) that checks design layout 1722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies design layout diagram 1722 to compensate for limitations during mask fabrication 1744, which may undo part of the modifications performed by OPC in order to meet mask creation rules.

In some embodiments, mask data preparation 1732 includes lithography process checking (LPC) that simulates processing that will be implemented by Fab 1750 to fabricate ICs 1760. LPC simulates this processing based on design layout 1722 to create a simulated manufactured integrated circuit, such as IC 1760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine design layout 1722.

After mask data preparation 1732 and during mask fabrication 1744, a photomask 1745 or a group of photomasks 1745 are fabricated based on the design layout 1722. In some embodiments, mask fabrication 1744 includes performing one or more lithographic exposures based on the design layout 1722. In some embodiments, an electron-beam (e-beam) or a mechanism of multiple e-beams is used to form a pattern on a photomask 1745 based on design layout 1722. Photomask 1745 can be formed in various technologies. In some embodiments, photomask 1745 is formed using binary technology. In some embodiments, a mask pattern includes opaque regions and transparent regions. A radiation beam, such as an ultraviolet (UV) beam, used to expose the radiation sensitive material layer (e.g., photoresist) which has been coated on a wafer, is blocked by the opaque regions and transmits through the transparent regions. In one example, a binary mask version of photomask 1745 includes a transparent substrate (e.g., fused quartz) and an opaque material (e.g., chromium) coated in the opaque regions of the binary mask. In another example, photomask 1745 is formed using a phase shift technology. In a phase shift mask (PSM) version of photomask 1745, various features in the pattern formed on the phase shift photomask are configured to have proper phase difference to enhance the resolution and imaging quality. In various examples, the phase shift photomask can be attenuated PSM or alternating PSM. The photomask(s) generated by mask fabrication 1744 is used in a variety of processes. For example, such a mask(s) is used in an ion implantation process to form various doped regions in semiconductor wafer 1753, in an etching process to form various etching regions in semiconductor wafer 1753, and/or in other suitable processes.

Fab 1750 includes wafer fabrication 1752. Fab 1750 is an IC fabrication business that includes one or more manufacturing facilities for the fabrication of a variety of different IC products. In some embodiments, Fab 1750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (BEOL fabrication), and a third manufacturing facility may provide other services for the foundry business.

Fab 1750 uses photomask(s) 1745 fabricated by mask house 1730 to fabricate ICs 1760. Thus, fab 1750 at least indirectly uses design layout(s) 1722 (e.g., layouts of the integrated circuits 10, 20, 30, 40, 50, 60, 70, 80, 90, 1000, 1100, 1200, 1300, 1400 and/or 1500 with capacitors as discussed above) to fabricate ICs 1760. In some embodiments, wafer 1753 is processed by fab 1750 using photomask(s) 1745 to form ICs 1760. In some embodiments, the device fabrication includes performing one or more photolithographic exposures based at least indirectly on design layout 1722.

Based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides improved MIM capacitor layout patterns to optimize the edge layout thereof to improve frequency response of MIM capacitor. The MIM capacitor includes metal electrode plates each having a plurality of notches on opposite edges thereof to form square wave-shaped edges. In addition, each of the metal electrode plates further has opposite straight edges extending between the square wave-shaped edges thereof, and the straight edge of the top/bottom metal electrode plate is laterally set back from the straight edge of the middle metal electrode plate. An advantage is that a distance between the outermost metal via and the edge of the metal electrode plate is decreased to scale down a portion of the metal electrode plate that extends beyond the outermost metal via, such that the resistance of the metal electrode plate can be reduced, which in turn allows for improving −3 db frequency response of the MIM capacitor.

In some embodiments, an integrated circuit (IC) structure includes a semiconductor substrate, a bottom electrode routing, a capacitor structure, a top electrode routing, a first metal via, and a second metal via. The bottom electrode routing is over the semiconductor substrate. The capacitor structure is over the bottom electrode routing. The capacitor structure includes a bottom metal layer, a middle metal layer above the bottom metal layer, and a top metal layer above the middle metal layer. When viewed in a plan view, the top metal layer has opposite straight edges extending along a first direction and opposite square wave-shaped edges connecting the opposite straight edges, the square wave-shaped edges each comprise alternating first and second segments extending along a second direction perpendicular to the first direction, and third segments each connecting adjacent two of the first and second segments, wherein the third segments extend along the first direction. The top electrode routing is over the capacitor structure. The first metal via extends from the bottom electrode routing to the top electrode routing. The first metal via contacts the top and bottom metal layers and is spaced apart from the middle metal layer. The second metal via extends from the bottom electrode routing to the top electrode routing. The second metal via contacts the middle metal layer and is spaced apart from the bottom and top metal layers. In some embodiments, a distance between the first metal via and the first one of the straight edges of the top metal layer is in a range from about 0.1 to 1 times a maximum dimension of the first metal via in the plan view. In some embodiments, the middle metal layer has opposite straight edges, a first one of the straight edges of the top metal layer is laterally set beck from a first one of the straight edges of the middle metal layer, and a second one of the straight edges of the top metal layer is laterally set back from a second one of the straight edges of the middle metal layer. In some embodiments, the middle metal layer has opposite straight edges, a first distance between the straight edges of the middle metal layer is greater than a second distance between the straight edges of the top metal layer. In some embodiments, the bottom metal layer of the capacitor structure has opposite straight edges and opposite square wave-shaped edges extending between the straight edges of the bottom metal layer. In some embodiments, the middle metal layer of the capacitor structure has opposite straight edges and opposite square wave-shaped edges extending between the opposite straight edges of the middle metal layer. In some embodiments, the square wave-shaped edges of the middle metal layer overlap with the square wave-shaped edges of the top metal layer. In some embodiments, the first metal via has a square top-view pattern, a rectangular top-view pattern, a circle top-view pattern, or an elliptical top-view pattern. In some embodiments, the IC structure further includes a first metal layer above the top metal layer, the first metal layer being electrically connected to the middle metal layer, and electrically isolated from the bottom and top metal layers. In some embodiments, the IC structure further includes a second metal layer above the first metal layer, the second metal layer being electrically connected to the bottom and top metal layers, and electrically isolated from the middle and first metal layers.

In some embodiments, an integrated circuit (IC) structure includes a semiconductor substrate, a first electrode routing, a second electrode routing, and a capacitor structure. The first electrode routing is over the semiconductor substrate. The second electrode routing is over the first electrode routing. The capacitor structure is connected between the first and second electrode routings. The capacitor structure includes a first metal plate serving to receive a first voltage potential and having opposite linear edges extending along a first direction and a second metal plate over the first metal plate and serving to receive a second voltage potential different than the first voltage potential. The second metal plate has opposite linear edges extending along the first direction. A first distance between the opposite linear edges of the first metal plate is different than a second distance between the opposite linear edges of the second metal plate. In some embodiments, the first distance between the linear edges of the first metal plate is greater than the second distance between the linear edges of the second metal plate. In some embodiments, the first distance between the linear edges of the first metal plate is less than the second distance between the linear edges of the second metal plate. In some embodiments, the capacitor structure further comprises a third metal plate over the second metal plate, and the third metal plate serves to receive the first voltage potential. In some embodiments, the first metal plate has a non-linear edge connecting the linear edges of the first metal plate, the non-linear edge has a plurality of notches arranged along a second direction perpendicular to the first direction. In some embodiments, the second metal plate has a non-linear edge connecting the linear edges of the second metal plate, the non-linear edge has a plurality of notches arranged along a second direction perpendicular to the first direction.

In some embodiments, a method includes depositing a first electrode material over a first electrode routing on a semiconductor substrate; patterning the first electrode material to form a lower metal plate having a first through hole therein; filling a first dielectric material into the first through hole of the lower metal plate; after filling the first dielectric material, depositing a second dielectric material over the lower metal plate; depositing a second electrode material over the second dielectric material; patterning the second electrode material to form a middle metal plate having a second through hole therein and having opposite straight edges, wherein the middle metal plate has a larger width than the lower metal plate, and the second through hole non-overlaps the first through hole; filling a third dielectric material into the second through hole of the middle metal plate; performing an etching process to form a first via hole extending through the lower metal plate and a second via hole extending through the middle metal plate and having a distance to a first one of the straight edges of the middle metal plate in a range from about 0.1 to 1 times a maximum dimension of the second via hole in a plan view, wherein the middle metal plate is spaced from the first via hole by the third dielectric material, and the lower metal plate is spaced from the second via hole by the first dielectric material; filling a conductive material into the first and second via holes. In some embodiments, patterning the first electrode material is performed such that the lower metal plate has a square wave-shaped edge from a plan view. In some embodiments, patterning the second electrode material is performed such that the middle metal plate has a square wave-shaped edge extending between the opposite straight edges from the plan view. In some embodiments, the method further includes depositing a fourth dielectric material over the middle metal plate; forming an upper metal plate over the fourth dielectric material, wherein the upper metal plate has a smaller width than the middle metal plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing a first electrode material over a first electrode routing on a semiconductor substrate;
patterning the first electrode material to form a lower metal plate having a first through hole therein;
filling a first dielectric material into the first through hole of the lower metal plate;
after filling the first dielectric material, depositing a second dielectric material over the lower metal plate;
depositing a second electrode material over the second dielectric material;
patterning the second electrode material to form a middle metal plate having a second through hole therein and having opposite straight edges, wherein the middle metal plate has a larger width than the lower metal plate, and the second through hole non-overlaps the first through hole;
filling a third dielectric material into the second through hole of the middle metal plate;
performing an etching process to form a first via hole extending through the lower metal plate and a second via hole extending through the middle metal plate and having a distance to a first one of the straight edges of the middle metal plate in a range from about 0.1 to 1 times a maximum dimension of the second via hole in a plan view, wherein the middle metal plate is spaced from the first via hole by the third dielectric material, and the lower metal plate is spaced from the second via hole by the first dielectric material; and
filling a conductive material into the first and second via holes.

2. The method of claim 1, wherein patterning the first electrode material is performed such that the lower metal plate has a square wave-shaped edge from the plan view.

3. The method of claim 1, wherein patterning the second electrode material is performed such that the middle metal plate has a square wave-shaped edge extending between the opposite straight edges from the plan view.

4. The method of claim 1, further comprising:
depositing a fourth dielectric material over the middle metal plate; and
forming an upper metal plate over the fourth dielectric material, wherein the upper metal plate has a smaller width than the middle metal plate.

5. A method, comprising:

forming a bottom electrode routing over a semiconductor substrate;

forming a capacitor structure over the bottom electrode routing, the capacitor structure comprising a bottom metal layer, a middle metal layer above the bottom metal layer, and a top metal layer above the middle metal layer, wherein when viewed in a plan view, the top metal layer has opposite straight edges extending along a first direction and opposite square wave-shaped edges connecting the opposite straight edges, the square wave-shaped edges each comprise alternating first and second segments extending along a second direction perpendicular to the first direction, and third segments each connecting adjacent two of the first and second segments, wherein the third segments extend along the first direction;

forming a top electrode routing over the capacitor structure;

forming a first metal via extending from the bottom electrode routing to the top electrode routing, the first metal via contacting the top and bottom metal layers and spaced apart from the middle metal layer; and forming a second metal via extending from the bottom electrode routing to the top electrode routing, the second metal via contacting the middle metal layer and spaced apart from the bottom and top metal layers.

6. The method of claim 5, wherein a distance between the first metal via and a first one of the straight edges of the top metal layer is in a range from about 0.1 to 1 times a maximum dimension of the first metal via in the plan view.

7. The method of claim 5, wherein the middle metal layer has opposite straight edges, a first one of the straight edges of the top metal layer is laterally set beck from a first one of the straight edges of the middle metal layer, and a second one of the straight edges of the top metal layer is laterally set back from a second one of the straight edges of the middle metal layer.

8. The method of claim 5, wherein the middle metal layer has opposite straight edges, a first distance between the straight edges of the middle metal layer is greater than a second distance between the straight edges of the top metal layer.

9. The method of claim 5, wherein the bottom metal layer of the capacitor structure has opposite straight edges and opposite square wave-shaped edges extending between the straight edges of the bottom metal layer.

10. The method of claim 5, wherein the middle metal layer of the capacitor structure has opposite straight edges and opposite square wave-shaped edges extending between the opposite straight edges of the middle metal layer.

11. The method of claim 10, wherein the square wave-shaped edges of the middle metal layer overlap with the square wave-shaped edges of the top metal layer.

12. The method of claim 5, wherein the first metal via has a square top-view pattern, a rectangular top-view pattern, a circle top-view pattern, or an elliptical top-view pattern.

13. The method of claim 5, further comprising:

forming a first metal layer above the top metal layer, the first metal layer being electrically connected to the middle metal layer, and electrically isolated from the bottom and top metal layers.

14. The method of claim 13, further comprising:

forming a second metal layer above the first metal layer, the second metal layer being electrically connected to the bottom and top metal layers, and electrically isolated from the middle and first metal layers.

15. A method, comprising:

forming a first electrode routing over a semiconductor substrate;

forming a capacitor structure over the first electrode routing, the capacitor structure comprising a first metal plate serving to receive a first voltage potential and having opposite linear edges extending along a first direction, and a second metal plate over the first metal plate, the second metal plate serving to receive a second voltage potential different than the first voltage potential, the second metal plate having opposite linear edges extending along the first direction, wherein a first distance between the opposite linear edges of the first metal plate is different than a second distance between the opposite linear edges of the second metal plate, the first metal plate has a non-linear edge connecting the linear edges of the first metal plate, and the non-linear edge of the first metal plate has a plurality of notches arranged along a second direction perpendicular to the first direction; and forming a second electrode routing over the capacitor structure, wherein the capacitor structure is connected between the first and second electrode routings.

16. The method of claim 15, wherein the first distance between the linear edges of the first metal plate is greater than the second distance between the linear edges of the second metal plate.

17. The method of claim 15, wherein the first distance between the linear edges of the first metal plate is less than the second distance between the linear edges of the second metal plate.

18. The method of claim 15, wherein the capacitor structure further comprises a third metal plate over the second metal plate, and the third metal plate serves to receive the first voltage potential.

19. The method of claim 18, wherein the third metal plate has opposite linear edges extending along the first direction and has a non-linear edge connecting the linear edges of the third metal plate, the non-linear edge of the third metal plate has a plurality of notches arranged along the second direction perpendicular to the first direction.

20. The method of claim 15, wherein the second metal plate has a non-linear edge connecting the linear edges of the second metal plate, and the non-linear edge of the second metal plate has a plurality of notches arranged along the second direction perpendicular to the first direction.

\* \* \* \* \*